United States Patent
Hidaka

(10) Patent No.: US 7,436,717 B2
(45) Date of Patent: Oct. 14, 2008

(54) SEMICONDUCTOR DEVICE HAVING MECHANISM CAPABLE OF HIGH-SPEED OPERATION

(75) Inventor: Hideto Hidaka, Hyogo (JP)

(73) Assignee: Renesas Technology Corp., Tokyo (JP)

(*) Notice: Subject to any disclaimer, the term of this patent is extended or adjusted under 35 U.S.C. 154(b) by 346 days.

(21) Appl. No.: 10/898,969

(22) Filed: Jul. 27, 2004

(65) Prior Publication Data
US 2005/0007862 A1 Jan. 13, 2005

Related U.S. Application Data

(60) Continuation of application No. 10/424,104, filed on Apr. 28, 2003, now Pat. No. 6,831,867, which is a division of application No. 09/775,790, filed on Feb. 5, 2001, now Pat. No. 6,563,478.

(30) Foreign Application Priority Data

| Feb. 14, 2000 | (JP) | ............................... 2000-035330 |
| Jun. 15, 2000 | (JP) | ............................... 2000-179714 |

(51) Int. Cl.
*G11C 7/00* (2006.01)
(52) U.S. Cl. ......................................... 365/198; 326/30
(58) Field of Classification Search .................. 365/198; 326/30, 84
See application file for complete search history.

(56) References Cited

U.S. PATENT DOCUMENTS

| 4,833,445 A | * | 5/1989 | Buchele | ........................ 341/118 |
| 4,947,113 A | * | 8/1990 | Chism et al. | .................. 324/754 |
| 5,107,230 A | * | 4/1992 | King | ............................. 326/86 |
| 5,268,863 A | | 12/1993 | Bader et al. | ............. 365/189.01 |
| 5,446,410 A | * | 8/1995 | Nakakura | ..................... 327/565 |
| 5,530,386 A | * | 6/1996 | Kuo et al. | ..................... 327/109 |
| 5,534,812 A | * | 7/1996 | Cao et al. | ..................... 327/333 |
| 5,731,711 A | * | 3/1998 | Gabara | ......................... 326/30 |
| 5,757,696 A | | 5/1998 | Matsuo et al. | .......... 365/185.07 |
| 5,784,315 A | * | 7/1998 | Itoh | ....................... 365/185.22 |
| 5,872,471 A | * | 2/1999 | Ishibashi et al. | ............... 327/98 |
| 5,903,167 A | * | 5/1999 | Sanwo et al. | ................... 326/86 |
| 5,973,983 A | | 10/1999 | Hidaka | ................... 365/230.03 |
| 5,973,984 A | * | 10/1999 | Nagaoka | ................ 365/230.03 |

(Continued)

FOREIGN PATENT DOCUMENTS

JP 60-121593 A 6/1985

OTHER PUBLICATIONS

"Ultra LSI Memory," by Kiyoo Ito, Baifukan, 1994, pp. 161-163 (with partial English translation).

(Continued)

*Primary Examiner*—Michael T Tran
(74) *Attorney, Agent, or Firm*—McDermott Will & Emery LLP

(57) ABSTRACT

A semiconductor device comprises a memory cell block and a sense amplifier zone. A selection gate included in the sense amplifier zone is turned on for selectively coupling the memory cell block with the sense amplifier zone. Local drivers are dispersively arranged on a BLI wire transmitting a gate control signal, and a driver is arranged on an end of the BLI wire. The driver pulls down the potential of the BLI wire at a high speed.

3 Claims, 60 Drawing Sheets

U.S. PATENT DOCUMENTS

| | | | |
|---|---|---|---|
| 6,055,276 A * | 4/2000 | Yamauchi | 375/257 |
| 6,078,978 A * | 6/2000 | Suh | 710/305 |
| 6,114,898 A * | 9/2000 | Okayasu | 327/437 |
| 6,130,563 A * | 10/2000 | Pilling et al. | 327/111 |
| 6,144,610 A | 11/2000 | Zheng et al. | 365/230.06 |
| 6,166,993 A | 12/2000 | Yamauchi | 365/233.5 |
| 6,184,737 B1 * | 2/2001 | Taguchi | 327/319 |
| 6,208,161 B1 * | 3/2001 | Suda | 326/30 |
| 6,212,110 B1 | 4/2001 | Sakamoto et al. | 365/190 |
| 6,337,884 B1 * | 1/2002 | Cao et al. | 375/257 |
| 6,351,172 B1 * | 2/2002 | Ouyang et al. | 327/333 |
| 6,373,275 B1 * | 4/2002 | Otsuka et al. | 326/30 |
| 6,400,176 B1 * | 6/2002 | Griffin et al. | 326/30 |
| 6,490,294 B1 * | 12/2002 | Manzado et al. | 370/465 |
| 6,625,206 B1 * | 9/2003 | Doblar | 375/219 |
| 6,670,830 B2 * | 12/2003 | Otsuka et al. | 326/86 |
| 6,744,578 B1 * | 6/2004 | Bishop | 360/31 |
| 6,766,404 B1 * | 7/2004 | Osaka et al. | 710/306 |

OTHER PUBLICATIONS

"Semicondutor Memories", Betty Prince, 1983, Wiley, $2^{nd}$ edition pp. 162-163.

* cited by examiner

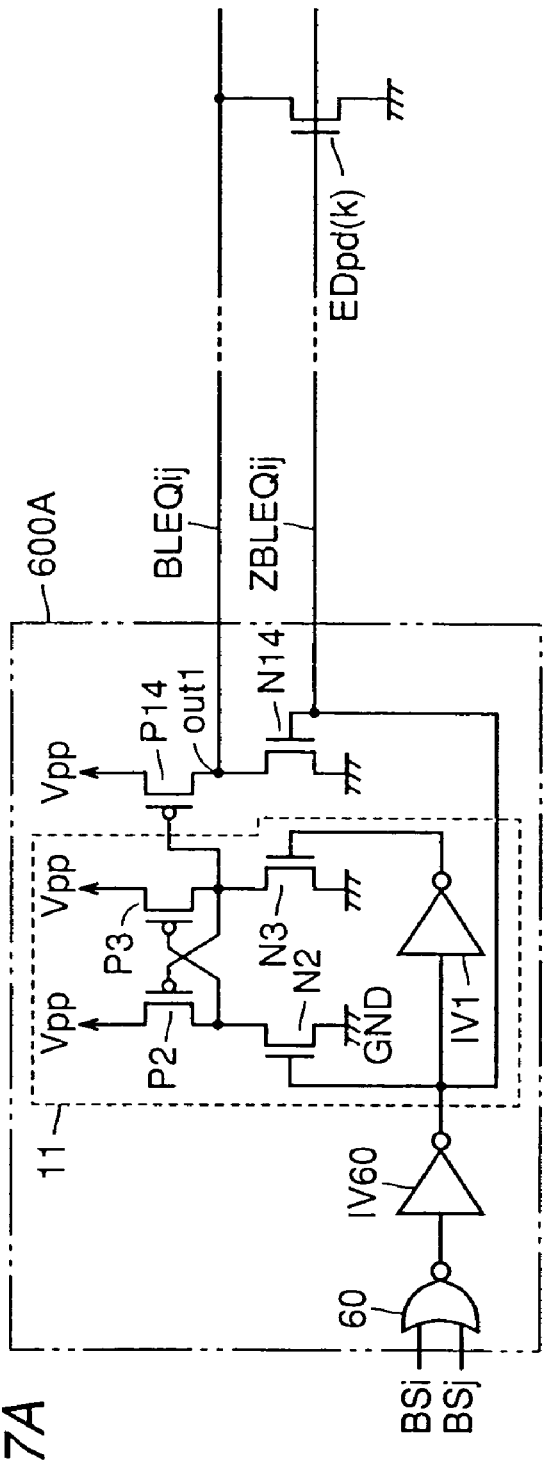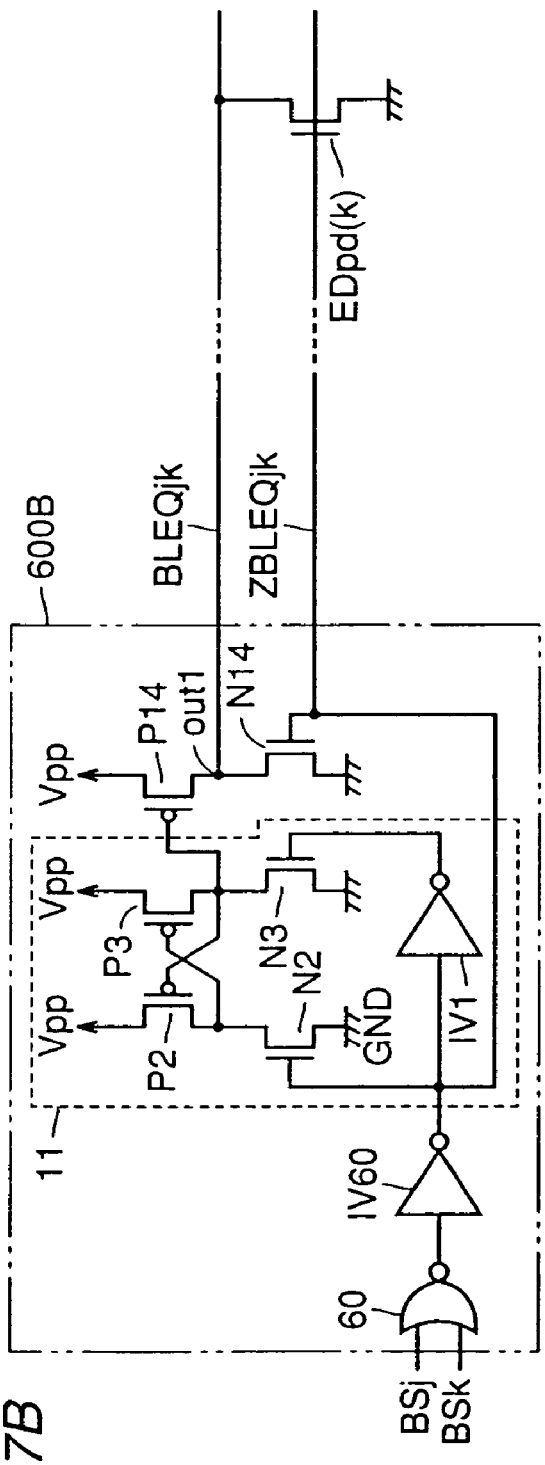

FIG.68  PRIOR ART
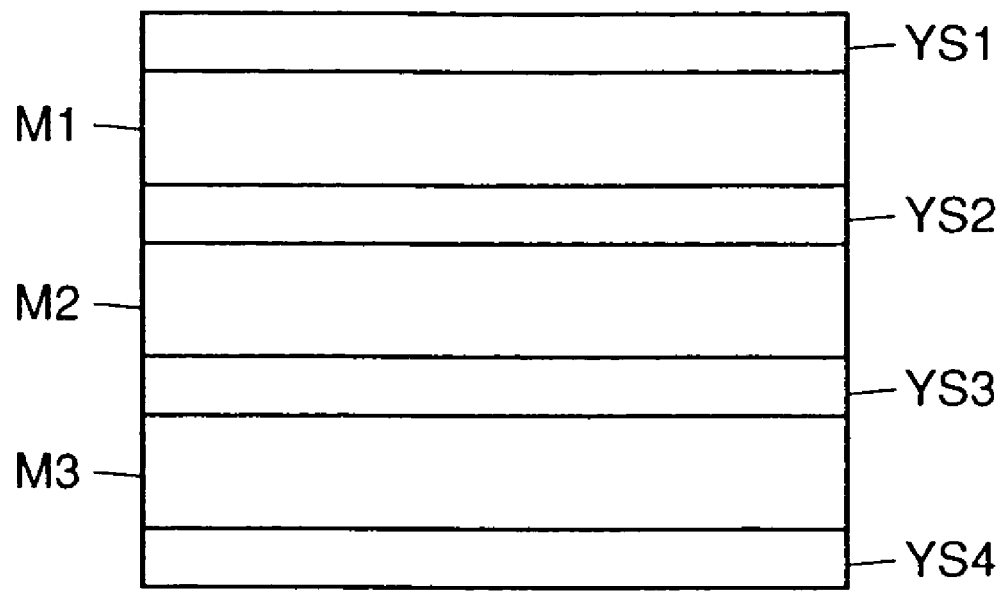
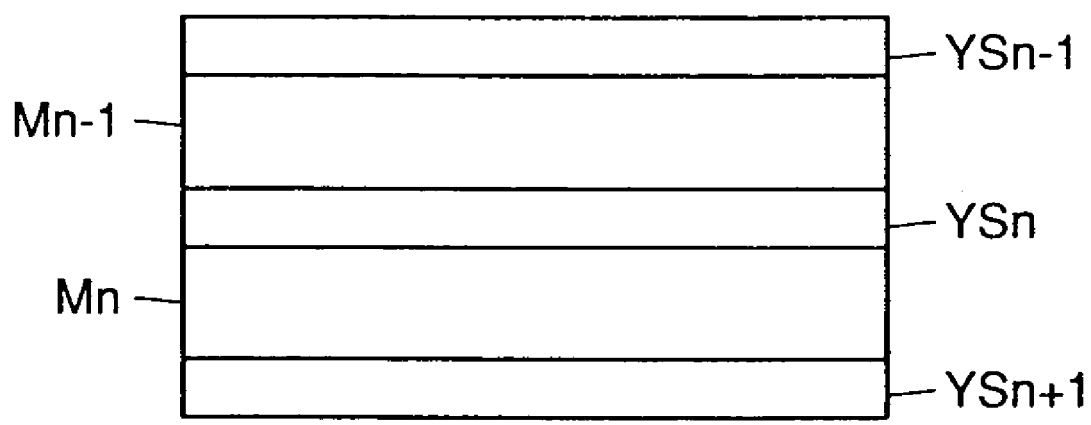

FIRST METHOD OF DRIVING SHARED SENSE AMPLIFIER (THREE-VALUED CONTROL)

SECOND METHOD OF DRIVING SHARED SENSE AMPLIFIER (TWO-VALUED CONTROL)

SEMICONDUCTOR DEVICE HAVING MECHANISM CAPABLE OF HIGH-SPEED OPERATION

RELATED APPLICATIONS

This application is a continuation of application Ser. No. 10/424,104, filed Apr. 28, 2003, now U.S. Pat. No. 6,831,867 which is a divisional of application Ser. No. 09/775,790 filed Feb. 5, 2001, now U.S. Pat. No. 6,563,478, claiming priority of Japanese Application No. 2000-035330, filed Feb. 14, 2000 and Japanese Application No. 2000-179714, filed Jun. 14, 2000, the entire contents of each of which are hereby incorporated by reference.

BACKGROUND OF THE INVENTION

1. Field of the Invention

The present invention relates to a semiconductor device, and more particularly, it relates to a structure for increasing the speed of operations and implementing low power consumption.

2. Description of the Prior Art

As shown in FIG. 68, a conventional dynamic random access memory having a shared sense amplifier system comprises memory cell blocks M1, M2, . . . , Mn and sense amplifier zones YS1, YS2, . . . , YSn+1 arranged to hold the respective memory cell blocks therebetween. Each memory cell block includes a plurality of memory cells arranged in the form of a matrix, a plurality of word lines arranged in correspondence to rows and a plurality of bit lines arranged in correspondence to columns.

As shown in FIG. 69, each sense amplifier zone includes sense amplifiers SA arranged in correspondence to bit lines and selection gates for selectively coupling the sense amplifiers SA with memory cell blocks. Each selection gate is formed by NMOS transistors NA and NB. Symbols BL11, /BL11, BL12, /BL12, BL13 and /BL13 denote the bit lines of the memory cell block M1, symbols BL21, /BL21, BL22, /BL22, BL23 and /BL23 denote the bit lines of the memory cell block M2, symbols BL31, /BL31, BL32, /BL32, BL33 and /BL33 denote the bit lines of the memory cell block M3, and symbol G(i,j) denotes the selection gates respectively.

The respective selection gates are switched in response to gate control signals BLI(1,1), BLI(2,0), BLI(2,1), BLI(3,1), . . . . Switching of the selection gates is controlled for selectively coupling one of two memory cell blocks with the sense amplifier zone held between the two memory cell blocks.

"Ultra LSI Memory" (Kiyoo Ito, Baifukan, 1994, pp. 161–163) describes methods of driving shared sense amplifiers in detail. The following two methods are employed for driving shared sense amplifiers: Referring to FIGS. 70 and 71, symbol BLI(i,j) (j=0 or 1) denotes a gate control signal corresponding to a selected memory cell block Mi, and symbols BLI(i+1,0) and BL(i−1,1) denote gate control signals controlling coupling between sense amplifier zones coupled with the memory cell block Mi and memory cell blocks Mi+1 and Mi−1 respectively.

In the first method, the gate control signals are set to a step-up power supply voltage level (Vpp), an internal power supply voltage level (Vcc) or a ground voltage level (GND) (three-valued control system), where Vpp>Vcc>GND.

As shown in FIG. 70, all gate control signals are set to the internal level Vcc in a standby period, for example. In an active period for coupling the memory cell block Mi with the sense amplifier zones, the gate control signal BLI(i,j) corresponding to the selected memory cell block Mi is set to the level Vpp while the gate control signals BLI(i+1,0) and BLI(i−1,1) corresponding to the non-selected memory cell blocks are set to the level GND.

In the second method, the gate control signals are set to the level Vpp or the level GND (two-valued control system). As shown in FIG. 71, all gate control signals are set to the level Vpp in a standby period, for example. In an active period, the gate control signals BLI(i+1,0) and BLI(i−1,1) are set to the level GND while keeping the gate control signal BLI(i,j) at the level Vpp.

The gate control signals are controlled in the aforementioned manner, for coupling pairs of bit lines of the selected memory cell block with the sense amplifiers SA included in the sense amplifier zones. The other memory cell blocks sharing the sense amplifier zones are disconnected from the sense amplifier zones.

Thus, it follows that data of the selected memory cell block is output to a data input/output line or data of the data input/output line is written in the selected memory cell block. The number of sense amplifier zones can be halved by employing the shared sense amplifier system, thereby reducing the chip area.

Coupling/non-coupling between a memory cell block and a sense amplifier zone is decided by rise/fall of a gate control signal. In order to speed-up the access time, therefore, the gate control signal must be transmitted at a high speed.

However, the gate control signal must drive a large number of (1000 to 4000) selection gates, leading to a large load capacitance of a wire (hereinafter referred to as a BLI wire) transmitting the gate control signal. Further, such a plurality of selection gates are dispersively arranged on the BLI wire over a long distance. According to the conventional structure, therefore, transmission delay of the gate control signal is so remarkable that the access time is retarded.

In addition, power consumption in a circuit (BLI generation circuit) generating the gate control signal is increased by charging/discharging the large load capacitance. This circuit consumes current as to an internally generated step-up power supply voltage Vpp. Thus, it follows that load current is generated in a Vpp generation circuit for generating the step-up power supply voltage Vpp. Therefore, current consumption in the Vpp generation circuit or the area of the Vpp generation circuit is increased.

Further, equalization circuits precharge/equalize bit line potentials in a standby state of a dynamic random access memory. However, an equalization signal for driving the equalization circuits must also drive a large number of equalization circuits and hence has a large load capacitance. In addition, a wire transmitting the equalization signal is lengthened. According to the conventional structure, therefore, the operating speed is limited due to remarkable transmission delay of the equalization signal. Further, power consumption in a circuit generating the equalization signal is increased similarly to the case of the aforementioned BLI generation circuit.

In addition, the structures and operations of circuits for driving a memory cell array, including those for driving sense amplifiers and word lines, are not suitable for high-speed operations and low power consumption. Thus, such structures and operations must be improved.

Further, the circuits for driving the memory cell array include a number of circuits operated at a voltage (boost voltage) higher than a power supply voltage in general, leading to characteristic fluctuation of transistors in these circuits, i.e., a problem of reliability.

SUMMARY OF THE INVENTION

Accordingly, an object of the present invention is to provide a semiconductor device having low power consumption and high reliability, and capable of high-speed operations.

A semiconductor device according to an aspect of the present invention comprises a memory cell array including a plurality of memory cells arranged in the form of a matrix, a plurality of word lines arranged in correspondence to rows and a plurality of bit lines arranged in correspondence to columns, a sense amplifier circuit for reading data from or writing data in the memory cells, a selection gate for selectively coupling the memory cell array with the sense amplifier circuit, a transmission wire transmitting a control signal for on-off controlling the selection gate and a control signal driver arranged on an intermediate position of the transmission wire for driving the potential of the control signal.

Preferably, the semiconductor device further comprises a driver arranged on an end of the transmission wire for driving the potential of the control signal. Preferably, a plurality of such control signal drivers are provided, and the plurality of control signal drivers are dispersively arranged on the transmission wire.

In particular, the control signal driver pulls up or pulls down the potential of the control signal.

Preferably, the control signal driver drives the potential of the control signal in a direction changing the potential of the control signal in transition from a standby period to an active period for coupling the memory cell array with the sense amplifier circuit.

Preferably, the semiconductor device further comprises a driving signal transmission wire transmitting a driving signal for operating the control signal driver, and the transmission wire and the driving signal transmission wire are arranged on different layers.

In particular, the control signal transitions between three voltage levels including a first voltage level, an intermediate voltage level and a second voltage level. The control signal driver operates when making the control signal transition from the intermediate voltage level to the first voltage level or from the intermediate voltage level to the second voltage level.

Preferably, the semiconductor device further comprises the sense amplifier circuit for reading data from or writing data in the memory cells and a precharge circuit for precharging the plurality of bit lines to a prescribed potential, and the precharge circuit is arranged between the memory cell array and the selection gate.

According to the aforementioned semiconductor device, the drivers for driving the potential of the gate control signal are arranged on the intermediate position and the end of the transmission wire transmitting the gate control signal deciding switching of the selection gate. Thus, the selection gate can be switched at a high speed, for implementing high-speed access.

In particular, high-speed driving of the gate control signal is implemented by dispersively arranging local drivers on the transmission wire.

Further, the potential of the gate control signal can be driven at a high-speed by the local drivers when starting the active period for coupling the selected memory cell array with a sense amplifier zone. Therefore, high-speed memory access is enabled.

In addition, a transmission wire ZBLI transmitting a signal driving the local drivers and a transmission wire BLI transmitting the gate control signal are formed on different layers, thereby reducing a floating capacitance on the transmission wire ZBLI and improving an effect related to signal transmission.

With respect to the gate control signal transitioning between three voltage levels, the local drivers can be operated when the potential transitions from a level GND to a level Vcc and from the level Vcc to a level Vpp, for example.

Further, the precharge circuit (equalization circuit EQ) is arranged between the memory cell array and the selection gate, so that no channel resistance of a transistor forming the selection gate is present between the precharge circuit and the bit lines and hence equalization/precharging can be performed at a high speed.

A semiconductor device according to another aspect of the present invention comprises a transmission wire transmitting a signal, a first driver arranged on an intermediate position of the transmission wire for driving the potential of the signal and a second driver arranged on an end of the transmission wire for driving the potential of the signal.

The first driver operates to pull up the potential of the signal. Alternatively, the first driver operates to pull down the potential of the signal. In particular, the semiconductor device further comprises a driving signal transmission wire transmitting a driving signal for operating the first driver, and the transmission wire and the driving signal transmission wire are arranged on different layers.

According to the aforementioned semiconductor device, the potential of the signal can be driven at a high speed when transmitting the signal over a long distance.

Further, the signal can be pulled up or pulled down at a high speed.

The transmission wire transmitting the signal and the transmission wire transmitting the signal for driving the driver are formed on different layers, so that a floating capacitance on the transmission wire transmitting the signal for driving the driver is reduced and an effect related to signal transmission is improved.

A semiconductor device according to still another aspect of the present invention comprises a memory cell array including a plurality of memory cells arranged in the form of a matrix, a plurality of word lines arranged in correspondence to rows and a plurality of bit lines arranged in correspondence to columns, a sense amplifier circuit for reading data from or writing data in the memory cells, a selection gate for selectively coupling the memory cell array with the sense amplifier circuit and a control signal generation circuit generating a control signal for on-off controlling the selection gate, and the control signal generation circuit includes a node outputting the control signal, an amplitude circuit oscillating the potential of the node between a ground voltage level and a step-up power supply voltage level higher than a power supply voltage level and an NMOS transistor connected between the node and the power supply voltage for receiving an ON signal in its gate and pulling up the potential of the node in transition for making the potential of the node transition from the ground voltage level to the step-up power supply voltage level.

Preferably, the ON signal is set to the power supply voltage level in the transition. In particular, the amplitude circuit includes a pull-up PMOS transistor having a drain connected to the node and a source supplied with the step-up power supply voltage and receiving a signal of the ground voltage level in its gate in the transition and a pull-down NMOS transistor having a drain connected to the node and a source supplied with the ground voltage and receiving a signal of the ground voltage level in its gate in the transition.

Preferably, the drain of the pull-up NMOS transistor is supplied with an externally supplied external power supply voltage as the power supply voltage.

According to the aforementioned semiconductor device, an NMOS transistor can be used as one of driving elements deciding the potential of the gate control signal. This NMOS transistor may not be supplied with a one-shot pulse signal, whereby the circuit structure is simplified. Further, channel hot carrier reliability is improved and operations are stabilized. The external power supply voltage is directly supplied to the drain of the aforementioned NMOS transistor. Thus, a load of a circuit generating an internal power supply voltage Vcc can be reduced.

A semiconductor device according to a further aspect of the present invention comprises a memory cell array including a plurality of memory cells arranged in the form of a matrix, a plurality of word lines arranged in correspondence to rows and a plurality of bit lines arranged in correspondence to columns, a sense amplifier circuit for reading or writing signals stored in the memory cells, a selection gate for selectively coupling the memory cell array with the sense amplifier circuit and a control signal generation circuit generating a control signal for on-off controlling the selection gate, and the potential of the control signal transitions between three voltage levels, while the control signal generation circuit uses an externally supplied external power supply voltage as one of the three voltage levels.

Preferably, the three voltage levels are a ground voltage level, the external power supply voltage level and a step-up power supply voltage level higher than the external power supply voltage level, and the control signal generation circuit includes a node outputting the control signal, an amplitude circuit oscillating the potential of the node between the ground voltage level and the step-up power supply voltage level and a voltage set circuit setting the potential of the node to the external power supply voltage level.

In particular, the voltage set circuit includes a transistor connected between the node and the external power supply voltage and turned on when making the potential of the node transition from the ground voltage level or the step-up power supply voltage level to the external power supply voltage level.

According to the aforementioned semiconductor device, the external power supply voltage is used as one of the voltage levels of the gate control signal. Thus, a load on a circuit generating an internal power supply voltage Vcc can be reduced.

An intermediate potential is increased and a pull-up or pull-down operation is speeded up by using the external power supply voltage.

A semiconductor device according to a further aspect of the present invention comprises a plurality of memory cell arrays each including a plurality of memory cells arranged in the form of a matrix, a plurality of word lines arranged in correspondence to rows and a plurality of bit lines arranged in correspondence to columns, a sense amplifier circuit for reading data from or writing data in the memory cells, a plurality of selection gates provided in correspondence to the plurality of memory cell arrays for coupling corresponding memory cell arrays with the sense amplifier circuit, a plurality of transmission wires arranged in correspondence to the plurality of selection gates for transmitting control signals for turning on/off corresponding selection gates and a short circuit, and the potential of each of the plurality of transmission wires transitions between three voltage levels including a first voltage level, a second voltage level and an intermediate voltage level between the first voltage level and the second voltage level, while the short circuit selectively couples a transmission wire transitioning from the first voltage level to the intermediate voltage level with a transmission wire transitioning from the second voltage level to the intermediate voltage level.

Preferably, the semiconductor device further comprises a control signal generation circuit operating to set the potentials of the plurality of transmission wires to the intermediate voltage level in a standby period and set the potential of the transmission wire corresponding to a selected memory cell array to the first voltage level while setting the potential of the transmission wire corresponding to a non-selected memory cell array to the second voltage level in an active period for coupling the selected memory cell array with the sense amplifier circuit, and the short circuit couples the transmission wire corresponding to the selected memory cell array with the transmission wire corresponding to the non-selected memory cell array in transition from the active period to the standby period.

In particular, a plurality of sense amplifier circuits are arranged, each of the plurality of sense amplifier circuits is shared by two memory cell arrays included in the plurality of memory cell arrays, a plurality of short circuits are arranged, and each of the plurality of short circuits is arranged between two transmission wires arranged for the corresponding two memory cell arrays respectively.

According to the aforementioned semiconductor device, the short circuit selectively coupling the transmission wire transitioning from the first voltage level to the intermediate level with the transmission wire transitioning from the second voltage level to the intermediate voltage level is arranged. Thus, power consumption can be reduced.

Further, the short circuit couples the transmission wire corresponding to the selected memory cell array with the transmission wire corresponding to the non-selected memory cell in transition from the active period to the standby period. Thus, a high-speed reset operation is implemented.

In addition, the short circuit can be arranged between BLI wires for two memory cell arrays sharing a coupled sense amplifier zone. Thus, the short circuit can be readily arranged.

A semiconductor device according to a further aspect of the present invention comprises a plurality of memory cell arrays each including a plurality of memory cells arranged in the form of a matrix, a plurality of word lines arranged in correspondence to rows and a plurality of bit lines arranged in correspondence to columns, a sense amplifier circuit for reading data from or writing data in the memory cells, a plurality of selection gates provided in correspondence to the plurality of memory cell arrays for selectively coupling corresponding memory cell arrays with the sense amplifier circuit, a plurality of first transmission wires arranged in correspondence to the plurality of selection gates for transmitting control signals for turning on/off corresponding selection gates, a plurality of equalization circuits arranged in correspondence to the plurality of memory cell arrays for equalizing a plurality of pairs of bit lines, a plurality of second transmission wires arranged in correspondence to the plurality of equalization circuits for transmitting equalization signals for operating corresponding equalization circuits and a short circuit, while the potential of each of the plurality of first transmission wires transitions between three voltage levels including a first voltage level, a second voltage level and an intermediate voltage level between the first voltage level and the second voltage level, the potential of each of the plurality of second transmission wires transitions between two voltage levels including the first voltage level and the second voltage level, and the short circuit selectively couples a first transmission wire having a changing potential with a second transmission wire having a potential changing in a direction different from the direction of potential change of the first transmission wire.

Preferably, the semiconductor device further comprises a first signal generation circuit operating to set the potentials of the plurality of first transmission wires to the intermediate voltage level in a standby period and set the potential of the first transmission wire corresponding to a selected memory cell array to the first voltage level while setting the potential of the first transmission wire corresponding to a non-selected memory cell array to the second voltage level in an active period for coupling the selected memory cell array with the sense amplifier circuit and a second signal generation circuit operating to set the potentials of the plurality of second transmission wires to the first voltage level in the standby period and set the potential of the second transmission wire corresponding to the selected memory cell array to the second voltage level in the active period. In particular, the short circuit couples the first transmission wire corresponding to the selected memory cell array with the second transmission wire corresponding to the selected memory cell array in transition from the active period to the standby period or in transition from the standby period to the active period. In particular, a plurality of such short circuits are arranged and each of the plurality of short circuits is arranged between the first transmission wire for the corresponding memory cell array and the second transmission wire for the corresponding memory cell array.

According to the aforementioned semiconductor device, the first transmission wire having a changing potential and the second transmission wire having a potential changing in a direction different from that of the potential change are selectively coupled with respect to the gate control signal (the first transmission wire) and the equalization signal (the second transmission wire). Thus, power consumption can be reduced.

Further, the short circuit couples the first transmission wire corresponding to the selected memory cell array with the second transmission wire corresponding to the selected memory cell array in transition from the active period to the standby period. Alternatively, the short circuit couples the first transmission wire corresponding to the selected memory cell array with the second transmission wire corresponding to the selected memory cell array in transition from the standby period to the active period. Thus, high-speed selection is enabled.

In addition, the short circuit can be arranged between a BLI wire and an equalization wire arranged on the same side of the same memory cell array. Thus, the short circuit can be readily arranged.

A semiconductor device according to a further aspect of the present invention comprises a transmission wire transmitting a first control signal and a second control signal of inverse logic to the first control signal, an inversion driver arranged on an intermediate position of the transmission wire for inverting an input signal and outputting the inverted signal, a plurality of first loads dispersively arranged on the transmission wire and driven by the first control signal and a plurality of second loads, different from the plurality of first loads, dispersively arranged on the transmission wire and driven by the second control signal.

Preferably, the transmission wire includes first and second transmission wires transmitting the first control signal and third and fourth transmission wires transmitting the second control signal, the inversion driver includes a first inversion driver having an input connected with the first transmission wire and an output connected with the fourth transmission wire and a second inversion driver having an input connected with the third transmission wire and an output connected with the second transmission wire, the plurality of first loads are arranged on the first and second transmission wires, and the plurality of second loads are arranged on the third and fourth transmission wires.

In particular, the semiconductor device further comprises a driver arranged on an intermediate position of the transmission wire, and the driver is driven by either the first or second control signal and drives the potential of the other control signal.

According to the aforementioned semiconductor device, an inversion repeater is arranged between the transmission wires transmitting first and second signals of inverse logic. Thus, when the loads to be driven by the first signal are large and cause transmission delay, the first and second signals can be transmitted at a high speed over a long distance by generating the first signal on the basis of the high-speed second signal and generating the second signal on the basis of the first signal.

A semiconductor device according to a further aspect of the present invention comprises a memory cell array including a plurality of memory cells arranged in the form of a matrix and a plurality of bit lines arranged in correspondence to a plurality of columns, a precharge circuit for precharging the plurality of bit lines to a prescribed potential, a transmission wire transmitting a control signal for operating the precharge circuit and a control signal driver arranged on an intermediate position of the transmission wire for driving the potential of the control signal.

Preferably, the semiconductor device further comprises a driver arranged on an end of the transmission wire for driving the potential of the control signal, a plurality of such control signal drivers are provided and the plurality of control signal drivers are dispersively arranged on the transmission wire.

Preferably, the semiconductor device further comprises a driving signal transmission wire transmitting a driving signal for operating the control signal driver, and the transmission wire and the driving signal transmission wire are arranged on different layers.

In particular, the semiconductor device further comprises a sense amplifier circuit for reading data from or writing data in the memory cells and a selection gate for selectively coupling the plurality of bit lines with the sense amplifier circuit, and the precharge circuit is arranged between the memory cell array and the selection gate.

Preferably, the semiconductor device further comprises an activation signal transmission wire transmitting an activation signal for operating the sense amplifier circuit and an activation signal driver arranged on an intermediate position of the activation signal transmission wire for driving the potential of the activation signal. The semiconductor device further comprises a driver arranged on an end of the activation signal transmission wire for driving the potential of the activation signal, and a plurality of activation signal drivers are provided while the plurality of activation signal drivers are dispersively arranged on the activation signal transmission wire.

In particular, the memory cell array is divided into a plurality of memory blocks and further includes a plurality of main word lines arranged in common to the plurality of memory blocks, while each of the plurality of memory blocks includes a plurality of sub word lines arranged in correspondence to a plurality of rows so that one of the sub word lines is selected by a corresponding main word line and a sub word line driver driving the plurality of sub word lines.

According to the aforementioned semiconductor device, the precharge circuit (equalization circuit EQ) precharging pairs of bit lines is dispersively driven thereby implementing high-speed access.

Further, the transmission wire transmitting the signal for driving local drivers and the transmission wire transmitting the signal for driving the precharge circuit are formed on different layers. Thus, the signal transmission speed for the signal for driving the drivers is increased.

In addition, the precharge circuit (equalization circuit EQ) is arranged between the memory cell array and the selection gate. Thus, no channel resistance of a transistor forming the selection gate is present between the precharge circuit and the bit lines, whereby equalization/precharging can be performed at a high speed.

The transmission wire transmitting the activation signal for activating the sense amplifier circuit is dispersively driven for driving the activation signal at a high speed and implementing high-speed access.

Further, access can be implemented at a higher speed due to a divided word line structure.

A semiconductor device according to a further aspect of the present invention comprises a memory cell array including a plurality of memory cells arranged in the form of a matrix, a plurality of word lines arranged in correspondence to a plurality of rows and a plurality of bit lines arranged in correspondence to a plurality of columns, a sense amplifier circuit for reading data from or writing data in the memory cells, a precharge circuit for precharging the plurality of bit lines to a prescribed potential, a selection gate for selectively coupling the plurality of bit lines with the sense amplifier circuit, a transmission wire transmitting an activation signal for operating the sense amplifier circuit and an activation signal driver arranged on an intermediate position of the transmission wire for driving the potential of the activation signal, and the precharge circuit is arranged between the memory cell array and the selection gate.

Preferably, the semiconductor device further comprises a driver arranged on an end of the transmission wire for driving the potential of the activation signal, a plurality of activation signal drivers are provided, and the plurality of activation signal drivers are dispersively arranged on the transmission wire.

According to the aforementioned semiconductor device, no source-to-drain channel resistance of a transistor forming the selection gate is interposed between an equalization circuit and the bit lines. Therefore, equalization can be speeded up when starting equalizing the bit lines in a reset operation. Resetting of a sense amplifier driving transistor is also speeded up by the dispersively arranged drivers. Thus, the reset operation can be speeded up by combination thereof.

A semiconductor device according to a further aspect of the present invention comprises a memory cell array including a plurality of memory cells arranged in the form of a matrix, a plurality of word lines arranged in correspondence to a plurality of rows and a plurality of bit lines arranged in correspondence to a plurality of columns, a precharge circuit for precharging the plurality of bit lines to a prescribed potential in response to a control signal and a control signal generation circuit supplying the control signal, and the potential of the control signal transitions between three voltage levels.

Preferably, the control signal transitions between three voltage levels including a first voltage level, a second voltage level and an intermediate voltage level, and the control signal generation circuit makes the control signal transition to the second voltage level after making the control signal transition from the first voltage level to the intermediate voltage level when making the control signal transition from the first voltage level to the second voltage level.

Preferably, the semiconductor device further comprises a sense amplifier circuit for reading data from or writing data in the memory cells and a selection gate for selectively coupling the plurality of bit lines with the sense amplifier circuit. The precharge circuit is arranged between the memory cell array and the selection gate.

According to the aforementioned semiconductor device, the precharge circuit (precharge/equalization circuit) precharging pairs of bit lines is subjected to three-valued control. Thus, current consumption as well as the area of a step-up power supply voltage generation circuit can be suppressed.

Further, the precharge circuit (precharge/equalization circuit) is arranged between the memory cell array and the selection gate. Thus, no channel resistance of a transistor forming the selection gate is present between the precharge circuit and the bit lines, whereby equalization/precharging can be performed at a high speed.

A semiconductor device according to a further aspect of the present invention comprises a memory cell array including a plurality of memory cells arranged in the form of a matrix, a plurality of word lines arranged in correspondence to a plurality of rows and a plurality of bit lines arranged in correspondence to a plurality of columns, a sense amplifier circuit for reading data from or writing data in the memory cells, a selection gate for selectively coupling the memory cell array with the sense amplifier circuit in response to a control signal and a control signal generation circuit generating the control signal, the potential of the control signal transitions between three voltage levels including a first voltage level, a second voltage level and an intermediate voltage level, and the control signal generation circuit makes the control signal transition to the second voltage level after making the control signal transition from the first voltage level to the intermediate voltage level when making the control signal transition from the first voltage level to the second voltage level.

Preferably, the control signal generation circuit includes a node outputting the control signal, an amplitude circuit oscillating the potential of the node between the first voltage level and the second voltage level and a transistor connected between the node and a node receiving a power supply voltage of the intermediate voltage level for pulling up the potential of the node in transition for making the potential of the node transition from the first voltage level to the second voltage level. The power supply voltage of the intermediate voltage level is an externally supplied external power supply voltage.

In the aforementioned semiconductor device, the selection gate is subjected to three-valued driving while a precharge circuit (precharge/equalization circuit) precharging the bit lines is arranged between the selection gate and the memory cell array. Thus, current consumption and a circuit load of a step-up power supply voltage circuit are reduced, while no channel resistance of a transistor forming the selection gate is present between the precharge circuit and the bit lines and hence equalization/precharging can be performed at a high speed. When employing the external power supply voltage as the intermediate voltage, a load on a circuit generating an internal power supply voltage Vcc can be reduced.

A semiconductor device according to a further aspect of the present invention comprises a memory cell array including a plurality of memory cells arranged in the form of a matrix, a plurality of word lines arranged in correspondence to a plurality of rows and a plurality of bit lines arranged in correspondence to a plurality of columns, a word line driver for activating a selected word line among the plurality of word lines and a signal generation circuit generating a driving signal for driving the word line driver, and the driving signal transitions between three voltage levels.

Preferably, the driving signal transitions between three voltage levels including a first voltage level, a second voltage level and an intermediate voltage level, a plurality of such driving signals are included in correspondence to the plurality of word lines respectively, and the signal generation circuit sets the plurality of driving signals to the intermediate voltage level in a standby period and sets the driving signal corresponding to the selected word line to the second voltage level while setting the driving signal corresponding to a non-selected word line to the first voltage level in an active period.

According to the aforementioned semiconductor device, the driving signal for driving the word line driver for selecting the word line is subjected to three-valued control. Thus, current consumption as well as the area of a step-up power supply voltage generation circuit can be suppressed. Further, reliability of a gate oxide film of a transistor forming the word line driver receiving the driving signal in its gate is improved. In addition, hot carrier reliability is remarkably improved as to a PMOS transistor forming the word line driver.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 47A and 47B are circuit diagrams for illustrating a BLEQ generation circuit according to the eighth embodiment of the present invention;

FIGS. 68 and 69 are diagrams for illustrating a conventional dynamic random access memory having a shared sense amplifier system.

DESCRIPTION OF THE PREFERRED EMBODIMENTS

Figure 1:
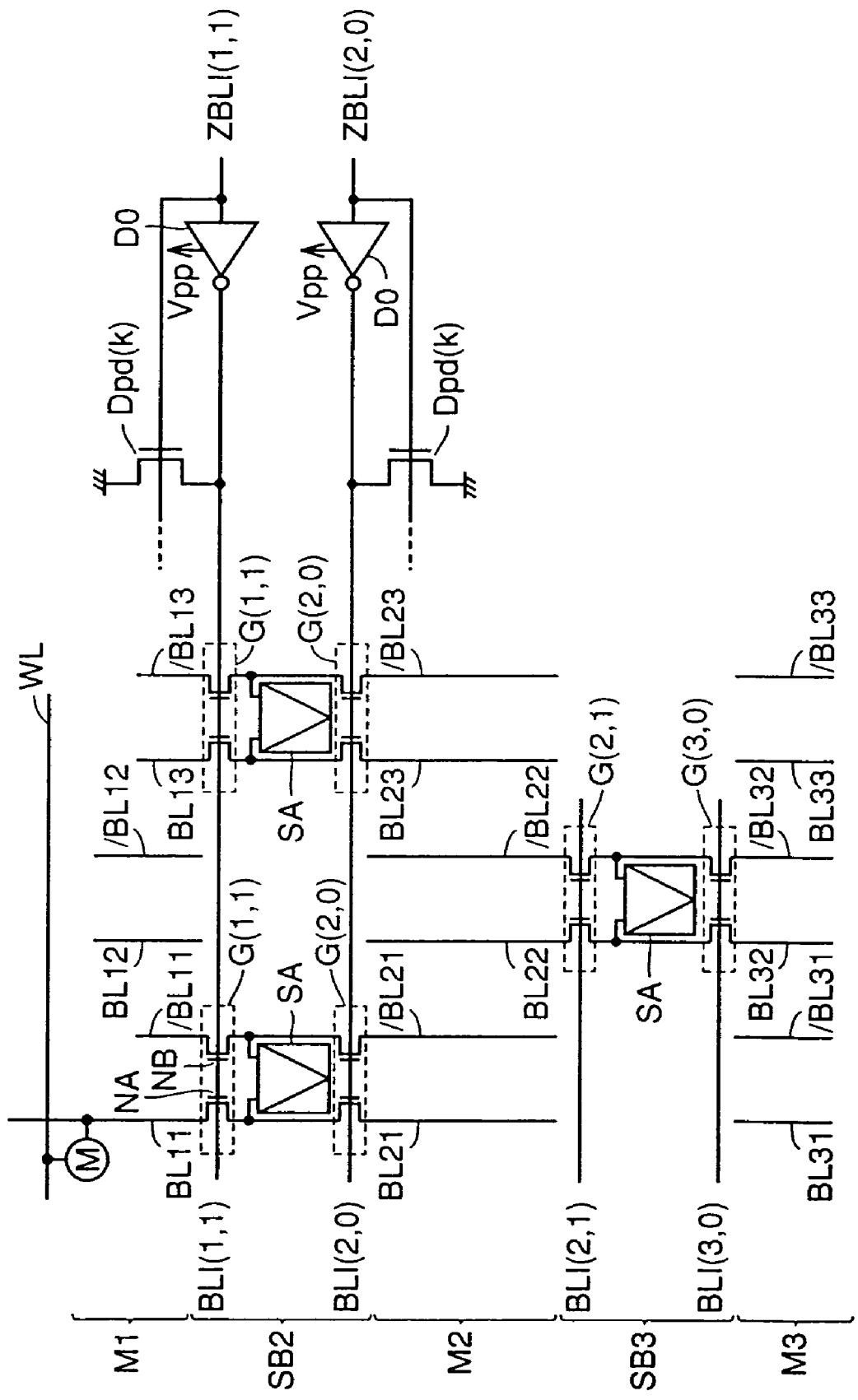
FIG. 1 illustrates the structure of a principal part of a semiconductor device according to a first embodiment of the present invention.

Embodiments of the present invention are now described in detail with reference to the drawings. Referring to the drawings, identical or corresponding parts are denoted by the same reference numerals or symbols, and redundant description is not repeated. Signals and wires transmitting the signals are denoted by the same symbols.

First Embodiment

A semiconductor device according to a first embodiment of the present invention is now described. As shown in FIG. 1, the semiconductor device according to the first embodiment of the present invention comprises a plurality of memory cell blocks and sense amplifier zones arranged to hold the memory cell blocks therebetween.

FIG. 1 representatively shows memory cell blocks M1, M2 and M3, a sense amplifier zone SB2 shared by the memory cell blocks M1 and M2 and a sense amplifier zone SB3 shared by the memory cell blocks M2 and M3.

Each memory cell block includes a plurality of memory cells arranged in the form of a matrix, a plurality of word lines arranged in correspondence to a plurality of rows and a plurality of bit lines arranged in correspondence to a plurality of columns. Referring to FIG. 1, symbol M denotes a memory cell, symbol WL denotes a word line, and symbols BLij and /BLij (i=1, 2, ..., j=1, 2, ... : i corresponds to the number of the memory cell block) denote bit lines respectively.

Each sense amplifier zone includes sense amplifiers SA arranged in correspondence to pairs of bit lines and a selection gate for selecting one of two memory cell blocks arranged on both sides thereof. For example, a pair of bit lines BL11 and /BL11 and a pair of bit lines BL21 and /BL21 are connected with the sense amplifier SA through selection gates G(1,1) and G(2,0) respectively. Further, a pair of bit lines BL22 and /BL22 and a pair of bit lines BL32 and /BL32 are connected with the sense amplifier SA through selection gates G(2,1) and G(3,0) respectively.

According to the first embodiment of the present invention, drivers D0 (hereinafter referred to as BLI drivers D0) and local drivers Dpd are arranged for wires transmitting gate control signals BLI for switching the selection gate controlling coupling between the sense amplifier zone and the memory cell blocks. The wires transmitting the gate control signals BLI are referred to as BLI wires and wires transmitting gate control signals ZBLI out of phase with the gate control signals BLI are referred to as ZBLI wires.

Each selection gate is formed by NMOS transistors NA and NB. In the following description, "i" in symbols BLI(i,j), G(i,j) and ZBLI(i,j) expresses correspondence to a memory cell block Mi, and j expresses "0" (the side of a sense amplifier zone shared by the memory cell block Mi and a memory cell block Mi−1) or "1" (the side of a sense amplifier zone shared by the memory cell block Mi and a memory cell block Mi+1).

Each BLI driver D0 is supplied with a step-up power supply voltage Vpp as an operating power source and outputs a signal (gate control signal BLI) out of phase with the gate control signal ZBLI. Each local driver Dpd is formed by an NMOS transistor connected between each BLI wire and a node receiving a ground voltage GND for receiving the gate control signal ZBLI in its gate.

FIG. 1 representatively shows a local driver Dpd(k) and a BLI driver D0 connected to a BLI wire BLI(1,1) arranged for selection gates G(1,1) as well as a local driver Dpd(k) and a BLI driver D0 connected to a BLI wire BLI(2,0) arranged for selection gates G(2,0).

Figure 2:
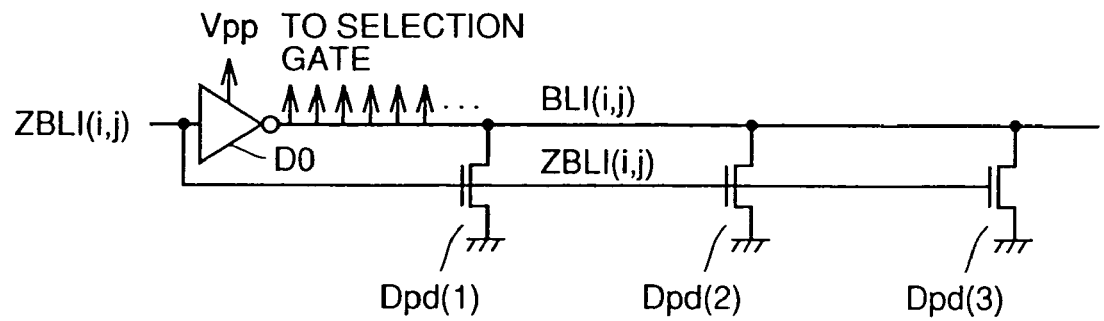
FIG. 2 illustrates connection between a BLI driver and local drivers Dpd on a BLI wire.

As shown in FIG. 2, the BLI driver D0 corresponding to the memory cell block Mi is arranged on an end of the BLI wire BLI(i,j) transmitting the gate control signal. Local drivers Dpd(1), Dpd(2), Dpd(3), . . . are dispersively arranged along the BLI wire BLI(i,j). The BLI wire BLI(i,j) supplies the gate control signal BLI(i,j) to a plurality of selection gates G(i,j).

As described above, the BLI wire connected with a number of selection gates exhibits remarkable transmission delay of the gate control signal in the conventional structure. Each gate control signal rises in transition from an active period to a standby period, and falls at the head of the active period for coupling the memory cell block with the sense amplifier zone. Therefore, transmission delay of a low-level gate control signal remarkably influences on delay of an access time or the like.

According to the first embodiment of the present invention, therefore, the BLI driver D0 included in a BLI generation circuit steps down the potential of the BLI wire while the local drivers Dpd dispersively arranged along the BLI wire pull down (step down) the potential of the BLI wire at a high speed.

Figure 3:
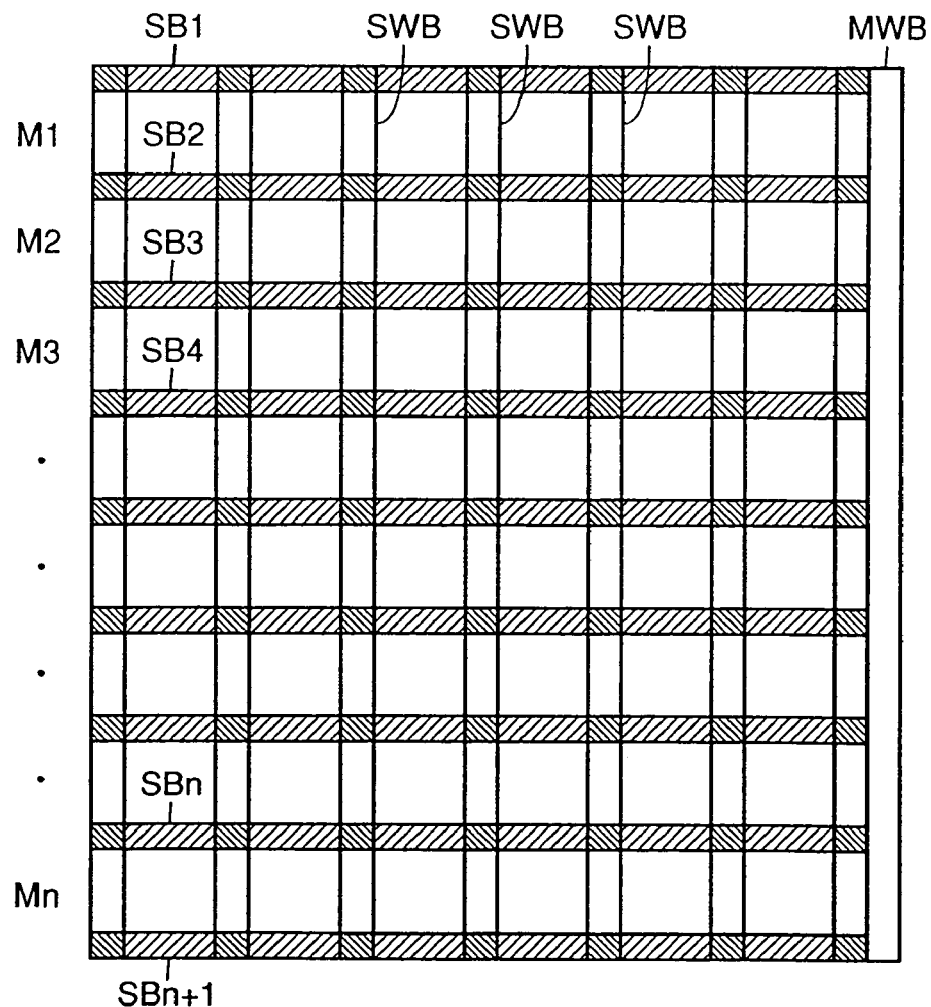
FIGS. 3 and 4 are diagrams for illustrating exemplary arrangement of BLI drivers D0 and local drivers Dpd.
Figure 4:
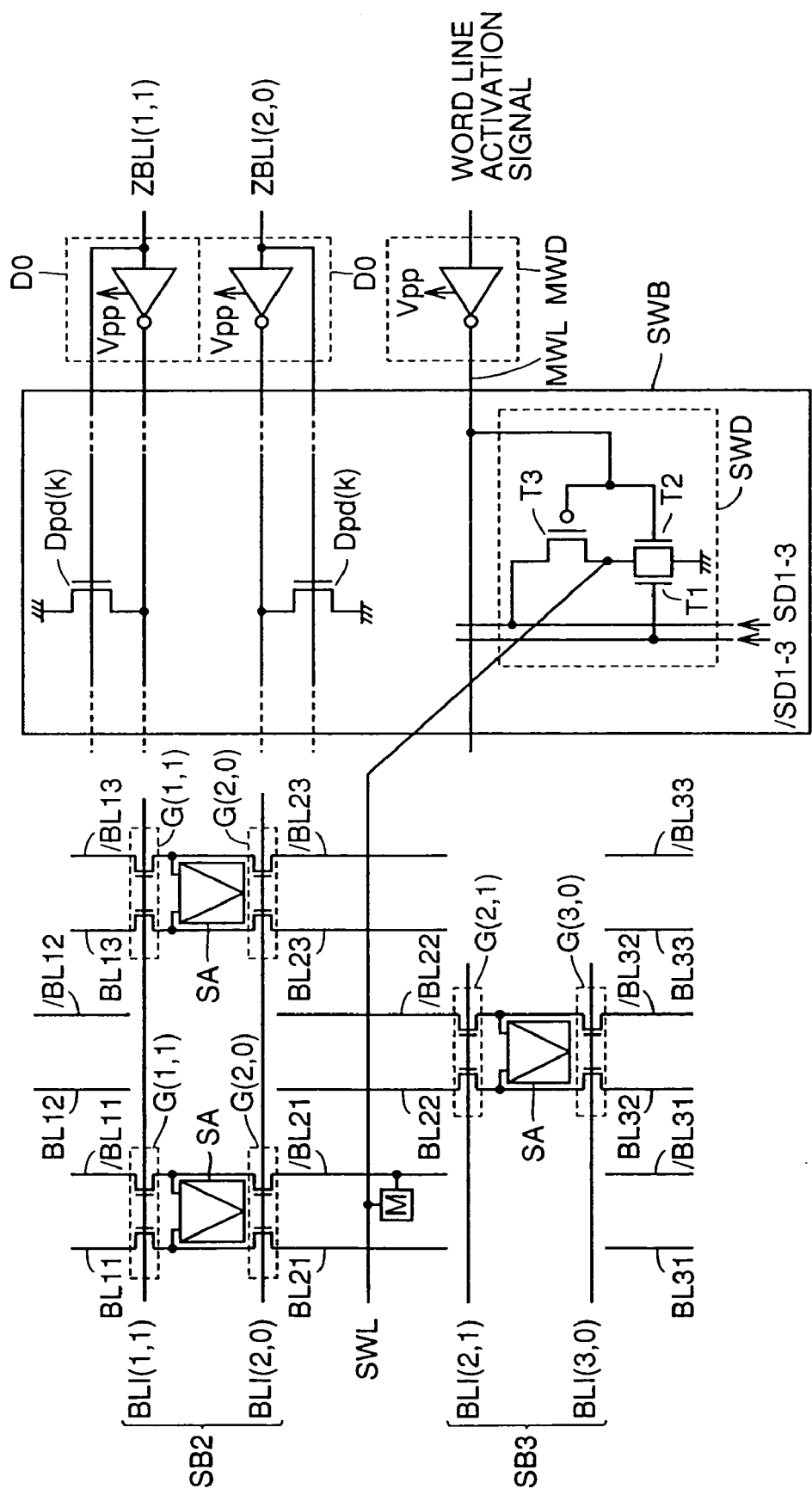

FIGS. 3 and 4 show exemplary arrangement of the BLI drivers D0 and the local drivers Dpd. Referring to FIGS. 3 and 4, symbols M1 to Mn denote memory cell blocks, symbols SB1 to SBn+1 denote sense amplifier zones, symbol SWB denotes sub word driver zones driving sub word lines, and symbol MWB denotes a main word line driver zone driving a main word line. Symbol MWL denotes a main word line, symbol SWL denotes a sub word line, symbol M denotes a memory cell, symbol SWD denotes a sub word driver and symbol MWD denotes a main word driver respectively.

Word lines of each of the memory cell blocks M1 to Mn are in a hierarchical structure. A plurality of sub word lines are provided in correspondence to a single main word line.

The main word driver MWD included in the main word driver zone MWB is supplied with the step-up power supply voltage Vpp as a power source for inverting an input word line activation signal and supplying the inverted signal to the main word line MWL.

The sub word driver SWD included in each sub word driver zone SWB is formed by transistors T1, T2 and T3. The transistors T1 and T2 are NMOS transistors, and the transistor T3 is a PMOS transistor. The transistor T3 has a source receiving a sub word signal SDi (i=1, 2, 3 or 4) and a drain connected with the drains of the transistors T1 and T2. The sources of the transistors T1 and T2 receive the ground voltage. The gates of the transistors T2 and T3 are connected with the main word line, and the gate of the transistor T1 receives an inverted signal /SDi of the sub word signal SDi. The sub word line SWL is connected with a node between the transistor T3 and the transistors T1 and T2. The sub word signals SDi and /SDi are generated by decoding an address signal.

The sub word driver zones SWB divide each memory cell block into a plurality of sub memory blocks. Each sub word driver zone SWB selects sub word lines included in sub memory blocks located on both sides thereof.

The local drivers Dpd are arranged on intersections (cross points) between the sub word drivers SWB arranged in the column direction and the sense amplifier zones arranged in the row direction.

Each gate control signal BLI is input in a number of selection gates and hence each BLI wire is formed by a metal layer located on a relatively low position. When forming each ZBLI wire transmitting each gate control signal ZBLI on a metal layer located above the BLI wire (so that the BLI wiring capacitance is greater than the ZBLI wiring capacitance), a floating capacitance on the ZBLI wire is reduced to attain a remarkable effect related to signal transmission. When preparing the BLI wire from aluminum and preparing the ZBLI wire formed by a wiring layer different from that forming the BLI wire from Cu (copper) having a higher signal propagation speed than aluminum, a higher effect is attained.

Figure 5A:
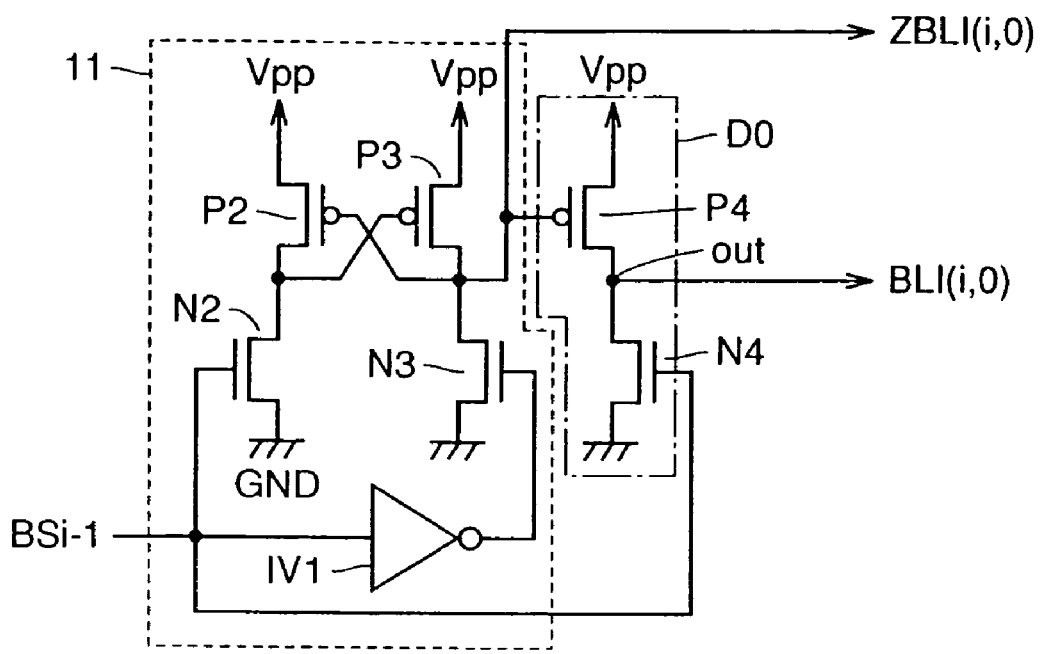
FIGS. 5A and 5B are circuit diagrams for illustrating a BLI generation circuit 100 according to the first embodiment of the present invention.
Figure 5B:
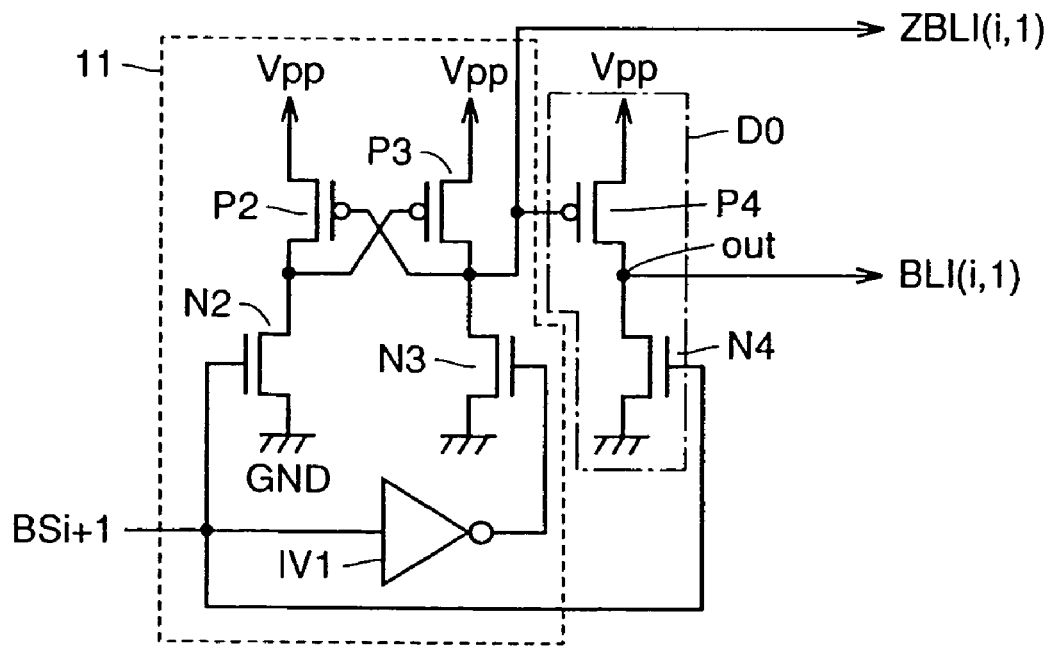

A BLI generation circuit 100 according to the first embodiment of the present invention is described with reference to FIGS. 5A and 5B. The BLI generation circuit 100 corresponding to the memory cell block M1 includes a BLI generation circuit 100A shown in FIG. 5A and a BLI generation circuit 100B shown in FIG. 5B. The BLI generation circuit 100A for generating gate control signals BLI(i,0) and ZBLI(i,0) includes a level shifter 11 and transistors P4 and N4 forming a BLI driver D0. The transistor P4 is a PMOS transistor, and the transistor N4 is an NMOS transistor. The BLI generation circuit 100B for generating gate control signals BLI(i,1) and ZBLI(i,1) includes a level shifter 11 and transistors P4 and N4.

Each level shifter 11 includes an inverter IV1 and transistors P2, P3, N2 and N3. The transistors P2 and P3 are PMOS transistors, and the transistors N2 and N3 are NMOS transistors.

The inverter IV1 inverts a block selection signal. The transistor P2 is connected between the step-up power supply voltage Vpp and the transistor N2, and receives a signal from a node between the transistors P3 and N3 in its gate. The transistor N2 is connected between the transistor P2 and the ground voltage, and receives the block selection signal in its gate. The transistor P3 is connected between the step-up power supply voltage Vpp and the transistor N3, and receives a signal from a node between the transistors P2 and N2. The transistor N3 is connected between the transistor P3 and the ground voltage, and receives an output of the inverter IV1 in its gate.

The transistors P4 and N4 are serially connected between the step-up power supply voltage Vpp and the ground voltage GND. The gate of the transistor P4 is connected with the node between the transistors P3 and N3, and the gate of the transistor N4 receives the block selection signal.

In the BLI generation circuit 100A, the gate of the transistor N2, the inverter IV1 and the gate of the transistor N4 receive a block selection signal BSi−1. A node out between the transistors P4 and N4 outputs the gate control signal BLI(i,0), and the node between the transistors P3 and N3 outputs the gate control signal ZBLI(i,0).

In the BLI generation circuit 100B, the gate of the transistor N2, the inverter IV1 and the gate of the transistor N4 receive a block selection signal BSi−1. A node out between the transistors P4 and N4 outputs the gate control signal BLI(i,1), and the node between the transistors P3 and N3 outputs the gate control signal ZBLI(i,1).

When the block selection signal BSi−1 is high (the memory cell block Mi−1 is selected), for example, the gate control signal ZBLI(i,0) reaches the step-up power supply voltage level (level Vpp) and the gate control signal BLI(i,0) reaches the ground voltage level (level GND). When the block selection signal BSi−1 is low, the gate control signal ZBLI(i,0) reaches the level GND and the gate control signal BLI(i,0) reaches the level Vpp.

Figure 6:
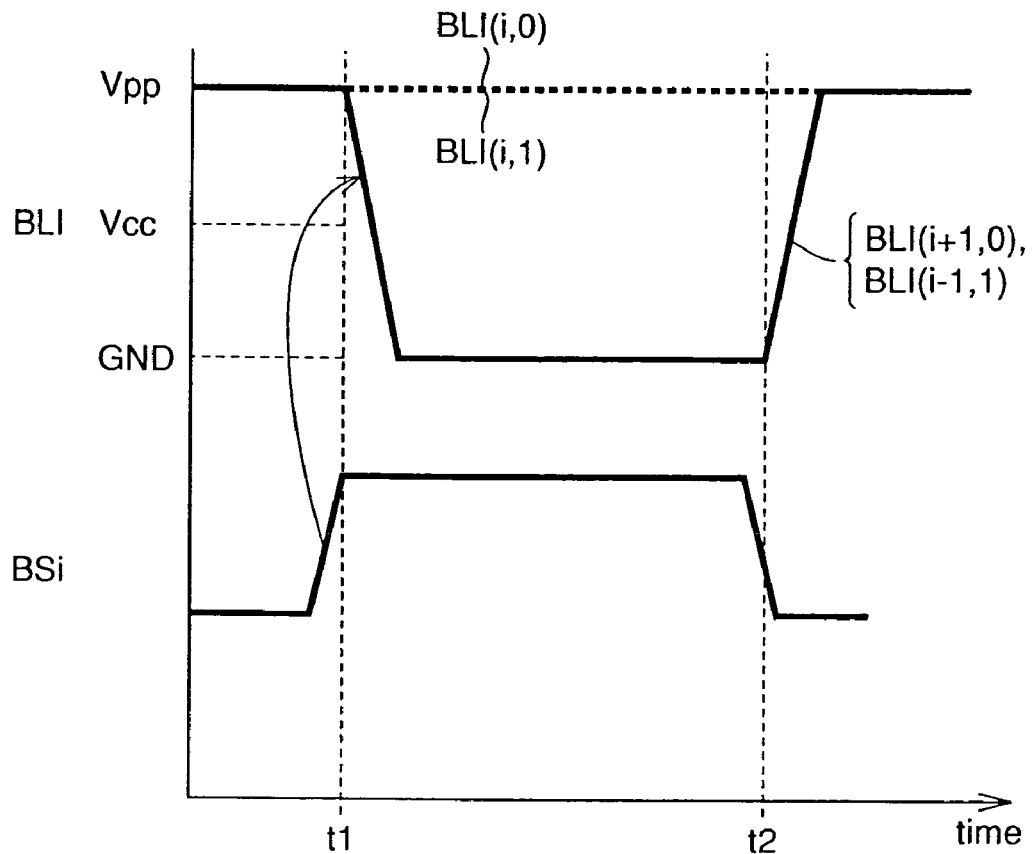
FIG. 6 is a timing chart showing changes of gate control signals according to the first embodiment of the present invention.

Operation timing according to the first embodiment of the present invention is described with reference to FIG. 6. Referring to FIG. 6, symbols BLI(i,0) and BLI(i,1) denote the gate control signals for the selected memory cell block Mi, and symbols BLI(i+1,0) and BLI(i−1,1) denote gate control signals controlling coupling between the sense amplifier zones coupled with the memory cell block Mi and the memory cell blocks Mi+1 and Mi−1 respectively. In a standby state, all gate control signals are at the level Vpp.

According to an input external row address, the block selection signal BSi goes high for selecting the memory cell block Mi (time t1). The NMOS transistor N4 included in the BLI driver D0 makes the gate control signals BLI(i+1,0) and BLI(i−1,1) fall. The local driver Dpd operates to pull down the gate control signals BLI(i+1,0) and BLI(i−1,1).

The sense amplifier zones coupled with the memory cell block Mi are disconnected from the memory cell blocks Mi+1 and Mi−1. The remaining gate control signals keep the standby state (the level Vpp).

After the memory cell block is selected and coupled with the corresponding sense amplifier zones, actual operations (selection and driving of a word line, activation of a sense amplifier etc.) are performed.

All gate control signals return to the standby state (the level Vpp) when the active period is ended (time t2).

The following specific effects result from the aforementioned structure and operations: First, the gate control signals BLI can be pulled down at a higher speed by a high-speed pull-down operation of the local driver Dpd driven by the ZBLI wire having a smaller load and faster signal transmission as compared with a pull-down operation by a driver in the BLI generation circuit.

Figure 7:
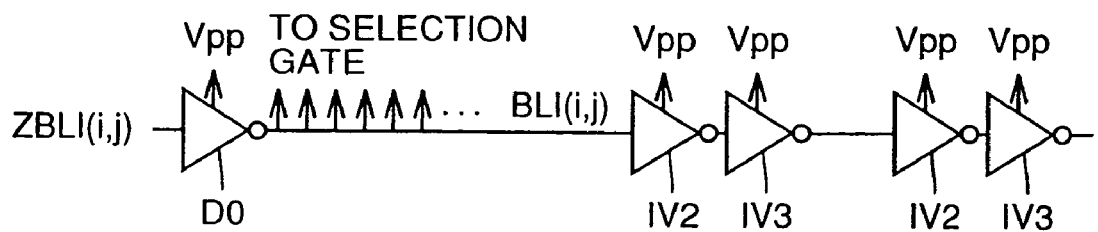
FIG. 7 illustrates repeaters inserted into intermediate positions of a BLI wire.

Second, the number of elements to be arranged on the cross points between the sense amplifier zones and the sub word driver zones SWB is smaller as compared with a system inserting repeaters (formed by inverters IV2 and IV3 shown in FIG. 7) into intermediate positions of the BLI wire and the step-up power supply voltage Vpp may not be supplied to the cross points. Therefore, the chip area is reduced.

The operation for pulling down the gate control signals BLI requiring high-speed signal transmission is speeded up due to the aforementioned effects, to enable high-speed access. Further, the area can be prevented from unnecessary increase.

The gate control signals ZBLI driven at the level Vpp in the above description may alternatively be driven at an internal power supply voltage level Vcc (Vpp>Vcc).

Figure 8:
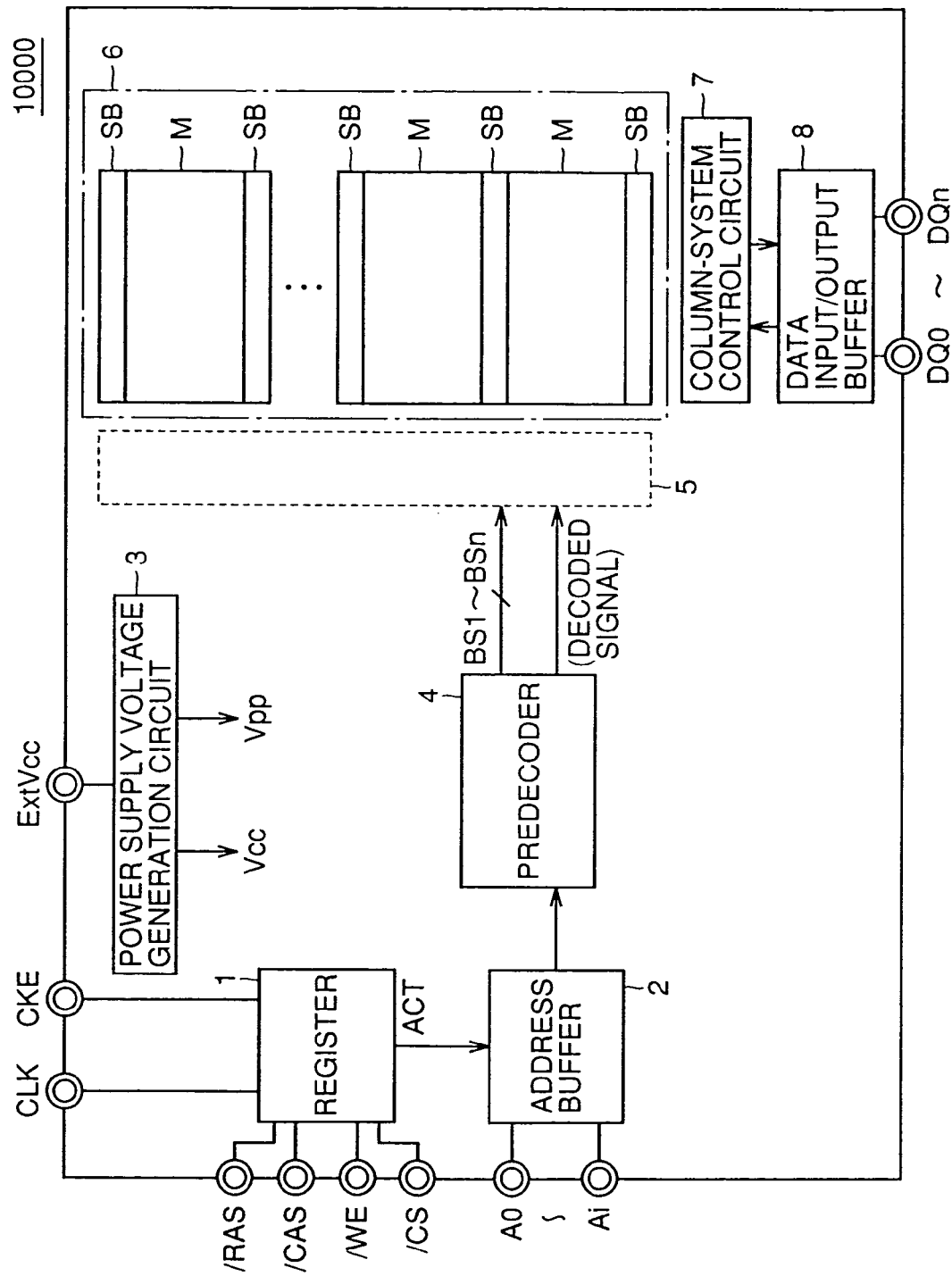
FIG. 8 is a block diagram showing an example of the overall structure of a semiconductor memory device 10000 according to the first embodiment of the present invention.

An exemplary structure of a semiconductor memory device 10000 according to the first embodiment of the present invention is described with reference to FIG. 8. The semiconductor memory device 10000 comprises a register 1 generating internal control signals on the basis of externally received control signals (external row address strobe signal/RAS etc.), an address buffer 2 receiving external addresses A0 to Ai and outputting corresponding internal addresses, a predecoder 4 decoding the outputs of the address buffer 2 and outputting decoded signals and block selection signals BS and a power supply voltage generation circuit 3 receiving an external power supply voltage ExtVcc and outputting the internal power supply voltage Vcc, the step-up power supply voltage Vpp etc. The internal power supply voltage Vcc is 2.0 V, the external power supply voltage ExtVcc is 3.3 V, and the step-up power supply voltage Vpp is 3.5 V, for example.

The semiconductor memory device 10000 further comprises an area 5 including a row-system control circuit controlling row-system operations in an array part 6, the BLI generation circuit, a BLEQ generation circuit generating signals BLEQ equalizing bit lines and the like, the array part 6 including the memory cell blocks M1 to Mn and the sense amplifier zones SB1 to SBn+1, a column-system control circuit 7 controlling column-system operations in the array part 6 and a data input/output buffer 8 transferring data between the array part 6 and data input/output pins DQ0 to DQn. As described above, the semiconductor memory device 10000 employs an alternatively arranged shared sense amplifier system.

While the above description shows a structure for speeding up a pull-down operation, the present invention is also applicable to a pull-up structure. While the local drivers Dpd are arranged on cross points, the present invention is not restricted to this but the local drivers Dpd may alternatively arranged on areas held between the sub word driver zones in the sense amplifier zones.

While the above description shows an exemplary structure corresponding to a two-valued control system (operation for bringing the gate control signals BLI from the standby state of the level Vpp to the level GND) for the gate control signals BLI in the method of driving shared sense amplifiers, the present invention is also applicable to a three-valued control system (operation for bringing the gate control signals BLI from the standby state of the level Vcc to the level Vpp or the level GND).

Second Embodiment

Figure 9:
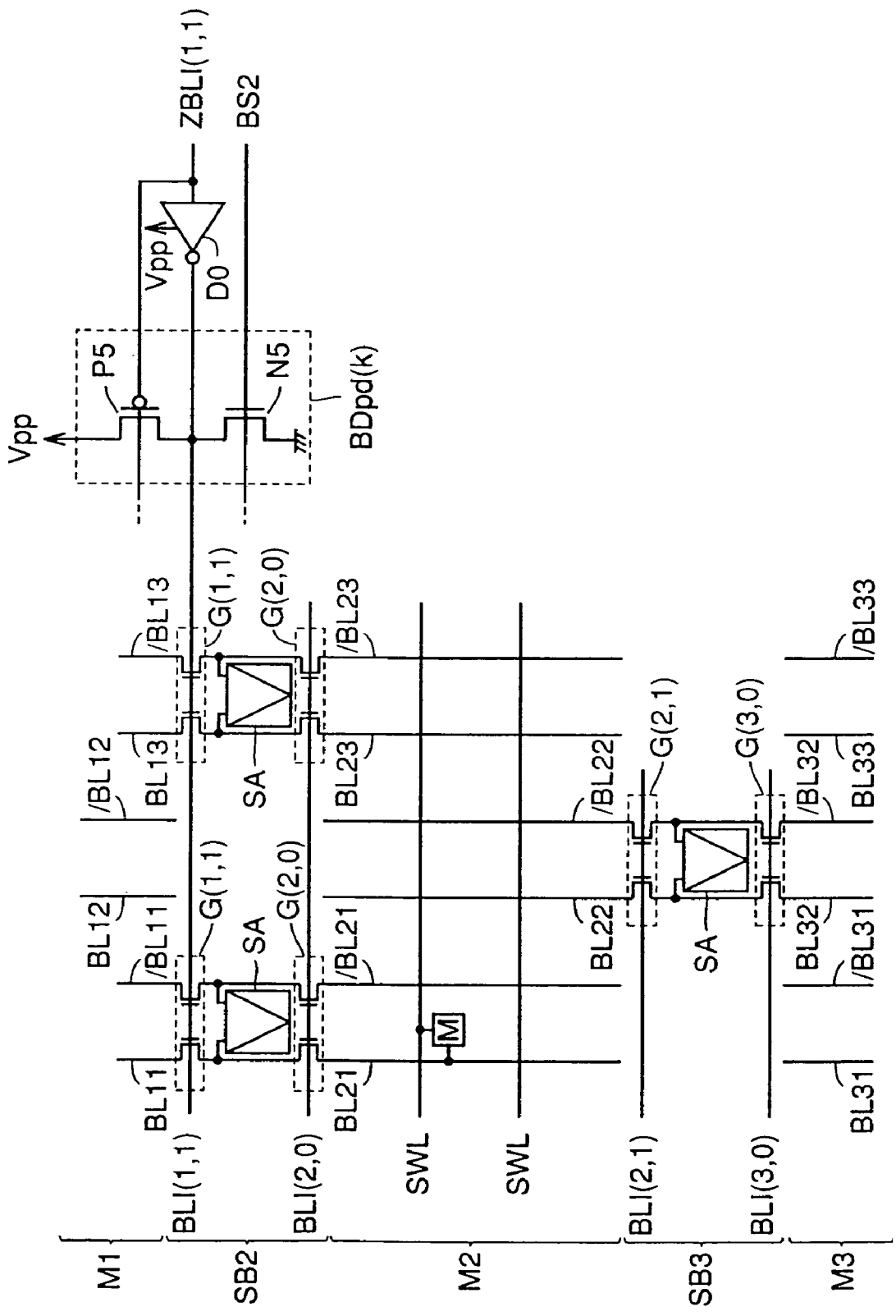
FIG. 9 illustrates the structure of a principal part of a semiconductor device according to a second embodiment of the present invention.

A second embodiment of the present invention is described with reference to another structure related to high-speed driving of gate control signals BLI. According to the second embodiment of the present invention, a local driver BDpd formed by transistors N5 and P5 is arranged in place of the local driver Dpd, as shown in FIG. 9. The transistor N5 is an NMOS transistor, and the transistor P5 is a PMOS transistor. FIG. 9 representatively shows a BLI driver D0 and a local driver BDpd(k) arranged on a BLI wire BLI(1,1).

Figure 10:
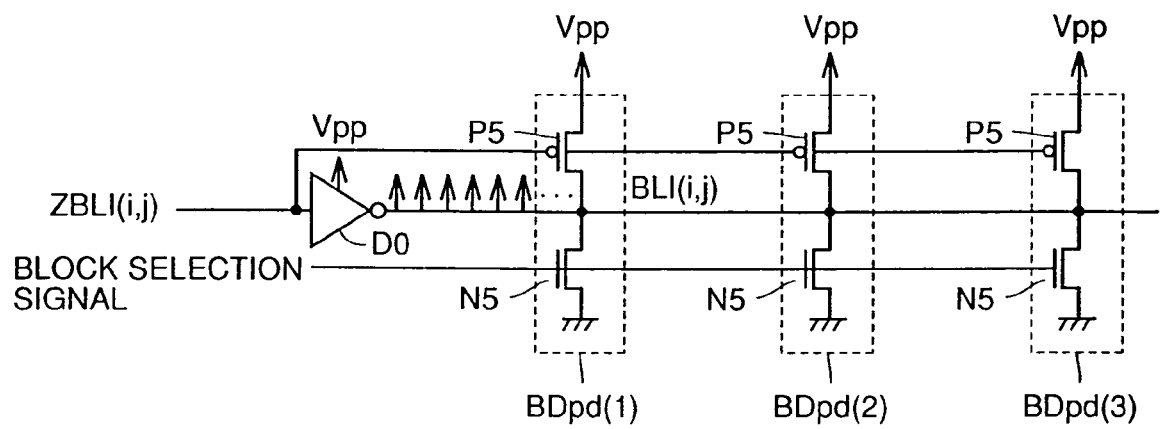
FIG. 10 illustrates connection between a BLI driver and local drivers BDpd on a BLI wire.

As shown in FIG. 10, a BLI driver D0 corresponding to a memory cell block Mi is arranged on an end of a BLI wire BLI(i,j). Local drivers BDpd(1), BDpd(2), BDpd(3), . . . are dispersively arranged along the BLI wire BLI(i,j). The BLI wire BLI(i,j) supplies a gate control signal BLI(i,j) to selection gates G(i,j).

Each transistor P5 is arranged between a step-up power supply voltage Vpp and the BLI wire BLI(i,j), and receives a gate control signal ZBLI(i,j) in its gate. Each transistor N5 is arranged between a ground voltage GND and the BLI wire BLI(i,j), and receives a block selection signal in its gate. More specifically, the transistor N5 receives a block selection signal BSi−1 for selecting a memory cell block Mi−1 in its gate when j=0, while receiving a block selection signal BSi+1 for selecting a memory cell block Mi+1 when j=1.

Figure 11A:
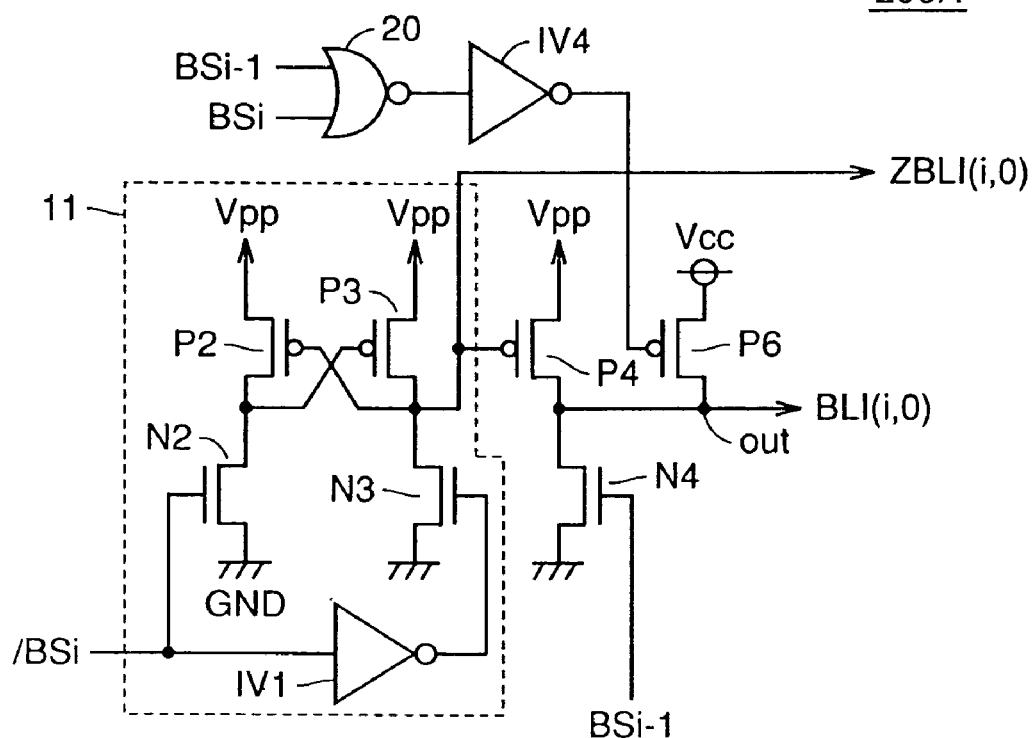
FIGS. 11A and 11B are circuit diagrams for illustrating a BLI generation circuit 200 according to the second embodiment of the present invention.
Figure 11B:
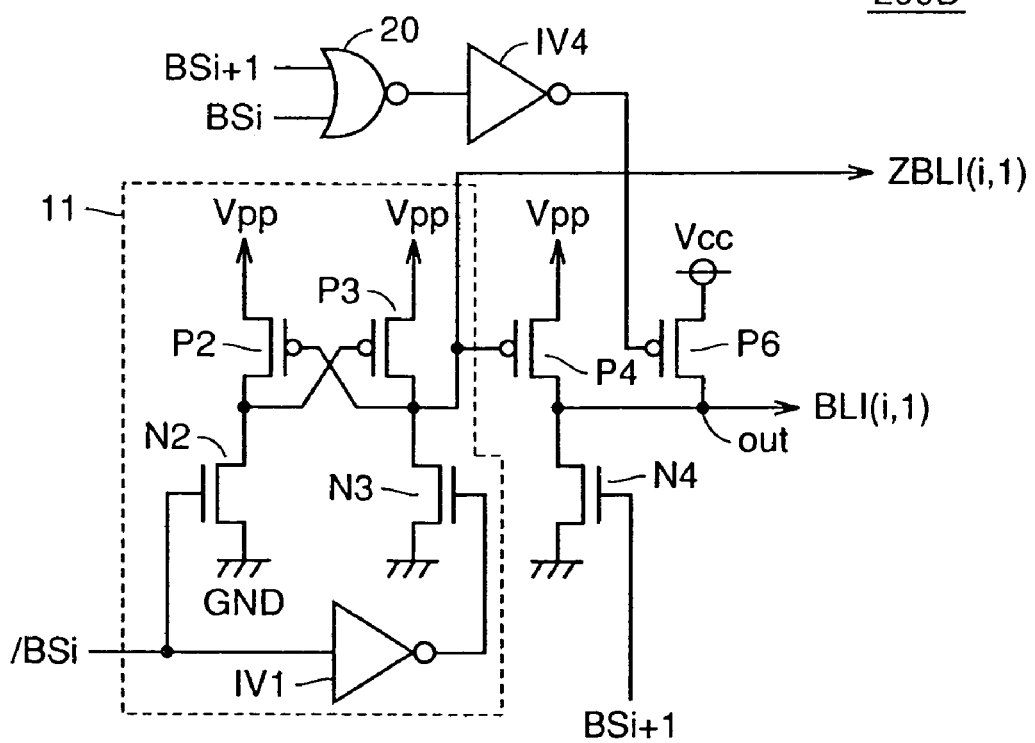

A BLI generation circuit 200 according to the second embodiment of the present invention is described with reference to FIGS. 11A and 11B. The BLI generation circuit 200 corresponding to the memory cell block Mi includes a BLI generation circuit 200A shown in FIG. 11A and a BLI generation circuit 200B shown in FIG. 11B.

The BLI generation circuit 200A for generating gate control signals BLI(i,0) and ZBLI(i,0) includes a NOR circuit 20, an inverter IV4, a level shifter 11 and transistors P4, N4 and P6. The transistor P6 is a PMOS transistor. The BLI generation circuit 200B generating gate control signals BLI(i,1) and ZBLI(i,1) includes a NOR circuit 20, an inverter IV4, a level shifter 11 and transistors P4, N4 and P6. The transistors P4 and N4 form a BLI driver D0.

The NOR circuit 20 receives a block selection signal, and the inverter IV4 inverts an output of the NOR circuit 20. The transistor P6 is connected between an internal power supply voltage Vcc and a node out between the transistors P4 and N4, and receives an output of the inverter IV4 in its gate. The gate of a transistor N2 and an inverter IV1 included in the level shifter 11 receive a block selection signal/BSi (an inverted signal of a block selection signal BSi).

In the BLI generation circuit 200A, the gate of the transistor N4 receives a block selection signal BSi−1, and the NOR circuit 20 receives the block selection signals BSi−1 and BSi. The node out outputs the gate control signal BLI(i,0), and a node between the transistors P3 and N3 outputs the gate control signal ZBLI(i,0).

In the BLI generation circuit 200B, the gate of the transistor N4 receives a block selection signal BSi+1, and the NOR circuit 20 receives the block selection signal BSi+1 and BSi. The node out outputs the gate control signal BLI(i,1), and a node between the transistors P3 and N3 outputs the gate control signal ZBLI(i,1).

When the block selection signals BSi−1 and BSi go low, for example, the gate control signal BLI(i,0) is set to the internal power supply voltage level (level Vcc). When the block selection signals BSi+1 and BSi are low, the gate control signal BLI(i,1) reaches the level Vcc.

The gate control signal BLI(i,0) reaches the level GND when the block selection signal BSi−1 goes high, while the gate control signal BLI(i,1) reaches the level GND when the block selection signal BSi+1 goes high.

When the block selection signal BSi goes high, the gate control signal ZBLI(i,j) reaches the level GND and the gate control signal BLI(i,j) reaches the level Vpp.

According to the second embodiment of the present invention, the BLI driver D0 included in the BLI generation circuit makes the potential of the BLI wire transition while the local driver BDpd pulls up (from the level Vcc to the level Vpp) or pulls down (from the level Vcc to the level GND) the gate control signal BLI at a high speed in an access period after starting an active period. The transistor P6 of the BLI generation circuit returns the gate control signal to the level Vcc after the active period is ended.

Figure 12:
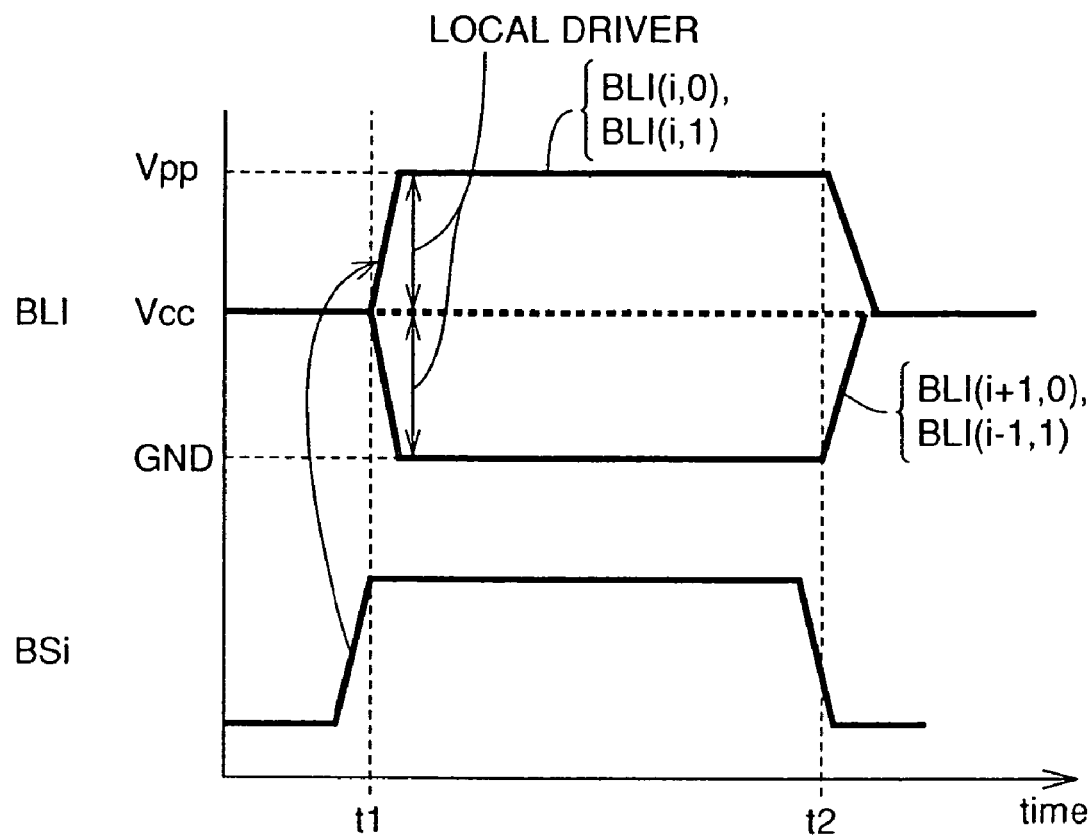
FIG. 12 is a timing chart showing changes of gate control signals according to the second embodiment of the present invention.

Operation timing according to the second embodiment of the present invention is described with reference to FIG. 12. Referring to FIG. 12, symbols BLI(i,0) and BLI(i,1) denote the gate control signals for the selected memory cell block Mi and symbols BLI(i+1,0) and BLI(i−1,1) denote gate control signals controlling coupling between sense amplifier zones coupled with the memory cell block Mi and memory cell blocks Mi+1 and Mi−1 respectively. In a standby state, all gate control signals are at the level Vcc.

The block selection signal BSi goes high and the block selection signals BS−1 and BS+1 go low. The memory cell block Mi is selected (time t1). The gate control signal BLI(i,j) is pulled up from the level Vcc to the level Vpp at a high speed, while the gate control signals BLI(i+1,0) and BLI(i−1,1) are pulled down from the level Vcc to the level GND at a high speed.

The memory cell block Mi is coupled with the sense amplifier zones. The memory cell blocks Mi−1 and Mi+1 are disconnected from the sense amplifier zones shared with the memory cell block Mi.

All gate control signals reach the level Vcc after the active period is ended (time t2).

The following specific effects result from the aforementioned structure and operations: First, the gate control signals BLI are pulled down/up at a higher speed by a high-speed pull-down/up operation of the driver BDpd driven by a ZBLI wire and a block selection signal wire having smaller loads and faster signal transmission as compared with a pull-down/up operation by a driver in the BLI generation circuit.

Second, control is relatively easy in the structure according to the second embodiment of the present invention as compared with the system (see FIG. 7) inserting the repeaters (formed by the inverters IV2 and IV3) into the intermediate positions of the BLI wire. Further, the number of elements to be arranged is small. Therefore, the chip area is reduced.

The operation for pulling up/down the gate control signals BLI requiring high-speed signal transmission is speeded up due to the aforementioned effects, to enable high-speed access. Further, unnecessary area increase can be prevented.

While the above description shows a structure for speeding up three-valued control of the gate control signals, the following structure may alternatively be employed from the point that proper circuit arrangement is decided in relation to power supply.

Another exemplary structure according to the second embodiment of the present invention is described with reference to FIGS. 13A and 13B. In this structure according to the second embodiment of the present invention, local drivers D1 for driving BLI wires to the level Vpp are arranged in place of the local drivers BDpd.

Figure 13A:
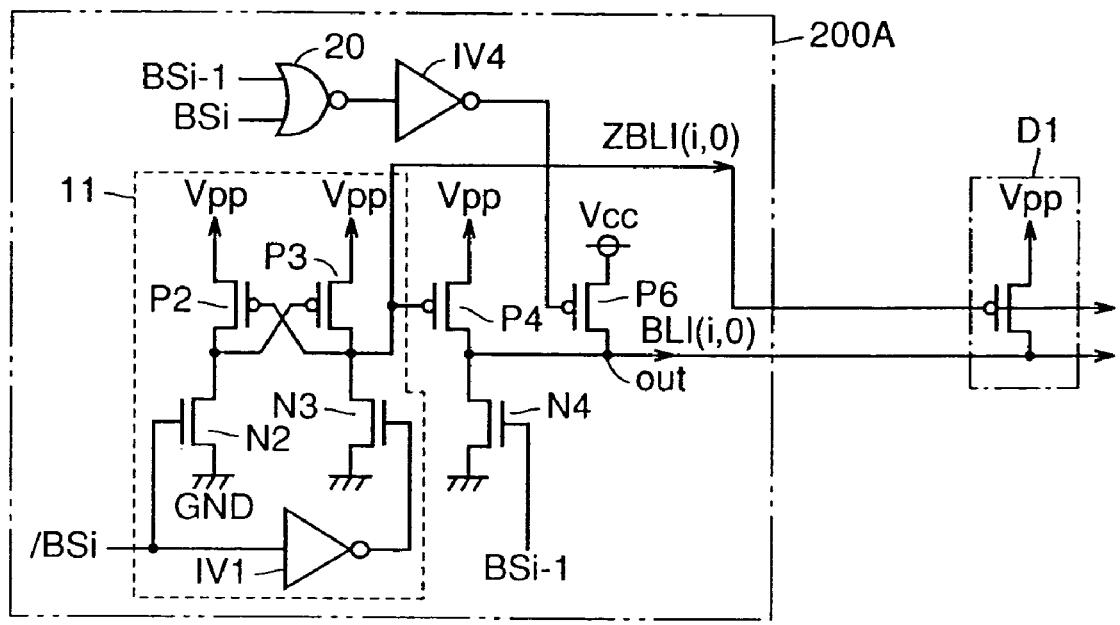
FIGS. 13A and 13B are circuit diagrams showing another exemplary structure of the second embodiment of the present invention.
Figure 13B:
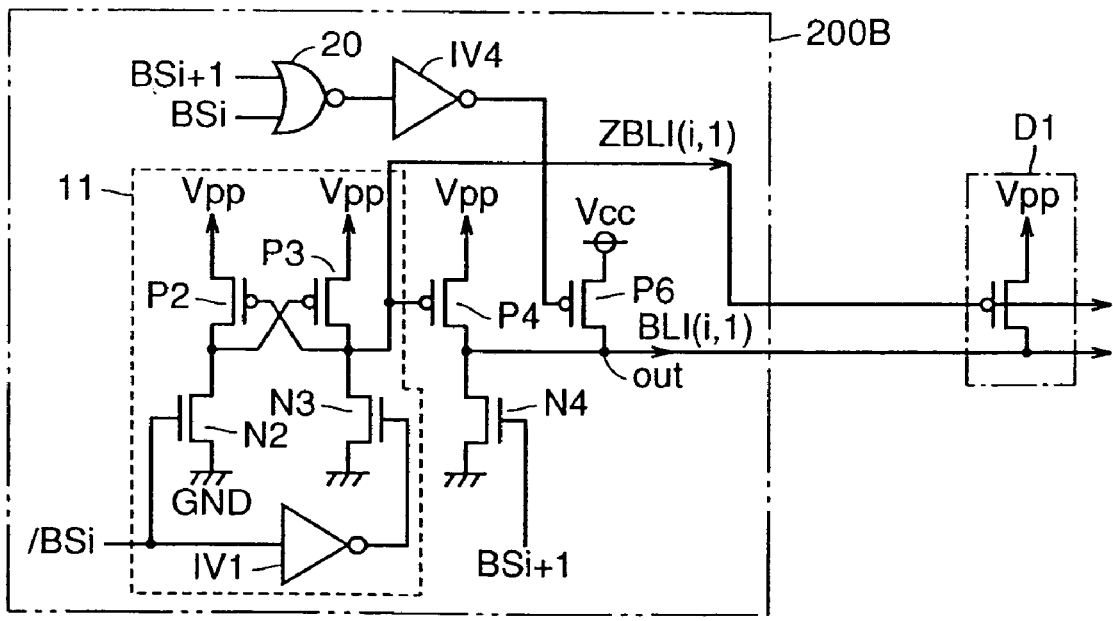

FIG. 13A shows the relation between a BLI generation circuit 200A corresponding to a memory cell block Mi and the local driver D1 arranged on a BLI wire BLI(i,0), and FIG. 13B shows the relation between a BLI generation circuit 200B corresponding to the memory cell block Mi and the local driver D1 arranged on a BLI wire BLI(i,1).

Each local driver D1 is formed by a PMOS transistor connected between a step-up power supply voltage Vpp and the BLI wire BLI(i,j) for receiving a gate control signal ZBLI(i,j) in its gate. A plurality of such local drivers D1 are dispersively arranged along the BLI wire.

Figure 14:
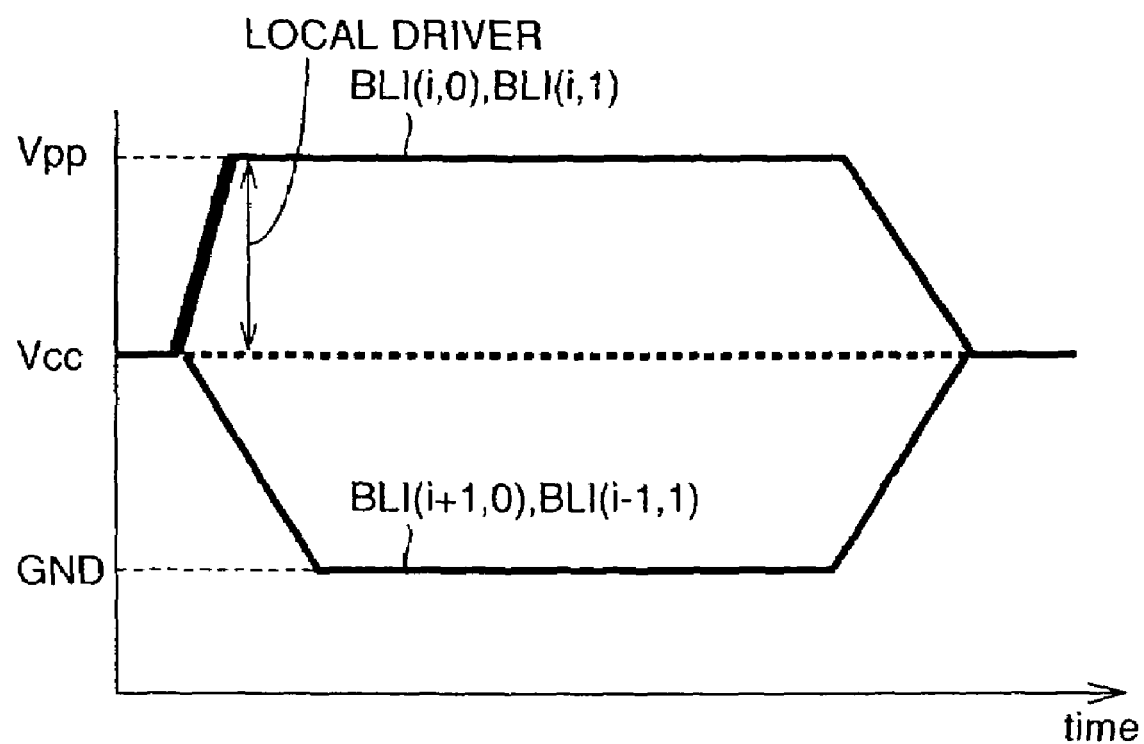
FIG. 14 is a timing chart showing changes of gate control signals in the structure shown in FIGS. 13A and 13B.

Operation timing is described with reference to FIG. 14. Referring to FIG. 14, symbols BLI(i,0) and BLI(i,1) denote gate control signals for the selected memory cell block Mi, and symbols BLI(i+1,0) and BLI(i−1,1) denote gate control signals controlling coupling between sense amplifier zones coupled with the memory cell block Mi and memory cell blocks Mi+1 and Mi−1 respectively. All gate control signals are at the level Vcc in a standby state.

When the memory cell block Mi is selected, the local drivers D1 pull up the gate control signals BLI(i,0) and BLI(i,1) to the level Vpp at a high speed. The BLI generation circuits pull down the gate control signals BLI(i+1,0) and BLI(i−1,1) to the level GND.

When an active period is ended, the BLI generation circuits bring the gate control signals BLI(i,0) and BLI(i,1) from the level Vpp to the level Vcc, while the gate control signals BLI(i+1,0) and BLI(i−1,1) reach the level Vcc from the level GND.

Still another exemplary structure according to the second embodiment of the present invention is described with reference to FIGS. 15A and 15B. In this structure according to the second embodiment of the present invention, local drivers D2 for driving BLI wires to a level Vcc or GND are arranged in place of the local drivers BDpd.

Figure 15A:
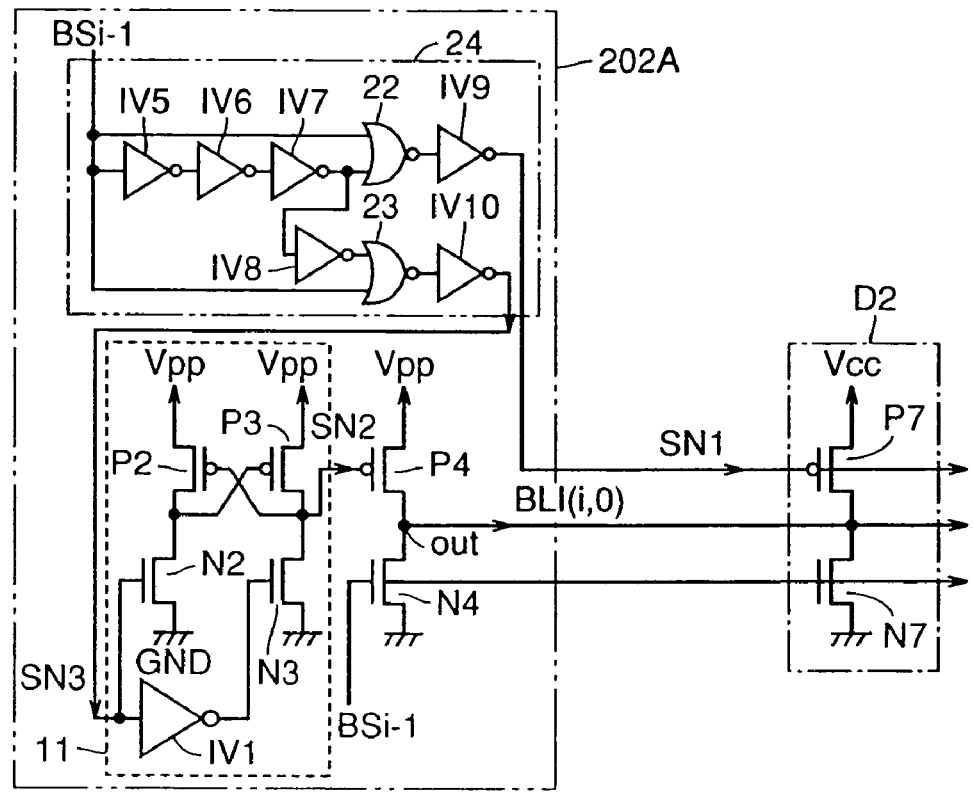
FIGS. 15A and 15B are circuit diagrams showing still another exemplary structure of the second embodiment of the present invention.
Figure 15B:
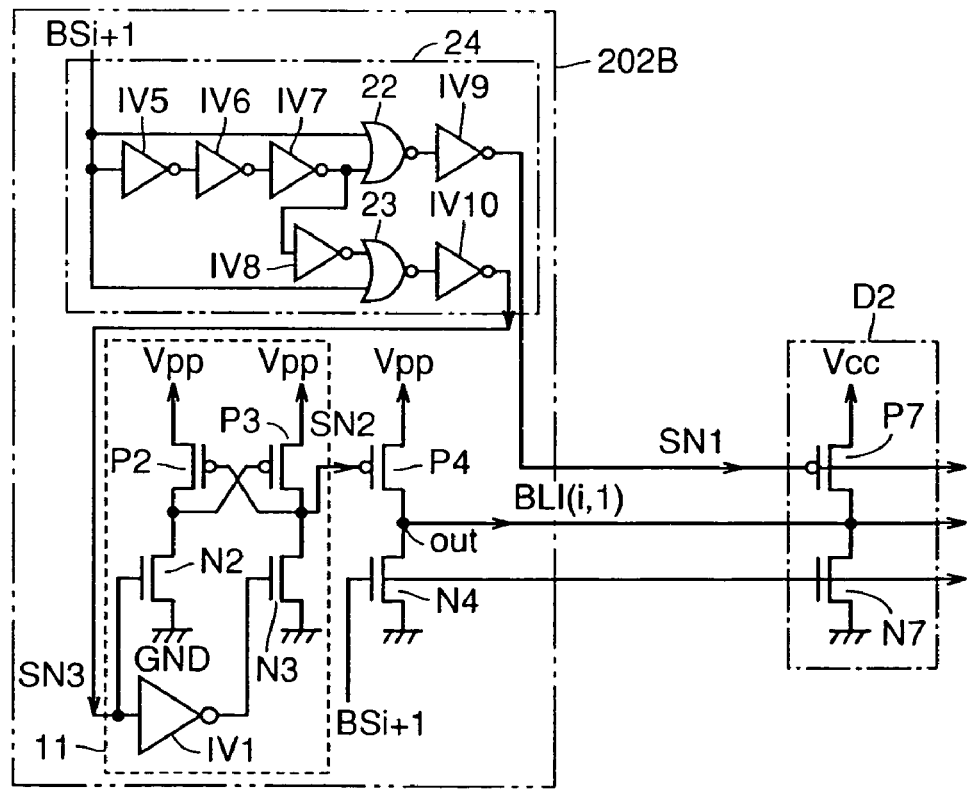

FIG. 15A shows the relation between a BLI generation circuit 202A corresponding to a memory cell block Mi and the local driver D2 arranged on a BLI wire BLI(i,0), and FIG. 15B shows the relation between a BLI generation circuit 202B corresponding to the memory cell block Mi and the local driver D2 arranged on a BLI wire BLI(i,1).

Each local driver D2 is formed by a PMOS transistor P7 connected between an internal power supply voltage Vcc and the BLI wire BLI(i,j) for receiving a signal SN1 output from the BLI generation circuit in its gate and an NMOS transistor N7 connected between the BLI wire BLI(i,j) and a ground voltage GND for receiving a block selection signal in its gate. The transistor N7 arranged on the BLI wire BLI(i,0) receives a block selection signal BSi−1 in its gate, while the transistor N7 arranged on the BLI wire BLI(i,1) receives a block selection signal BSi+1 in its gate. A plurality of such local drivers D2 are dispersively arranged along the BLI wire.

The BLI generation circuit 202A generating a gate control signal BLI(i,0) and the signal SN1 includes a level shifter 11, transistors P4 and N4 and a circuit 24. The BLI generation circuit 202B generating a gate control signal BLI(i,1) and the signal SN1 includes a level shifter 11, transistors P4 and N4 and a circuit 24. Each circuit 24 includes inverters IV5 to IV10 and NOR circuits 22 and 23.

The inverters IV5 to IV8 are serially connected. The NOR circuit 22 receives an output of the inverter IV7 and the block selection signal. The inverter IV9 inverts an output of the NOR circuit 22 and outputs the signal SN1. The NOR circuit 23 receives the block selection signal and an output of the inverter IV8. The inverter IV10 receives an output of the NOR circuit 23 and outputs a signal SN3. The gate of a transistor N2 and an inverter IV1 included in the level shifter 11 receive the signal SN3.

In the BLI generation circuit 202A, the circuit 24 receives the block selection signal BSi−1. The signal SN1 is input in the local driver D2 arranged on the BLI wire BLI(i,0). The gate of the transistor P4 receives a signal SN2 from a node between transistors N3 and P3 included in the level shifter 11. The gate of the transistor N4 receives the block selection signal BSi−1. A node out between the transistors N4 and P4 outputs the gate control signal BLI(i,0).

In the BLI generation circuit 202B, the circuit 24 receives the block selection signal BSi+1. The signal SN1 is input in the local driver D2 arranged on the BLI wire BLI(i,1). The gate of the transistor P4 receives a signal SN2 from a node between transistors N3 and P3 included in the level shifter 11. The gate of the transistor N4 receives the block selection signal BSi+1. A node out between the transistors N4 and P4 outputs the gate control signal BLI(i,1).

Figure 16:
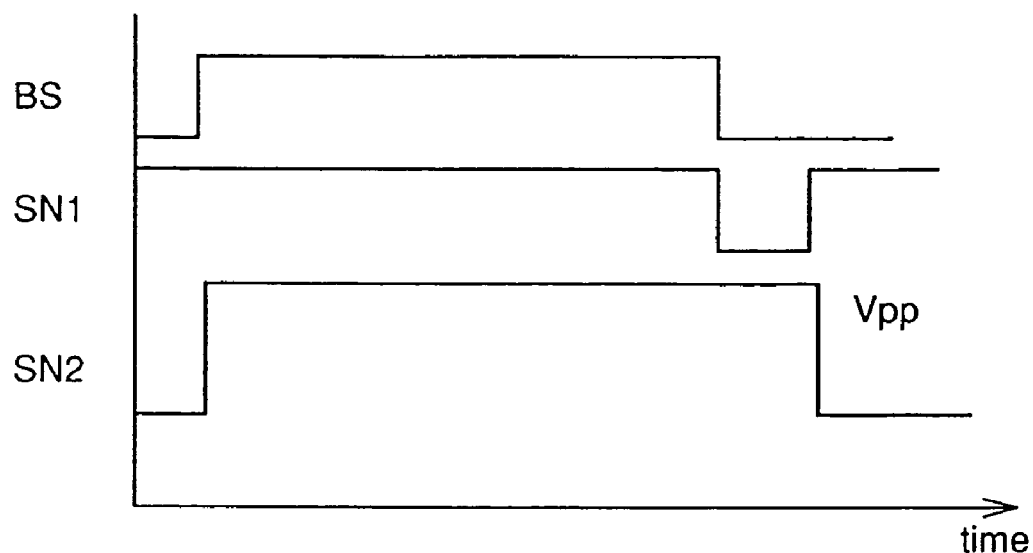
FIG. 16 is a timing chart showing changes of various signals in the structure shown in FIGS. 15A and 15B.

FIG. 16 shows the relation between the operations of the circuit 24 and the level shifter 11. A low-level pulse signal SN1 is output in response to fall of the input block selection signal. The signal SN2 falls from the level Vpp to the level GND on the leading edge of the pulse signal SN1.

Figure 17:
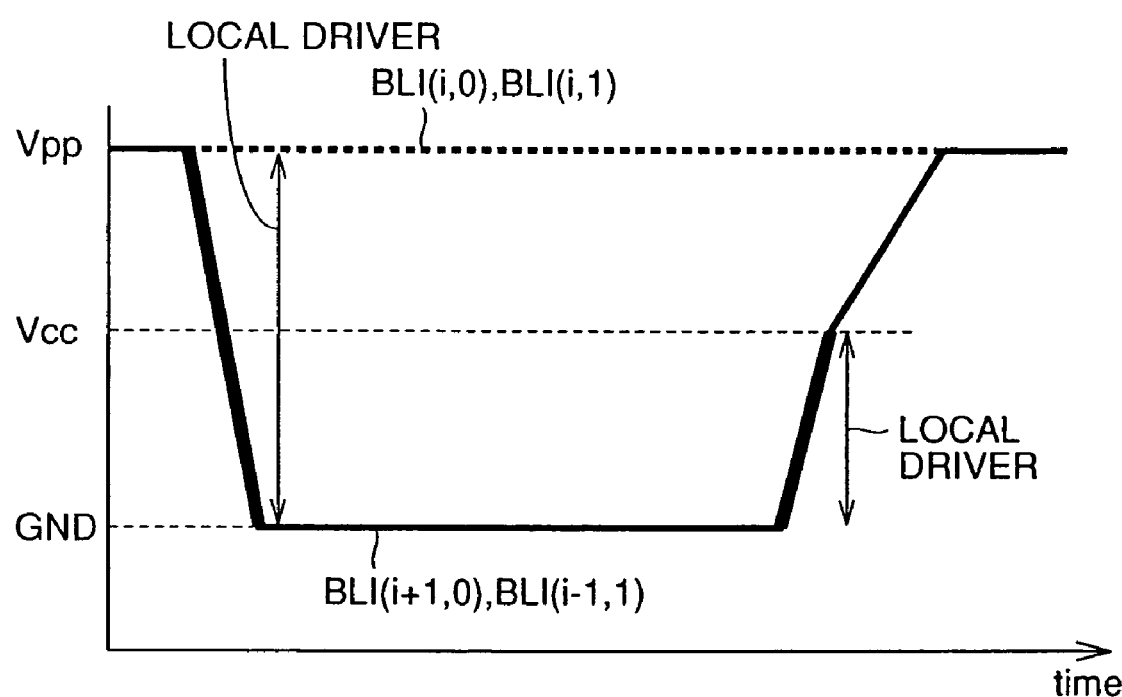
FIG. 17 is a timing chart showing changes of gate control signals in the structure shown in FIGS. 15A and 15B.

Operation timing according to this structure is described with reference to FIG. 17. Referring to FIG. 17, BLI(i,0) and BLI(i,1) denote the gate control signals for the selected memory cell block Mi, and symbols BLI(i+1,0) and BLI(i−1,1) denote gate control signals controlling coupling between sense amplifier zones coupled with the memory cell block Mi and memory cell blocks Mi+1 and Mi−1 respectively. All gate control signals are at the level Vpp in a standby state.

When the memory cell block Mi is selected, the local drivers D2 pull down the gate control signals BLI(i+1,0) and BLI(i−1,1) to the level GND at a high speed.

When an active period is ended, the block selection signal BSi goes low. The gate control signals BLI(i+1,0) and BLI(i−1,1) are pulled down from the level GND to the level Vcc by the local drivers D2 and pulled up from the level Vcc to the level Vpp by the BLI generation circuits.

A further exemplary structure according to the second embodiment of the present invention is described with reference to FIGS. 18A and 18B. In this structure according to the second embodiment of the present invention, local drivers D3 for driving BLI wires to a level Vpp or GND are arranged in place of the local drivers BDpd.

Figure 18A:
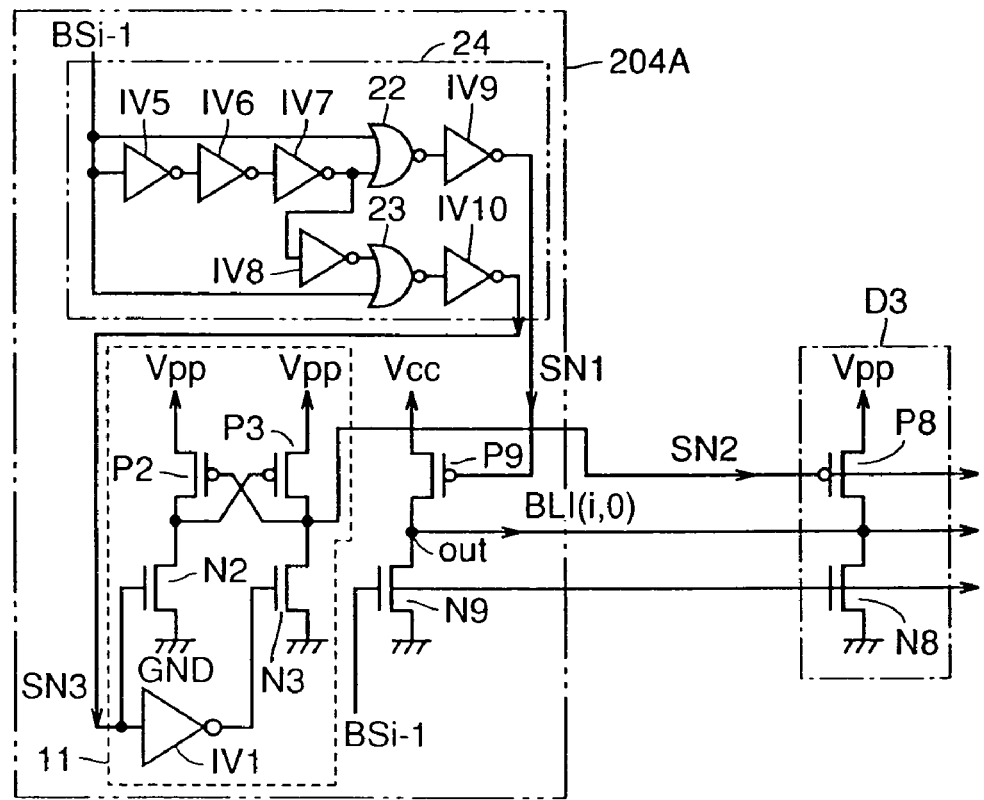
FIGS. 18A and 18B are circuit diagrams showing a further exemplary structure of the second embodiment of the present invention.
Figure 18B:
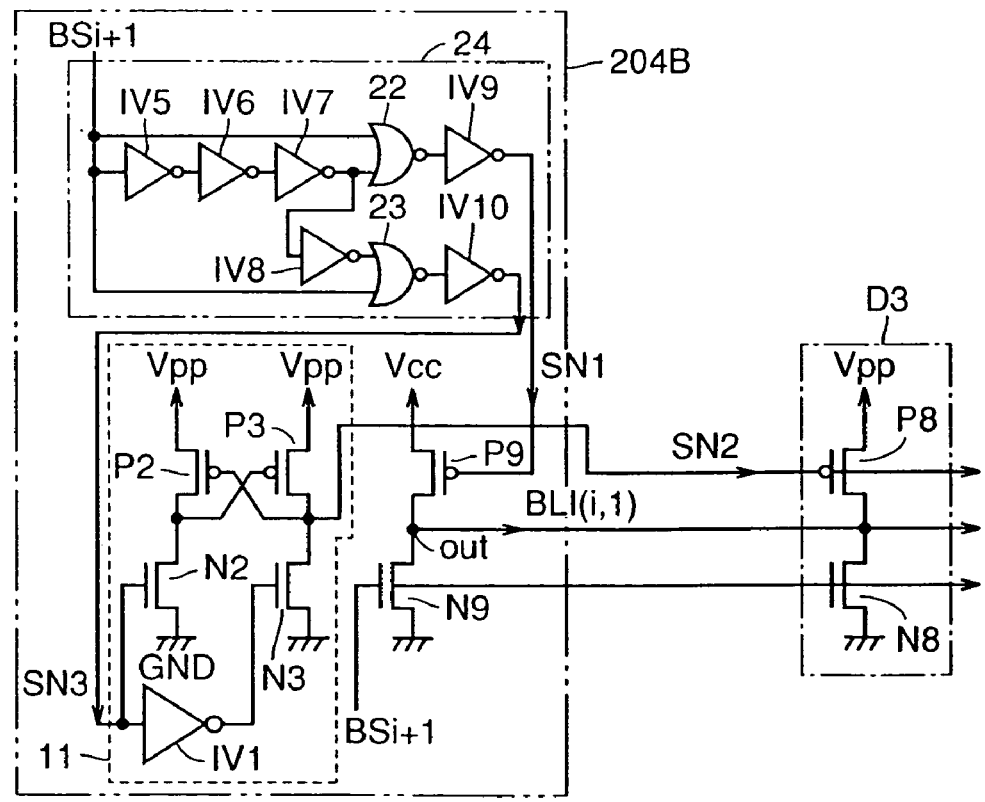

FIG. 18A shows the relation between a BLI generation circuit 204A corresponding to a memory cell block Mi and the local driver D3 arranged on a BLI wire BLI(i,0), and FIG. 18B shows the relation between a BLI generation circuit 204B corresponding to the memory cell block Mi and the local driver D3 arranged on a BLI wire BLI(i,1).

Each local driver D3 is formed by a PMOS transistor P8 connected between a step-up power supply voltage Vpp and the BLI wire BLI(i,j) for receiving a signal SN2 output from the BLI generation circuit in its gate and an NMOS transistor N8 connected between the BLI wire BLI(i,j) and a ground voltage GND for receiving a block selection signal in its gate. The transistor N8 arranged on the BLI wire BLI(i,0) receives a block selection signal BSi−1 in its gate, and the transistor N8 arranged on the BLI wire BLI(i,1) receives a block selection signal BSi+1 in its gate. Such local drivers D3 are dispersively arranged on the BLI wire.

The BLI generation circuit 204A generating the gate control signal BLI(i,0) and the signal SN2 includes a level shifter 11, transistors P9 and N9 and a circuit 24. The BLI generation circuit 204B generating the gate control signal BLI(i,1) and the signal SN2 includes a level shifter 11, transistors P9 and N9 and a circuit 24. Each transistor P9 is a PMOS transistor, and each transistor N9 is an NMOS transistor.

The transistors P9 and N9 are connected between the internal power supply voltage Vcc and the ground voltage GND. The gate of the transistor P9 receives a signal SN1 output from an inverter IV9 included in the circuit 24, and the gate of the transistor N9 receives the block selection signal.

In the BLI generation circuit 204A, the circuit 24 and the gate of the transistor N9 receive the block selection signal BSi−1. A node out between the transistors N9 and P9 outputs the gate control signal BLI(i,0). The signal SN2 output from a node between transistors N3 and P3 is input in the local driver D3 arranged on the BLI wire BLI(i,0).

In the BLI generation circuit 204B, the circuit 24 and the gate of the transistor N9 receive the block selection signal BSi+1. A node out between the transistors N9 and P9 outputs the gate control signal BLI(i,1). The signal SN2 output from a node between transistors N3 and P3 is input in the local driver D3 arranged on the BLI wire BLI(i,1).

Figure 19:
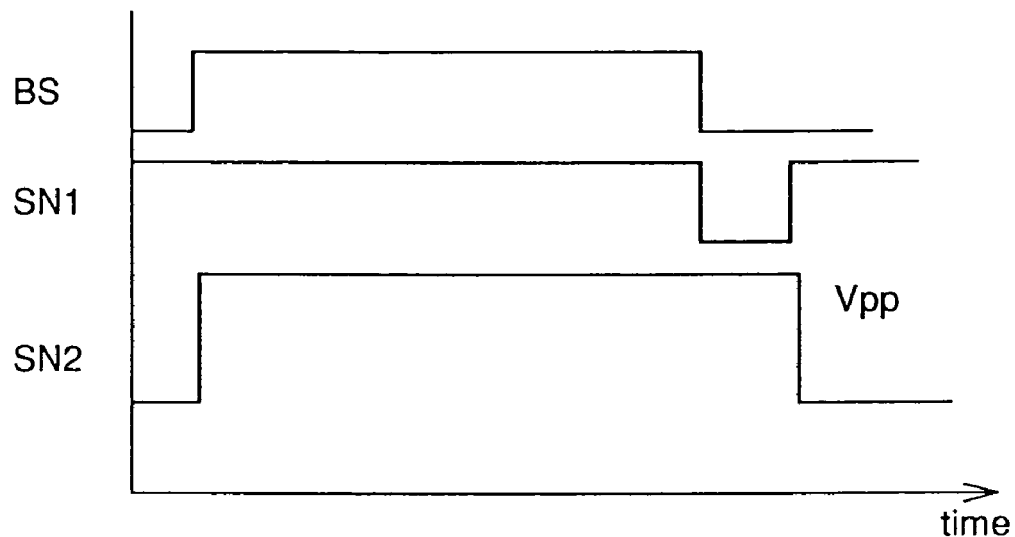
FIG. 19 is a timing chart showing changes of various signals in the structure shown in FIGS. 18A and 18B.

FIG. 19 shows the relation between the operations of the circuit 24 and the level shifter 11. A low-level pulse signal SN1 is output in response to fall of the input block selection signal. The signal SN2 falls from the level Vpp to the level GND on the leading edge of the pulse signal SN1.

Figure 20:
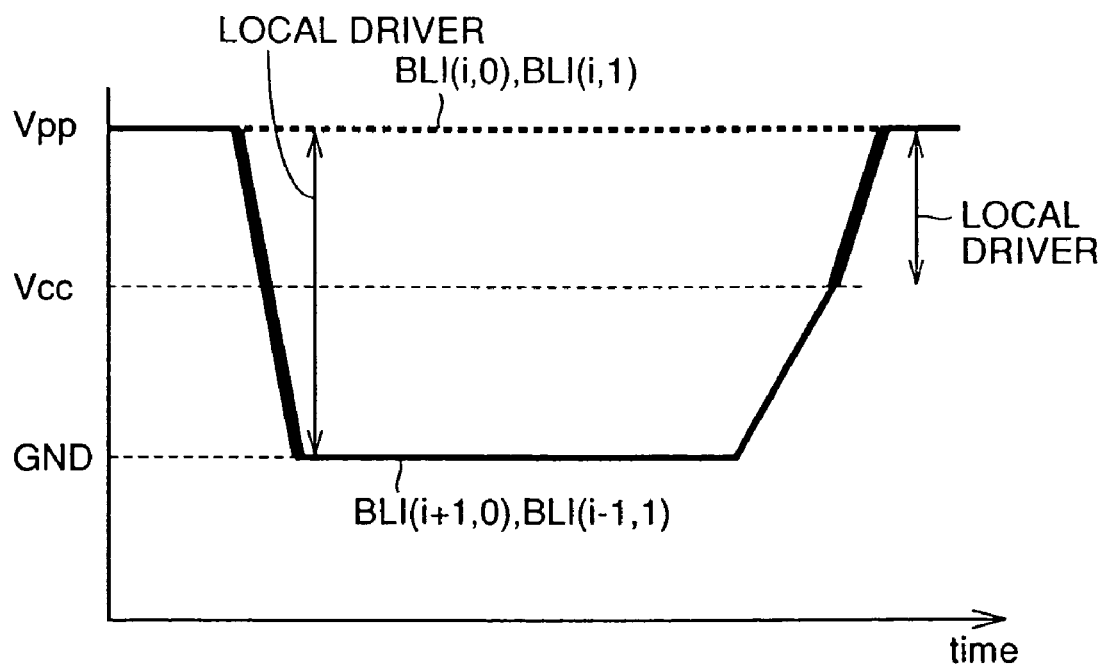
FIG. 20 is a timing chart showing changes of gate control signals in the structure shown in FIGS. 18A and 18B.

Operation timing according to this structure is described with reference to FIG. 20. Referring to FIG. 19, symbols BLI(i,0) and BLI(i,1) denote the gate control signals for the selected memory cell block Mi, and symbols BLI(i+1,0) and BLI(i−1,0) denote gate control signals controlling coupling between sense amplifier zones coupled with the memory cell block Mi and memory cell blocks Mi+1 and Mi−1 respectively. All gate control signals are at the level Vpp in a standby state.

When the memory cell block Mi is selected, the local drivers D3 pull down the gate control signals BLI(i+1,0) and BLI(i−1,1) from the level Vpp to the level GND at a high speed.

When an active period is ended, the block selection signal BSi goes low. The gate control signals BLI(i+1,0) and BLI (i−1,1) are pulled up from the level GND to the level Vcc by the BLI generation circuits and pulled up from the level Vcc to the level Vpp by the local drivers D3.

Third Embodiment

Figure 21A:
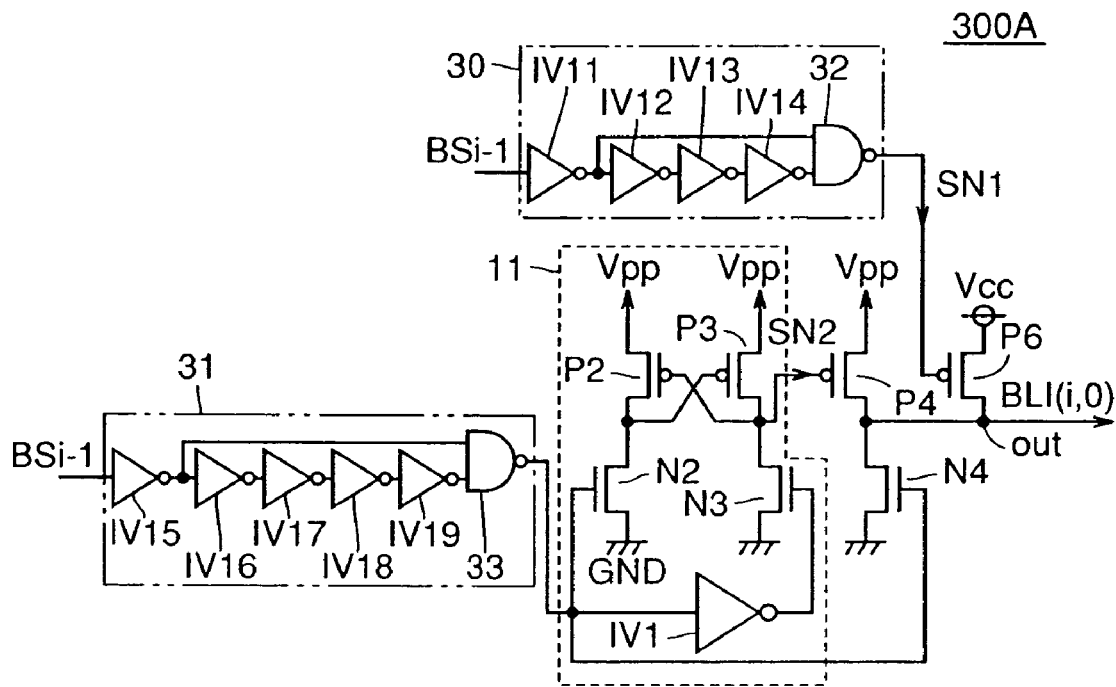
FIGS. 21A and 21B are circuit diagrams for illustrating a BLI generation circuit 300.
Figure 21B:
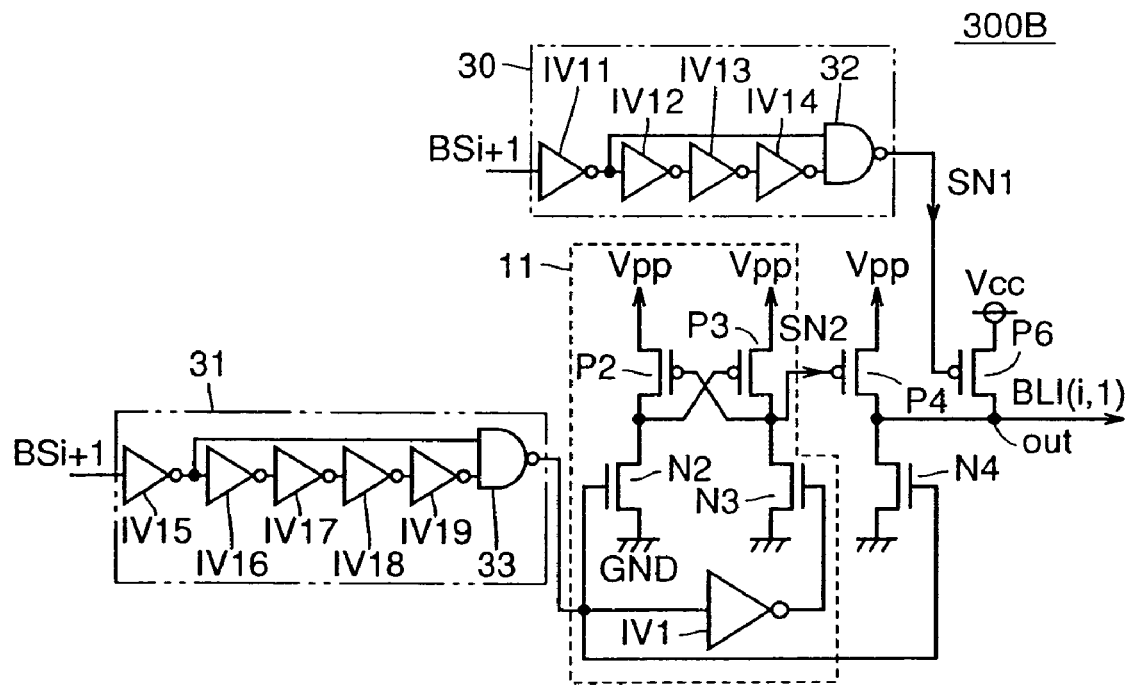

A third embodiment of the present invention is described with reference to driving of gate control signals by NMOS transistors. An exemplary BLI generation circuit 300 making gate control signals between a level GND, a level Vcc and a level Vpp is described with reference to FIGS. 21A and 21B. The BLI generation circuit 300 corresponding to a memory cell block Mi includes a BLI generation circuit 300A shown in FIG. 21A and a BLI generation circuit 300B shown in FIG. 21B.

The BLI generation circuit 300A generating a gate control signal BLI(i,0) includes pulse generation circuits 30 and 31, a level shifter 11 and transistors P4, N4 and P6. The BLI generation circuit 300B generating a gate control signal BLI(i,1) includes pulse generation circuits 30 and 31, a level shifter 11 and transistors P4, N4 and P6.

Each pulse generation circuit 30 includes inverters IV11 to IV14 and a NAND circuit 32. The inverters IV11 to IV14 are serially connected, and the NAND circuit 32 receives outputs of the inverters IV11 and IV4 for outputting a signal SN1.

Each pulse generation circuit 31 includes inverters IV15 to IV19 and a NAND circuit 33. The inverters IV15 to IV19 are serially connected, and the NAND circuit 33 receives outputs of the inverters IV15 and IV19.

The gate of a transistor N2 and an inverter IV1 included in the level shifter 11 receive an output of the pulse generation circuit 31. A node between transistors P3 and N3 outputs a signal SN2.

The transistors P4 and N4 are connected between a step-up power supply voltage Vpp and a ground voltage GND, for outputting the gate control signal BLI from a node out therebetween. The gate of the transistor P4 receives the signal SN2, and the gate of the transistor N4 receives the output of the pulse generation circuit 31. The transistor P6 is connected between an internal power supply voltage Vcc and the node out between the transistors N4 and P4, and receives the signal SN1 in its gate.

In the BLI generation circuit 300A, the pulse generation circuits 30 and 31 receive a block selection signal BSi−1 in the inputs thereof, and the node out outputs the gate control signal BLI(i,0). In the BLI generation circuit 300B, the pulse generation circuits 30 and 31 receive a block selection signal BSi+L in the inputs thereof, and the node out outputs the gate control signal BLI(i,1).

Figure 22:
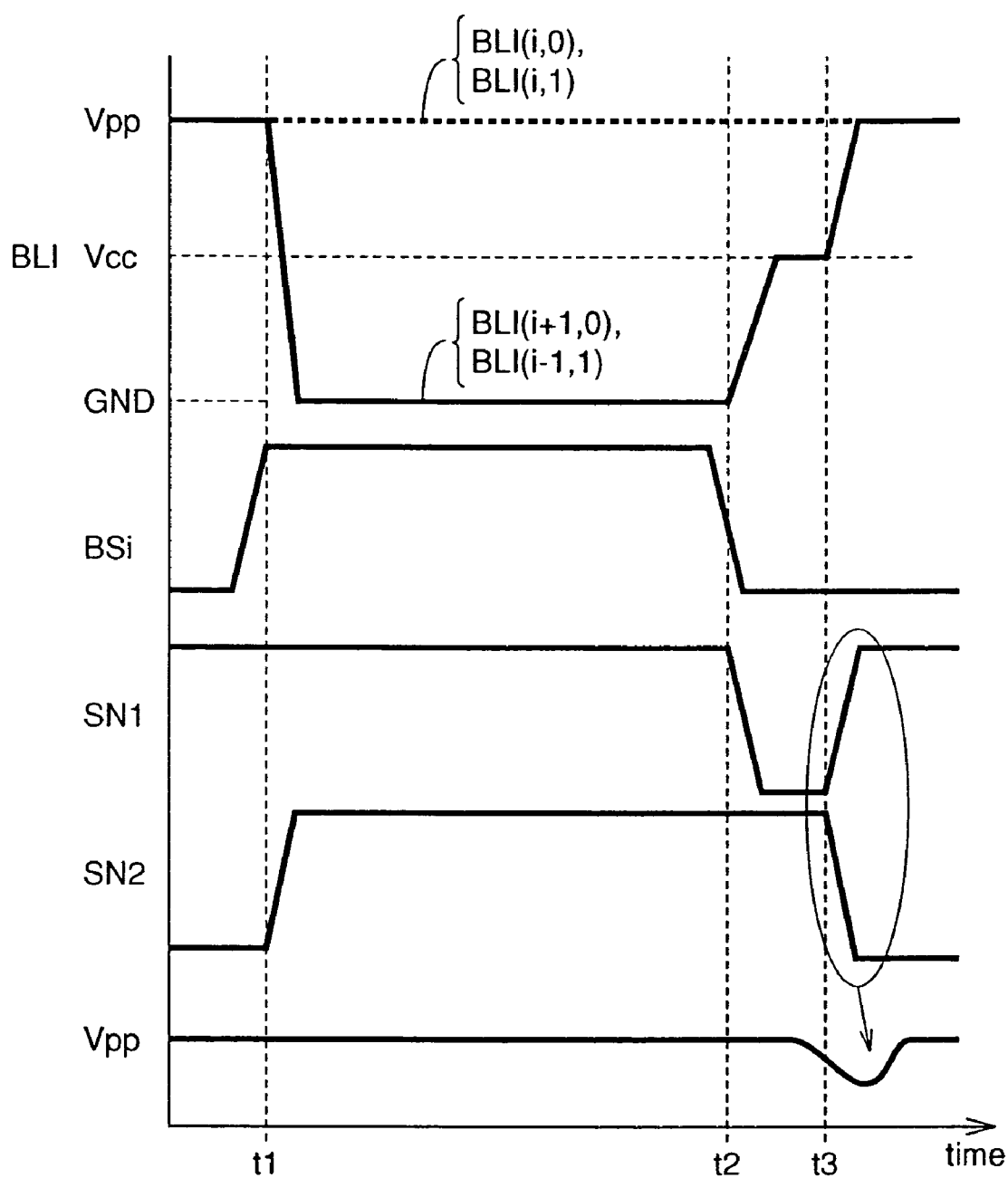
FIG. 22 is a timing chart showing changes of gate control signals by the BLI generation circuit 300.

On the basis of the BLI generation circuit 300, the gate control signals change as shown in FIG. 22. Referring to FIG. 22, symbols BLI(i,0) and BLI(i,1) denote the gate control signals for the selected memory cell block Mi, and symbols BLI(i+1,0) and BLI(i+1,1) denote gate control signals controlling coupling between sense amplifier zones coupled with the memory cell block Mi and memory cell blocks Mi+1 and Mi−1 respectively. All gate control signals are at the level Vpp in a standby state.

When the memory cell block Mi is selected (time t1), the block selection signal BSi goes high. The gate control signals BLI(i+1,0) and BLI(i−1,0) reach the level GND.

When an active period is ended and the block selection signal BSi goes low (time t2), signals SN1 of BLI generation circuits corresponding to the memory cell blocks Mi−1 and Mi+1 go low. Transistors P6 are turned on and the gate control signals BLI(i+1,0) and BLI(i−1,1) reach the level Vcc from the level GND. Transistors P4 are turned on thereby pulling up the gate control signals BLI(i+1,0) and BLI(i−1,1) to the level Vpp (time t3).

When pulling up the gate control signals BLI from the level GND to the level Vpp, a one-shot signal of the level GND is supplied to the gates of the PMOS transistors P6 and the PMOS transistors P4 are then turned on. Thus, the gate control signal BLI transition from the level GND to the level Vpp through the level Vcc.

In the aforementioned structure, however, the gates of the PMOS transistors must be supplied with a one-shot pulse of a time π in the pull-up operation and hence the circuit structure is complicated. When the timings (pull-up start timings) for turning on the transistors P4 and P6 are displaced, leakage takes place from the step-up power supply voltage Vpp to the internal power supply voltage Vcc. This results in such inconvenience that the level Vpp is lowered.

Figure 23A:
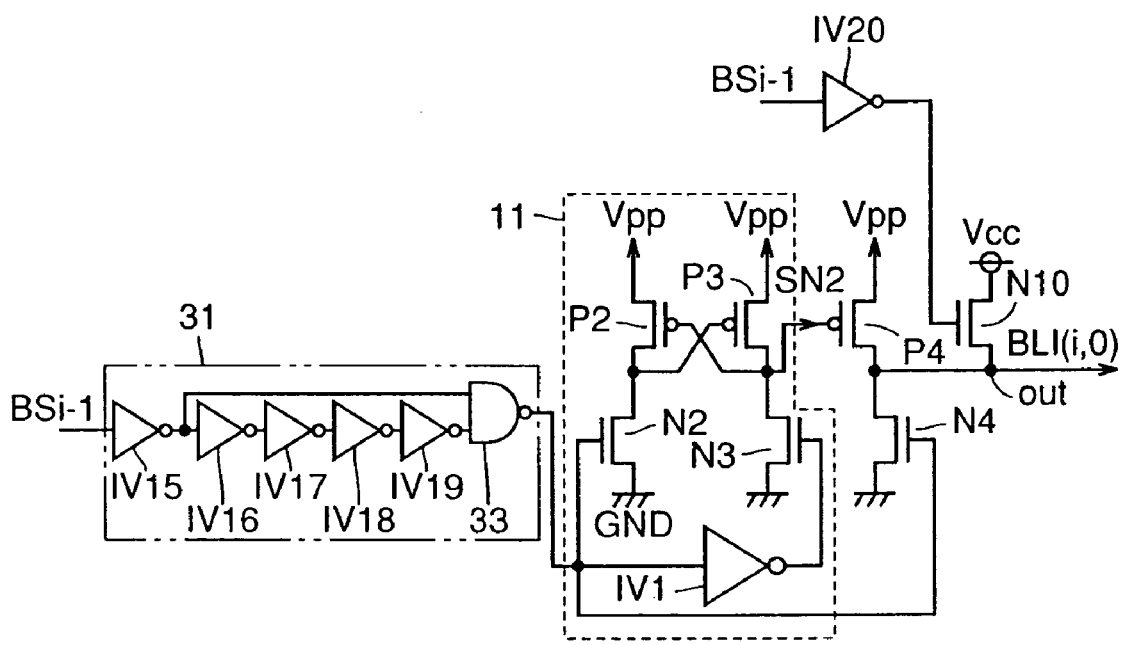
FIGS. 23A and 23B are circuit diagrams for illustrating a BLI generation circuit 305 according to a third embodiment of the present invention.
Figure 23B:
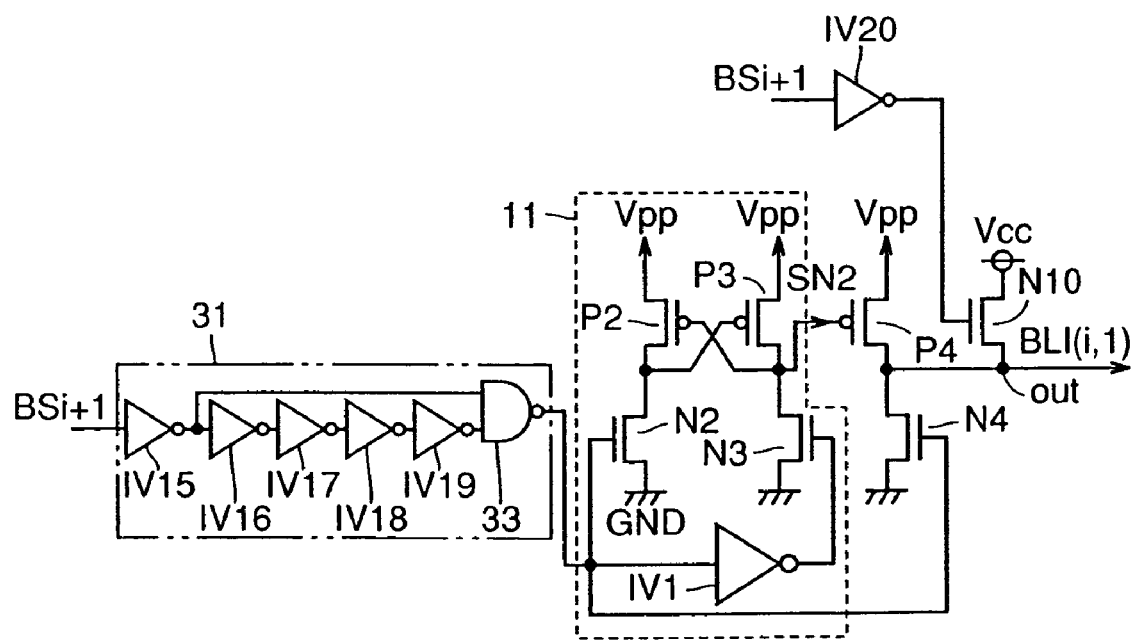

According to the third embodiment of the present invention, gate control signals are subjected to two-valued control by a BLI generation circuit 305 described below. The BLI generation circuit 305 is described with reference to FIGS. 23A and 23B. The BLI generation circuit 305 corresponding to a memory cell block Mi includes a BLI generation circuit 305A shown in FIG. 23A and a BLI generation circuit 305B shown in FIG. 23B.

The BLI generation circuit 305A generates a gate control signal BLI(i,0), and the BLI generation circuit 305B generates a gate control signal BLI(i,1). Each of the BLI generation circuits 305A and 305B includes a pulse generation circuit 31, an inverter IV20, a level shifter 11 and transistors P4, N4 and N10. The transistor N10 is an NMOS transistor connected between a node out between the transistors P4 and N4 and an internal power supply voltage Vcc for receiving an output of the inverter IV20 in its gate.

The inverter IV20 of the BLI generation circuit 305A receives a block selection signal BSi−1, while the inverter IV20 of the BLI generation circuit 305B receives a block selection signal BSi+1.

The node out of the BLI generation circuit 305A outputs the gate control signal BLI(i,0), and the node out of the BLI generation circuit 305B outputs the gate control signal BLI(i,1).

Figure 24:
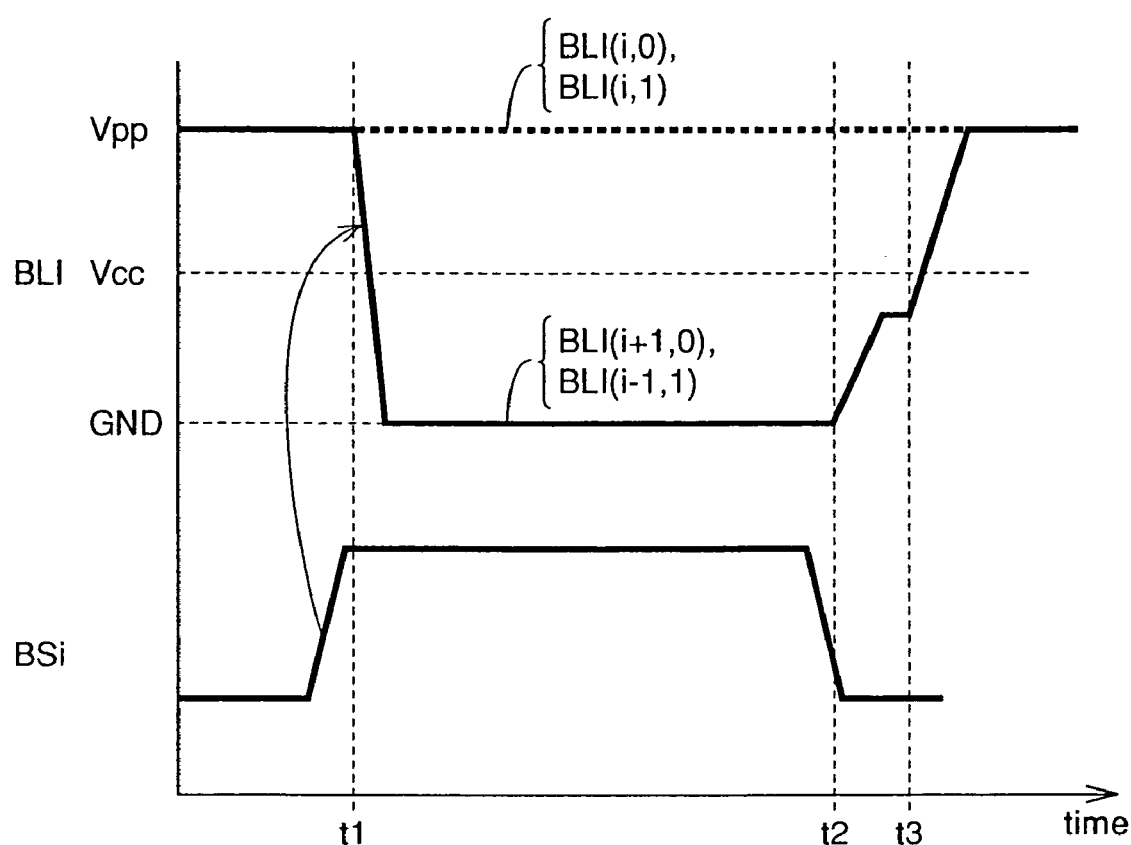
FIG. 24 is a timing chart showing changes of gate control signals by the BLI generation circuit 305.

On the basis of the BLI generation circuit 305, the gate control signals change as shown in FIG. 24. Referring to FIG. 24, symbols BLI(i,0) and BLI(i,1) denote the gate control signals for the selected memory cell blocks Mi, and symbols BLI(i+1,0) and BLI(i−1,1) denote gate control signals controlling coupling between sense amplifier zones coupled with the memory cell block Mi and memory cell blocks Mi+1 and Mi−1 respectively. All gate control signals are at the level Vpp in a standby state.

When the memory cell block Mi is selected (time t1), the block selection signal BSi goes high and the gate control signals BLI(i+1,0) and BLI(i−1,1) reach the level GND.

When an active period is ended and the block selection signal BSi goes low (time t2), the inverters IV20 output high-level signals. The transistors N10 are turned on and the gate control signals BLI(i+1,0) and BLI(i−1,1) reach a level around the level Vcc. The transistors P4 receiving low-level signals SN2 pull up the gate control signals BLI(i+1,0) and BLI(i−1,1) to the level Vpp from the level around the level Vcc.

During the pull-up operation period for the gate control signals BLI, the potentials of the gates of the NMOS transistors N10 are set to the level Vcc for pulling up the potentials of the gate control signals BLI to a level in the vicinity of Vcc−Vth (Vth: threshold). Thereafter the PMOS transistors P4 start pull-up operations to the level Vpp while keeping the potentials of the gates of the transistors N10 at the level Vcc. At this time, the transistors N10 are automatically turned off. Also when keeping the potentials of the gates of the transistors N10 at the level Vcc (without employing a one-shot pulse signal as a signal input in the gates), therefore, the potentials of the gate control signals BLI can be pulled up to the Vpp with no hindrance.

Consequently, a problem such as fatigue of the level Vpp caused by displacement of timings for turning on/off the transistors is solved for stabilizing the pull-up operation. Further, the BLI generation circuit 305 can be more simplified in circuit structure as compared with the BLI generation circuit 300.

In addition, channel hot carrier reliability is improved by employing NMOS transistors. The term "channel hot carrier reliability" indicates threshold change or change of a drain-to-source current Ids resulting from hot carriers caused on channels of MOS transistors. The channel hot carrier reliability strongly depends on a source-to-gate voltage Vsg (the degree of change is increased as the voltage Vsg is increased). Therefore, a gate potential changes when starting turning on the gate, and reaches the strictest state under bias conditions of a time when a drain voltage is not yet changed. Thus, the channel hot carrier reliability tends to remarkably lower when a signal amplitude is high (e.g., Vpp amplitude) and the so-called fan-out is large on a circuit portion required to drive a large load capacitance. This phenomenon remarkably appears in a PMOS transistor, and more remarkable in a surface channel transistor than an embedded transistor in particular.

A PMOS transistor having a gate made of P-type polysilicon or metal serves as a surface channel transistor. Such surface channel PMOS transistors are widely used in the future. When the PMOS transistors P6 are formed by surface channel transistors, therefore, the threshold voltage may conceivably change when the gates thereof are turned on to cause defects.

In the structure according to the third embodiment of the present invention, the NMOS transistors N10 are so employed as not to cause such a problem but to implement stable operations.

Fourth Embodiment

Figure 25A:
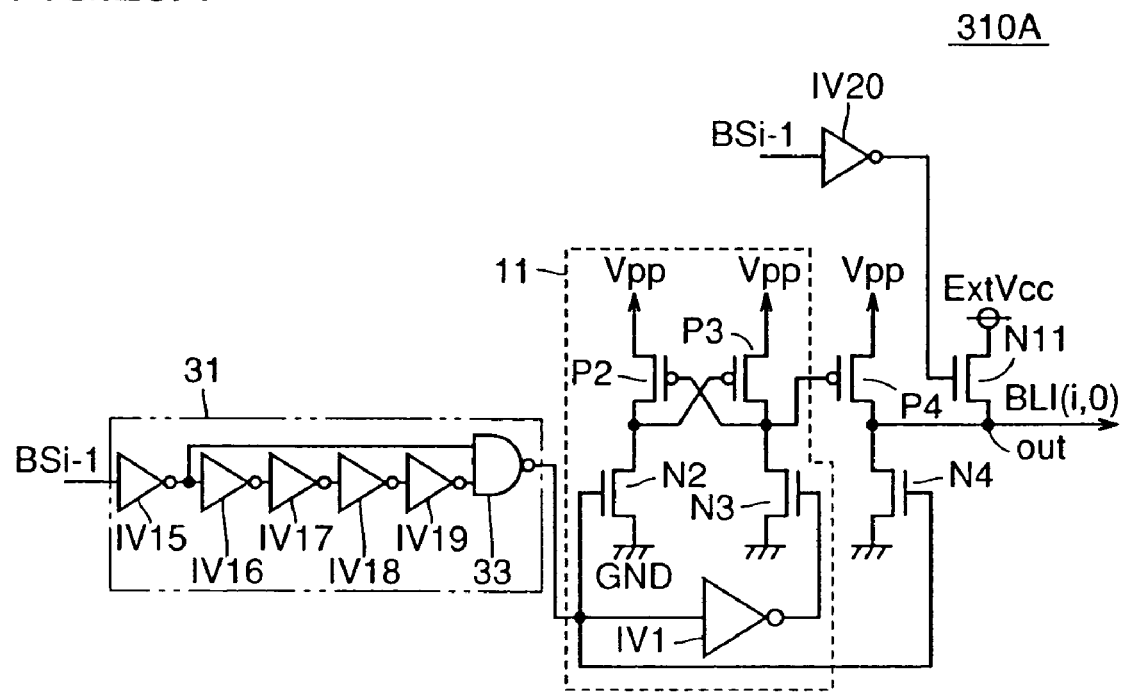
FIGS. 25A and 25B are circuit diagrams for illustrating a BLI generation circuit 310 according to a fourth embodiment of the present invention.
Figure 25B:
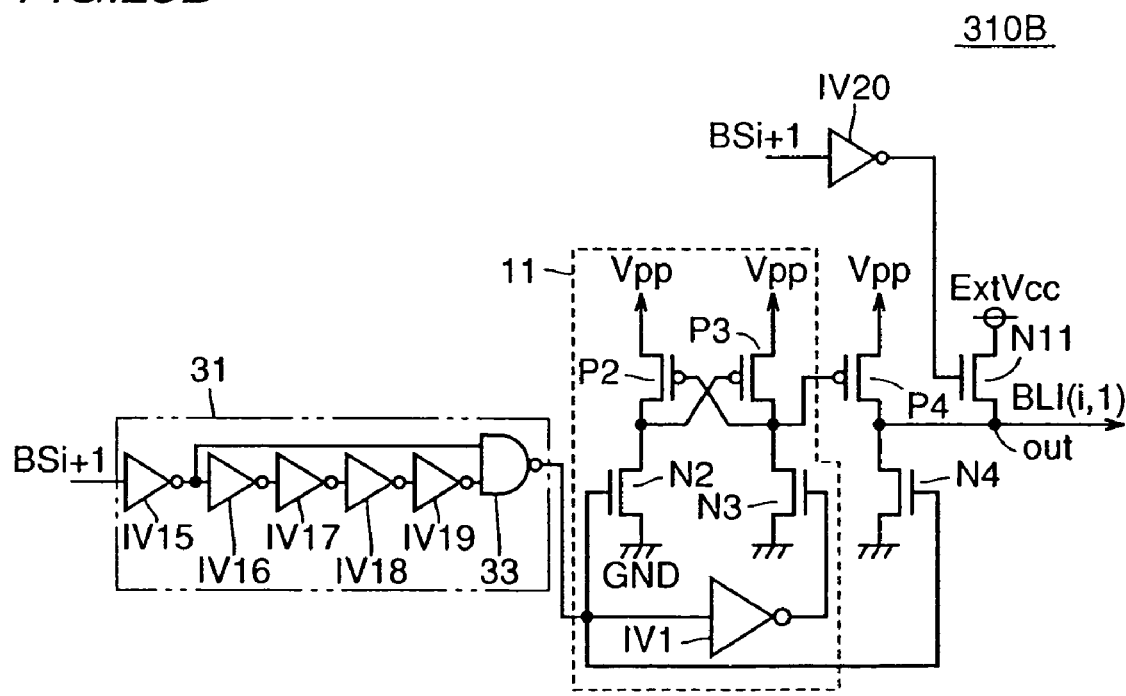

A fourth embodiment of the present invention is described with reference to a structure for driving gate control signals BLI with an external power supply voltage. An exemplary structure according to the fourth embodiment of the present invention is described with reference to FIGS. 25A, 25B and 26. A BLI generation circuit 310 according to the fourth embodiment of the present invention includes a BLI generation circuit 310A shown in FIG. 25A and a BLI generation circuit 310B shown in FIG. 25B.

The BLI generation circuit 310A generates a gate control signal BLI(i,0), and the BLI generation circuit 310B generates a gate control signal BLI(i,1). Each of the BLI generation circuits 310A and 310B includes a pulse generation circuit 31, an inverter IV20, a level shifter 11 and transistors P4, N4 and N11. The transistor N11 is an NMOS transistor connected between a node out of the transistors N4 and P4 and an external power supply voltage ExtVcc for receiving an output of the inverter IV20 in its gate. As described above, an internal power supply voltage Vcc is 2.0 V, the external power supply voltage Vcc is 3.3 V and a step-up power supply voltage Vpp is 3.5 V.

Figure 26:
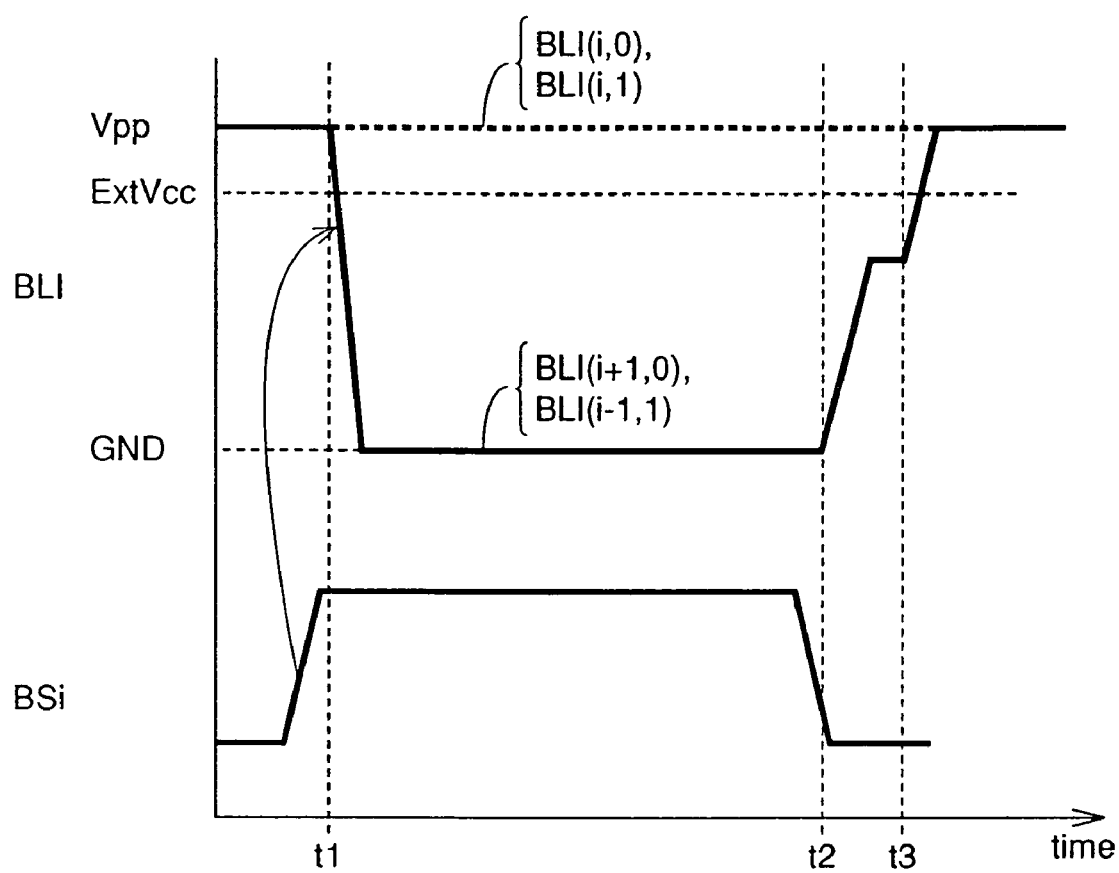
FIG. 26 is a timing chart showing changes of gate control signals by the BLI generation circuit 310.

On the basis of the BLI generation circuit 310, the gate control signals change as shown in FIG. 26. Referring to FIG. 26, symbols BLI(i,0) and BLI(i,1) denote the gate control signals for a selected memory cell block Mi, and symbols BLI(i+1,0) and BLI(i−1,1) denote gate control signals controlling coupling between sense amplifier zones coupled with the memory cell block Mi and memory cell blocks Mi+1 and Mi−1 respectively.

All gate control signals are at the level Vpp in a standby state.

When the memory cell block Mi is selected (time t1), a block selection signal BSi goes high and the gate control signals BLI(i+1,0) and BLI(i−1,1) reach a ground voltage level GND.

When an active period is ended and the block selection signal BSi goes low (time t2), the transistors N11 are turned on and the gate control signals BLI(i+1,0) and BLI(i−1,1) reach a level around the level ExtVcc. Further, the transistors P4 pull up the gate control signals BLI(i+1,0) and BLI(i−1,1) from the level around the level ExtVcc to the level Vpp (time t3).

Another exemplary structure according to the fourth embodiment of the present invention is described with reference to FIGS. 27A, 27B and 28.

Figure 27A:
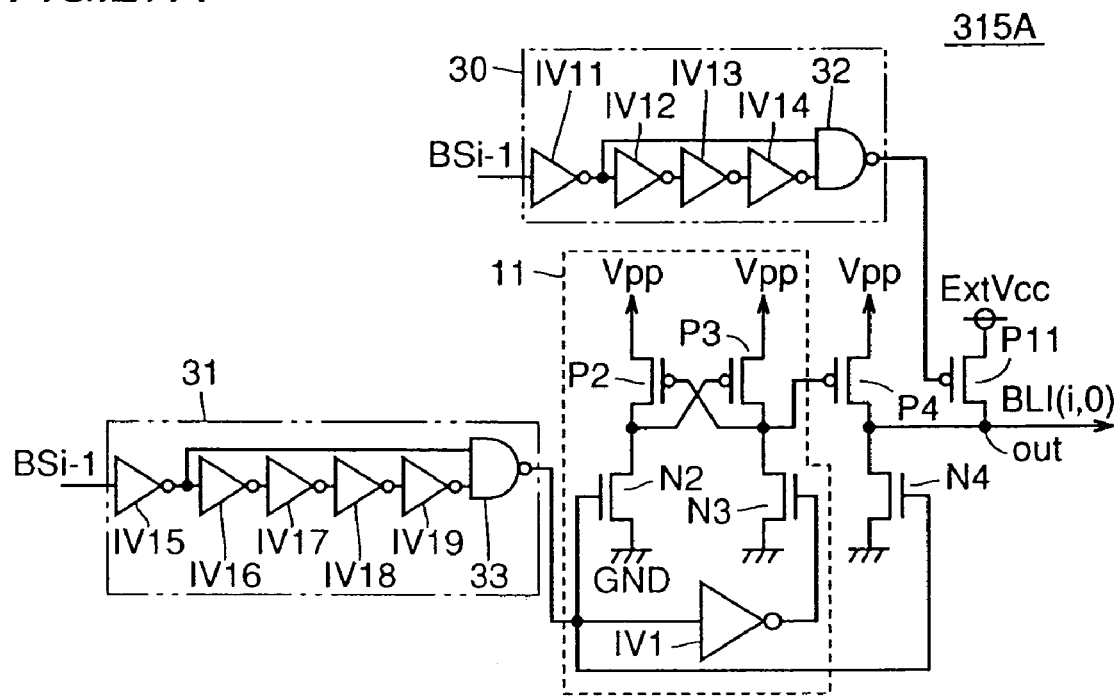
FIGS. 27A and 27B are circuit diagrams for illustrating another BLI generation circuit 315 according to the fourth embodiment of the present invention.
Figure 27B:
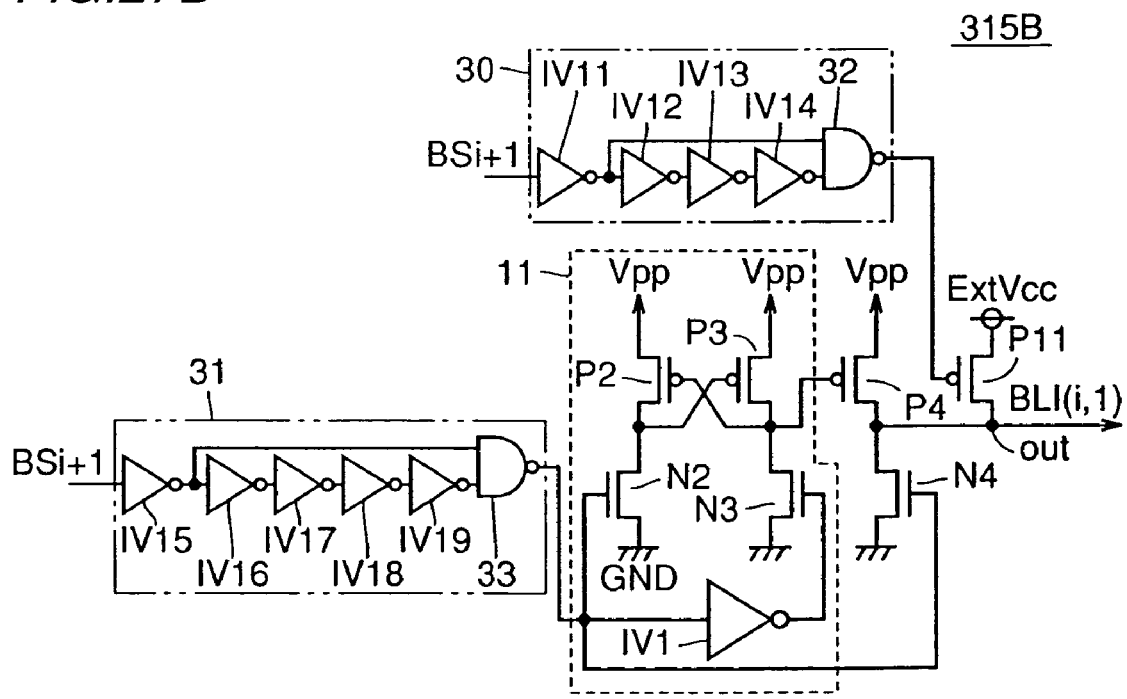

A BLI generation circuit 315 according to this structure includes a BLI generation circuit 315A shown in FIG. 27A and a BLI generation circuit 315B shown in FIG. 27B.

The BLI generation circuit 315A generates a gate control signal BLI(i,0), and the BLI generation circuit 315B generates a gate control signal BLI(i, 1). Each of the BLI generation circuits 315A and 315B includes pulse generation circuits 30 and 31, a level shifter 11 and transistors P4, N4 and P11. The transistor P11 is a PMOS transistor connected between a node out of the transistors P4 and N4 and an external power supply voltage ExtVcc for receiving an output of the pulse generation circuit 30 in its gate.

Figure 28:
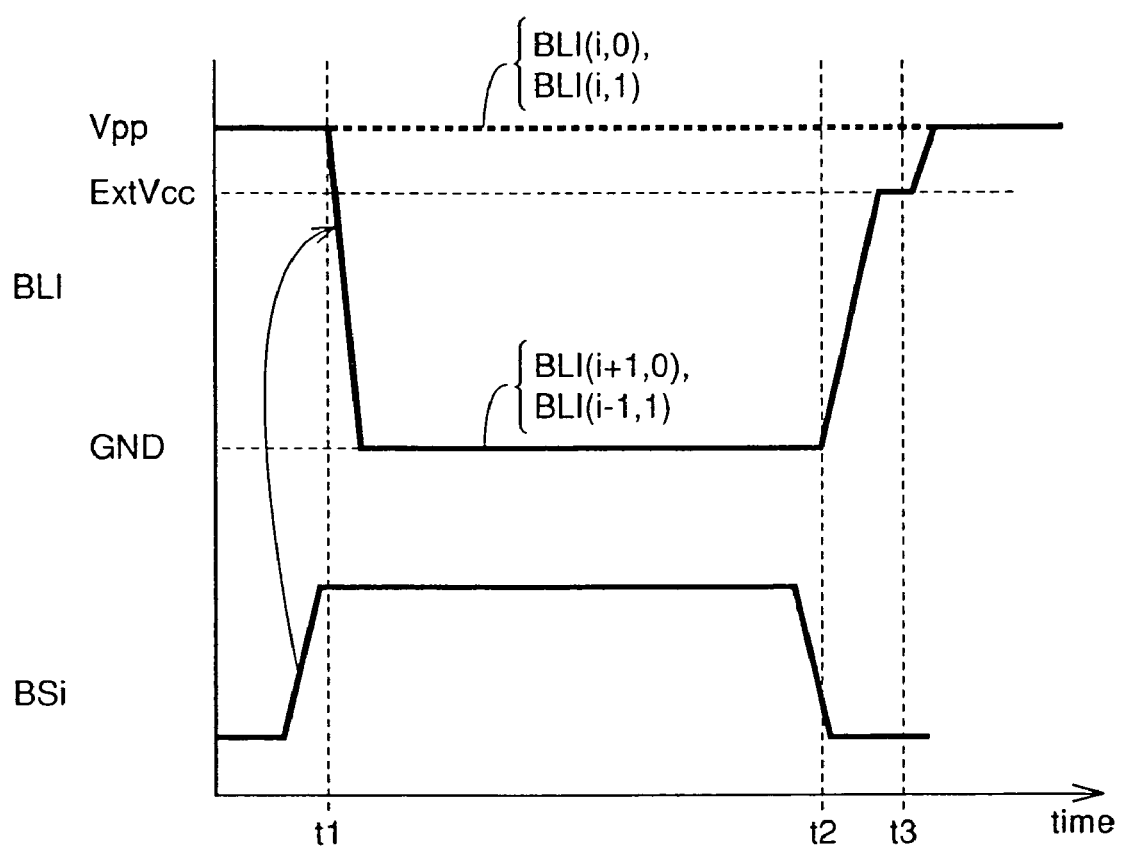
FIG. 28 is a timing chart showing changes of gate control signals by the BLI generation circuit 315.

On the basis of the BLI generation circuit 315, the gate control signals change as shown in FIG. 28. Referring to FIG. 28, symbols BLI(i,0) and BLI(i,1) denote the gate control signals for a selected memory cell block Mi, and symbols BLI(i+1,0) and BLI(i−1,1) denote gate control signals controlling coupling between sense amplifier zones coupled with the memory cell block Mi and memory cell blocks Mi+1 and Mi−1 respectively. All gate control signals are at a level Vpp in a standby state.

When the memory cell block Mi is selected (time t1), a block selection signal BSi goes high. The gate control signals BLI(i+1,0) and BLI(i−1,1) are pulled down from the level Vpp to a level GND.

When an active period is ended and the block selection signal BSi goes low (time t2), the gate control signals BLI(i+1,0) and BLI(i−1,1) are pulled up from the level GND to the level ExtVcc by the transistors P11 and further pulled up from the level ExtVcc to the level Vpp by the transistors P4 (time t3).

Figure 29A:
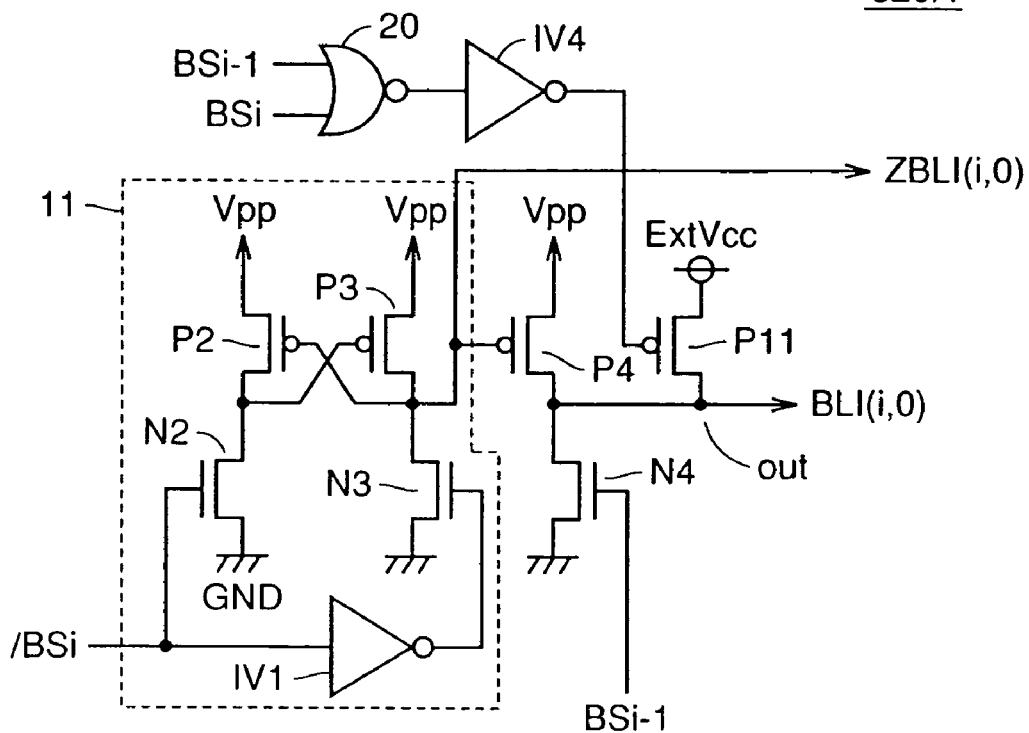
FIGS. 29A and 29B are circuit diagrams for illustrating still another BLI generation circuit 320 according to the fourth embodiment of the present invention.
Figure 29B:
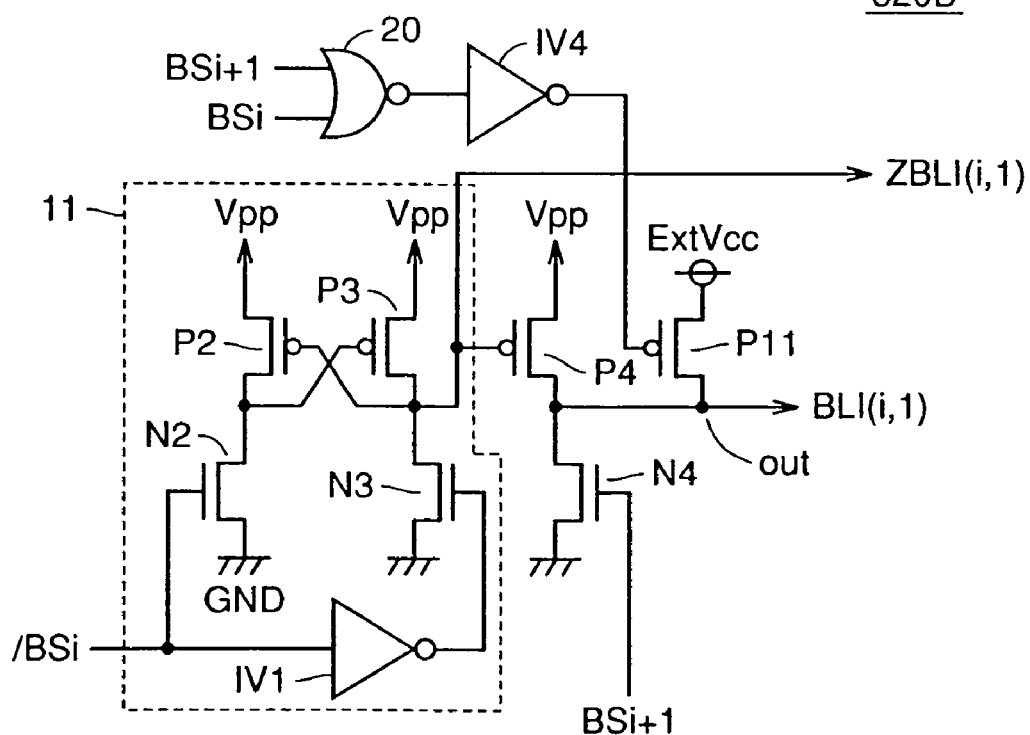

Still another exemplary structure according to the fourth embodiment of the present invention is described with reference to FIGS. 29A, 29B and 30. A BLI generation circuit 320 according to this structure includes a BLI generation circuit 320A shown in FIG. 29A and a BLI generation circuit 320B shown in FIG. 29B.

The BLI generation circuit 320A generates a gate control signal BLI(i,0), and the BLI generation circuit 320B generates a gate control signal BLI(i,1). Each of the BLI generation circuits 320A and 320B includes a NOR circuit 20, an inverter IV4, a level shifter 11 and transistors P4, N4 and P11. The transistor P11 is connected between a node out of the transistors P4 and N4 and an external power supply voltage ExtVcc for receiving an output of the inverter IV4 in its gate. The inverter IV4 inverts an output of the NOR circuit 20. The gate of a transistor N2 and an inverter IV1 included in the level shifter 11 receive a block selection signal /BSi.

In the BLI generation circuit 320A, the NOR circuit 20 receives block selection signals BSi and BSi−1. The gate of the transistor N4 receives the block selection signal BSi−1. The node out outputs the gate control signal BLI(i,0), and a node between transistors N3 and P3 outputs a gate control signal ZBLI(i,0).

In the BLI generation circuit 320B, the NOR circuit 20 receives block selection signals BSi and BSi+1. The gate of the transistor N4 receives the block selection signal BSi+1. The node out outputs the gate control signal BLI(i,1), and a node between transistors N3 and P3 outputs a gate control signal ZBLI(i,1).

Figure 30:
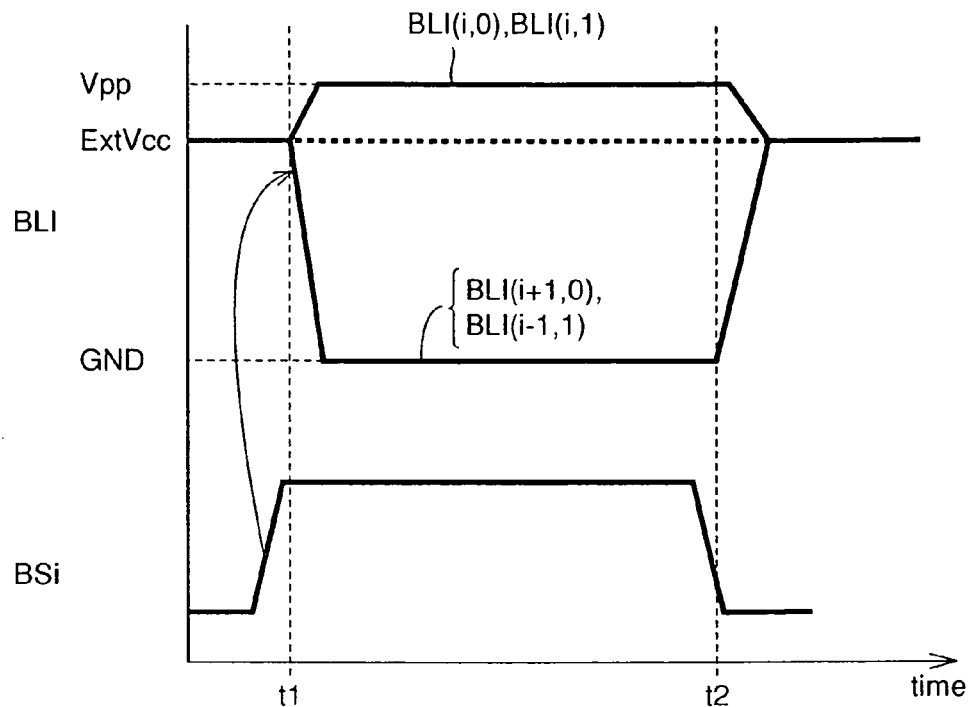
FIG. 30 is a timing chart showing changes of gate control signals by the BLI generation circuit 320.

On the basis of the BLI generation circuit 320, the gate control signals change as shown in FIG. 30. Referring to FIG. 30, symbols BLI(i,0) and BLI(i,1) denote the gate control signals for a selected memory cell block Mi, and symbols BLI(i+1,0) and BLI(i−1,1) denote gate control signals controlling coupling between sense amplifier zones coupled with the memory cell block Mi and memory cell blocks Mi+1 and Mi−1 respectively. All gate control signals are at a level Vpp in a standby state.

When the memory cell block Mi is selected (time t1), the block selection signal BSi goes high. The gate control signals BLI(i+1,0) and BLI(i−1,1) are pulled down from the level ExtVcc to a level GND, and the gate control signals BLI(i,0) and BLI(i,1) are pulled up from the level ExtVcc to the level Vpp.

An active period is ended and the block selection signal BSi goes low (time t2). The gate control signals BLI(i+1,0) and BLI(i−1,1) are brought from the level GND to the level ExtVcc by the transistors P11, and the gate control signals BLI(i,0) and BLI(i,1) are brought from the level Vpp to the level ExtVcc by the transistors P11.

Thus, the BLI generation circuit according to the fourth embodiment of the present invention can set the gate control signals BLI to a higher intermediate potential as compared with the BLI generation circuit employing the internal power supply voltage Vcc. Thus, a pull-up/down operation can be performed at a high speed. In particular, high-speed access is implemented by driving the gate control signals at a high speed when starting the active period. A load on a power supply voltage generation circuit generating the internal power supply voltage Vcc can be reduced, whereby a power supply voltage generation circuit system is simplified and the chip area is reduced.

The BLI generation circuit 310 employing NMOS transistors improves the aforementioned channel hot carrier reliability.

Fifth Embodiment

A fifth embodiment of the present invention is described with reference to a structure for reducing power consumption in a BLI generation circuit. It is assumed that BLIR represents a gate control signal corresponding to a memory cell block MR selectively coupled with a sense amplifier zone SB and BLIL represents a gate control signal corresponding to a non-coupled memory cell block. In a three-valued control system, the gate control signal BLIR coupling the memory cell block MR with the sense amplifier zone SB is brought into a selected state (level Vpp) and the gate control signal BLIL controlling coupling between the sense amplifier zone SB and another memory cell block is brought into a non-selected state (level GND) in an active period (selecting operation). When the active period is ended, the selected gate control signal BLIR (level Vpp) and the non-selected gate control signal BLIL (level GND) are returned to a level Vcc (reset operation).

Assuming that the level Vcc is 2.0 V and the level Vpp is 3.6 V as typical examples, the following relation (1) substantially holds:

$$Vcc = Vpp/2 \quad (1)$$

In general, a pull-down operation and a pull-up operation are performed independently of each other in a reset operation. In the conventional structure, therefore, power is consumed for pulling up the gate control signal BLIL from the level GND to the level Vcc in the reset operation.

According to the fifth embodiment of the present invention, therefore, a BLI wire BLIR transmitting the selected gate control signal BLIR and a BLI wire BLIL transmitting the non-selected gate control signal BLIL are shorted in a reset operation, thereby attaining a state of the following equation (2):

$$\text{potential of BLIR} = \text{potential of BLIL} = Vpp/2 \quad (2)$$

After attaining the state of the equation (2), the gate control signals BLIR and BLIL are converted from the level Vpp/2 to the level Vcc. At this time, substantially no potential change takes place due to the relation of the equation (1). Thus, the reset operation can be effectively performed while suppressing occurrence of power consumption.

Figure 31:
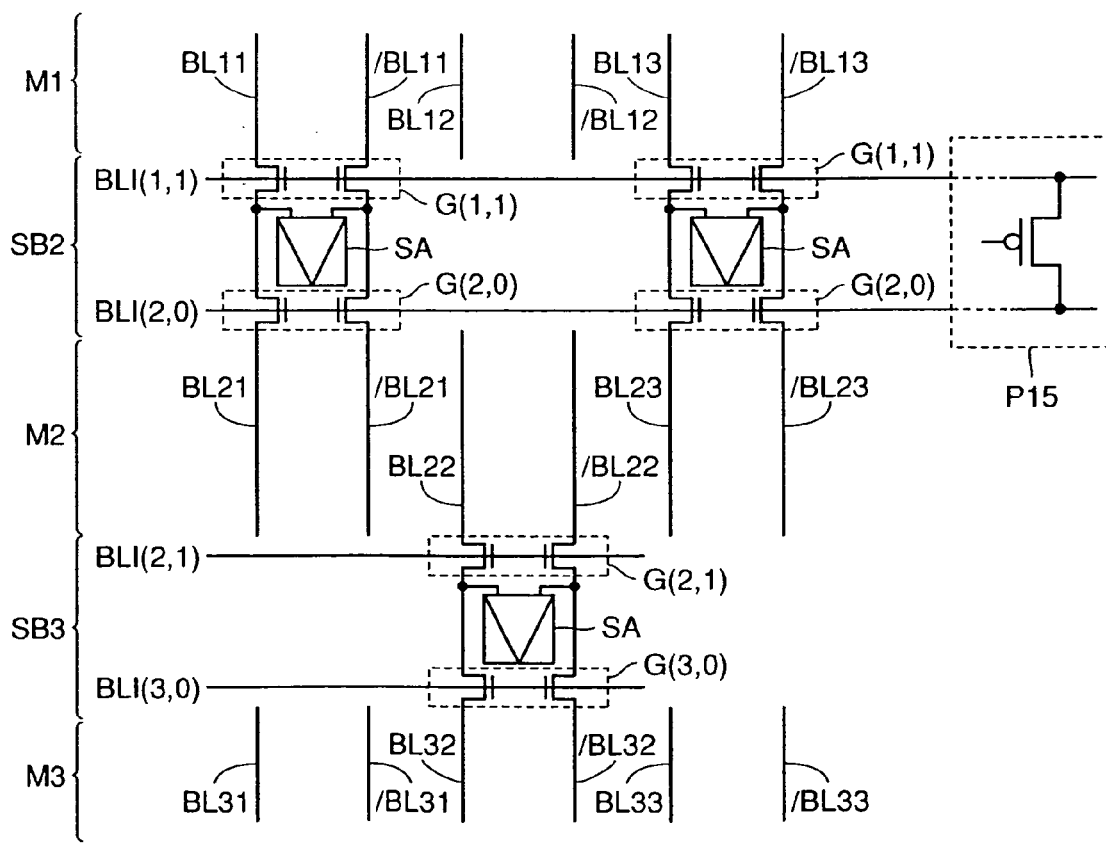
FIG. 31 illustrates the structure of a principal part of a semiconductor device according to a fifth embodiment of the present invention.

FIG. 31 shows an exemplary structure according to the fifth embodiment of the present invention. The fifth embodiment of the present invention is provided with a short circuit for shorting two BLI wires arranged on the same sense amplifier zone. FIG. 31 illustrates a PMOS transistor P15 shorting BLI wires BLI(1,1) and BLI(2,0) as an exemplary short circuit.

Figure 32:
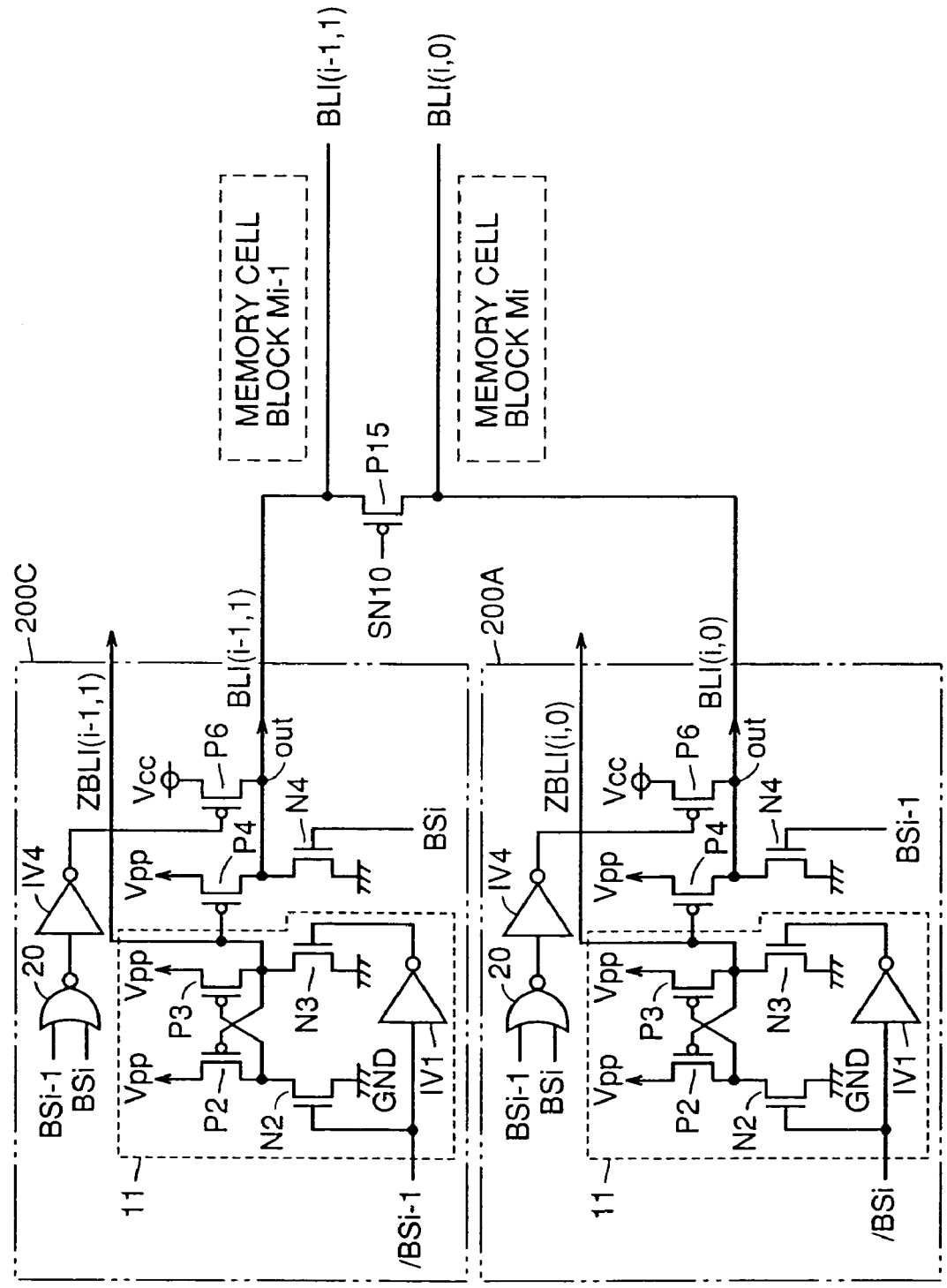
FIGS. 32 and 33 are diagrams for illustrating a short transistor P15 according to the fifth embodiment of the present invention.
Figure 33:
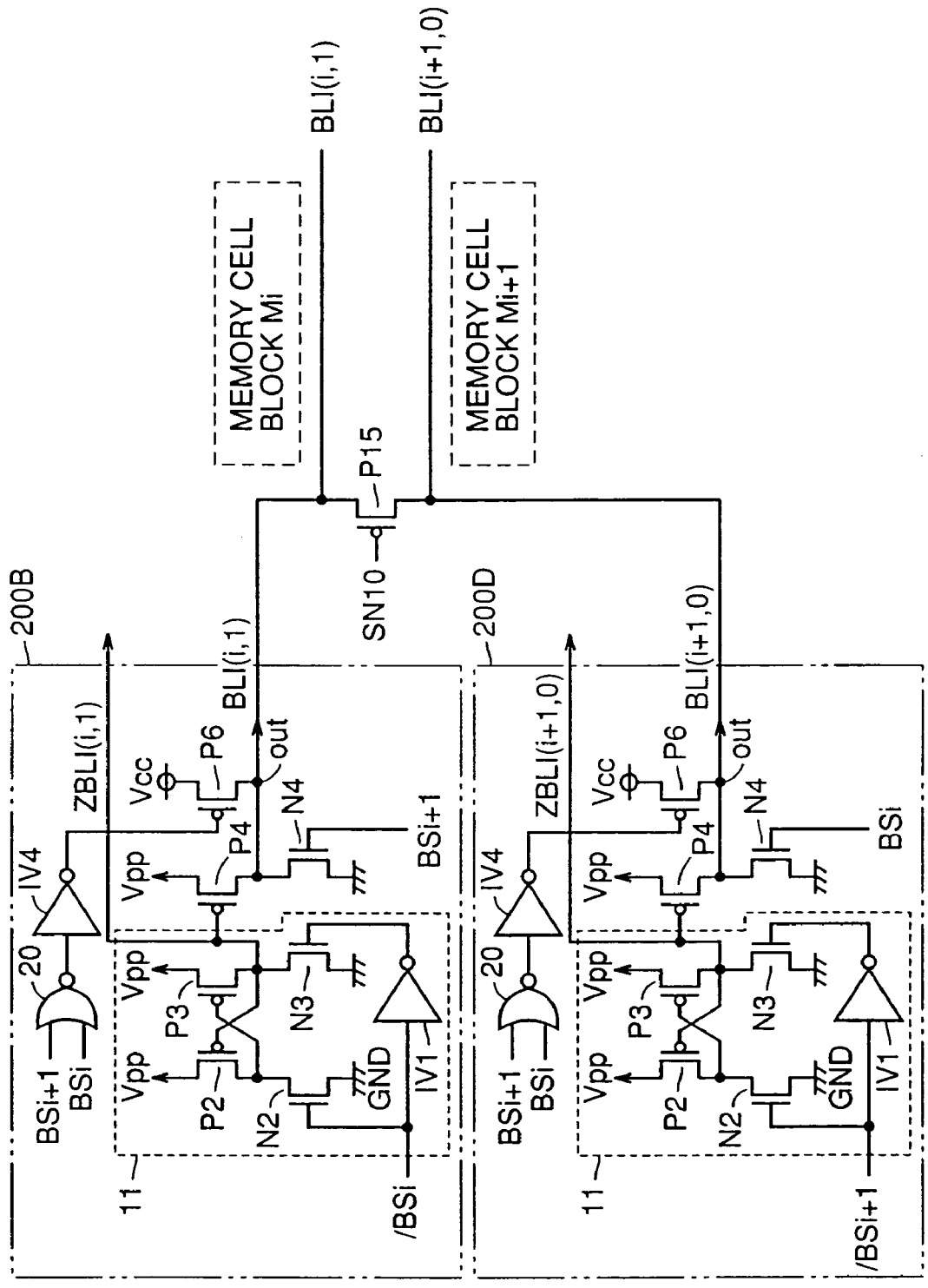

FIGS. 32 and 33 show the relation between such transistors P15 and BLI generation circuits 200A to 200D. Referring to FIG. 32, the BLI generation circuit 200C outputs a gate control signal BLI(i−1,1) to a BLI wire BLI(i−1,1) while the BLI generation circuit 200A outputs a gate control signal BLI(i,0) to a BLI wire BLI(i,0). The transistor P15 is connected between the BLI wires BLI(i−1,1) and BLI(i,0). The transistor P15 receives a signal SN10 generated on the basis of block selection signals BSi and BSi−1. The signal SN10 is output from a signal generation circuit 40 described later.

Referring to FIG. 33, the BLI generation circuit 200B outputs a gate control signal BLI(i,1) to a BLI wire BLI(i,1) while the BLI generation circuit 200D outputs a gate control signal BLI(i+1,0) to a BLI wire BLI(i+1,0). The transistor P15 is connected between the BLI wires BLI(i,1) and BLI(i+1,0). The gate of the transistor P15 receives a signal SN10 generated on the basis of block selection signals BSi and BSi+1. The BLI generation circuits 200C and 200D are identical in structure to the BLI generation circuits 200A and 200B.

Figure 34:
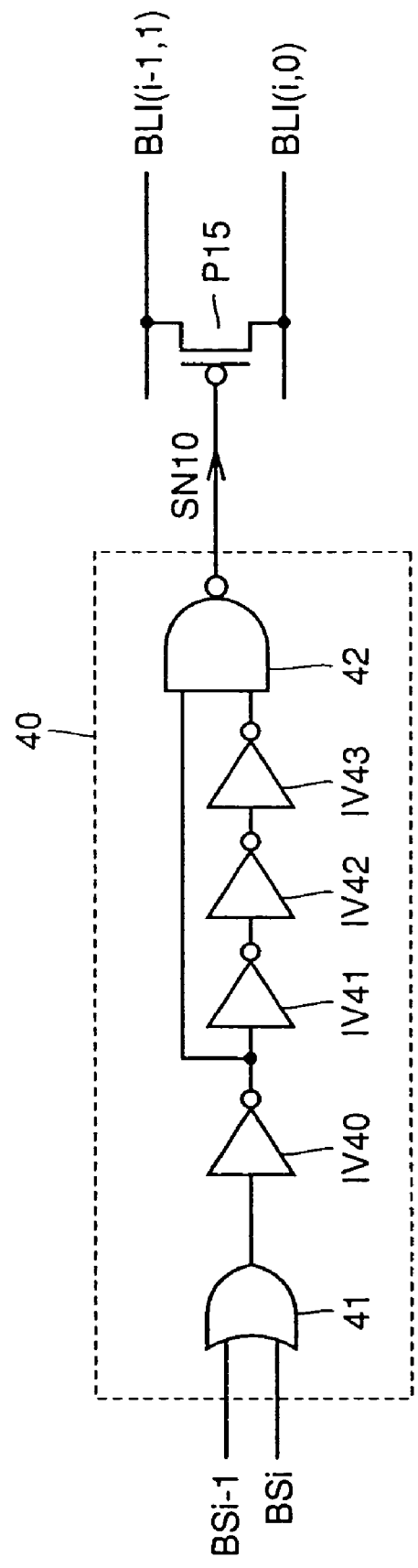
FIG. 34 is a circuit diagram showing the structure of a signal generation circuit 40.

The signal generation circuit 40 has a structure shown in FIG. 34. The signal generation circuit 40 shown in FIG. 34 outputs the signal SN10 supplied to the transistor P15 connected between the BLI wires BLI(i−1,1) and BLI(i,0). The signal generation circuit 40 includes an OR circuit 41, serially connected inverters IV40 to IV43 and a NAND circuit 42.

The OR circuit 41 receives the block selection signals BSi and BSi−1. The inverter IV40 is connected with the output of the OR circuit 41. The NAND circuit 42 receives outputs from the inverters IV40 and IV43, and outputs the signal SN10.

Figure 35:
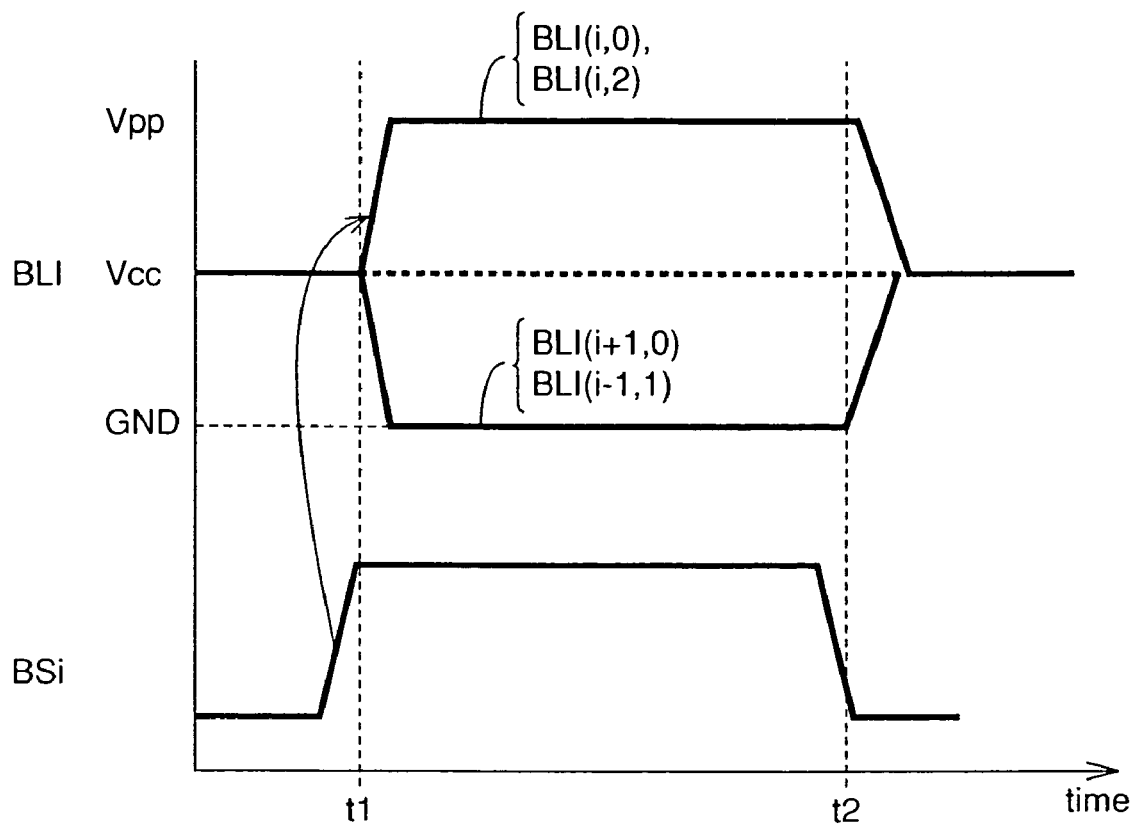
FIG. 35 is a timing chart showing changes of gate control signals according to the fifth embodiment of the present invention.

Gate control signals change as shown in FIG. 35. Referring to FIG. 35, symbols BLI(i,0) and BLI(i,1) denote the gate control signals for a selected memory cell block Mi, and symbols BLI(i+1,0) and BLI(i−1,1) denote gate control signals controlling coupling between sense amplifier zones coupled with the memory cell block Mi and memory cell blocks Mi+1 and Mi−1 respectively. All gate control signals are at the level Vcc in a standby state.

When the memory cell block Mi is selected (time t1), the block selection signal BSi goes high. The gate control signals BLI(i,0) and BLI(i,1) reach a level Vpp, and the gate control signals BLI(i+1,0) and BLI(i−1,1) reach a level GND.

When an active period is ended, a reset operation is performed. At this time, the transistors P15 are turned on. The BLI wires BLI(i,0) and BLI(i−1,1) are electrically connected with each other and the BLI wires BLI(i,1) and BLI(i+1,0) are electrically connected with each other. The gate control signals reach the level Vcc.

Selected and non-selected BLI wires paired with each other are arranged on the same sense amplifier zone, and paired BLI generation circuits are arranged on an end of the same sense amplifier zone. Therefore, the short circuits (the transistors P15) can be readily arranged.

Figure 36:
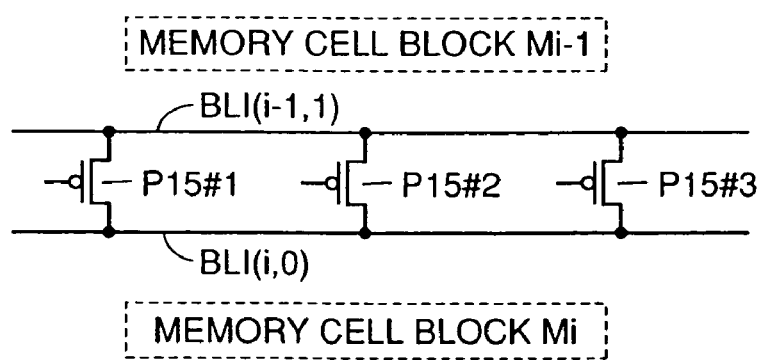
FIG. 36 illustrates exemplary dispersive arrangement of short transistors P15 according to the fifth embodiment of the present invention.

The short circuits may not be arranged on ends of the sense amplifier zones but may alternatively be dispersively arranged on paired BLI wires (transistors P15#1, P15#2, P15#3, ... ), as shown in FIG. 36. Such dispersive arrangement enables a more effective reset operation.

Sixth Embodiment

A sixth embodiment of the present invention is described with reference to a further structure for reducing power consumption in a BLI generation circuit. In the three-valued control system, operations (selecting operations) for converting the gate control signal BLIR from the level Vcc to the level Vpp (selected level) and converting the gate control signal BLIL from the level Vcc to the level GND (non-selected state) are performed on the BLI wires BLIR and BLIL arranged on the same sense amplifier zone, as described above. When ending the active period, the gate control signal BLIR of the level Vpp and the gate control signal BLIL of the level GND are returned to the level Vcc. In general, pull-down and pull-up operations are performed independently of each other.

Figure 37:
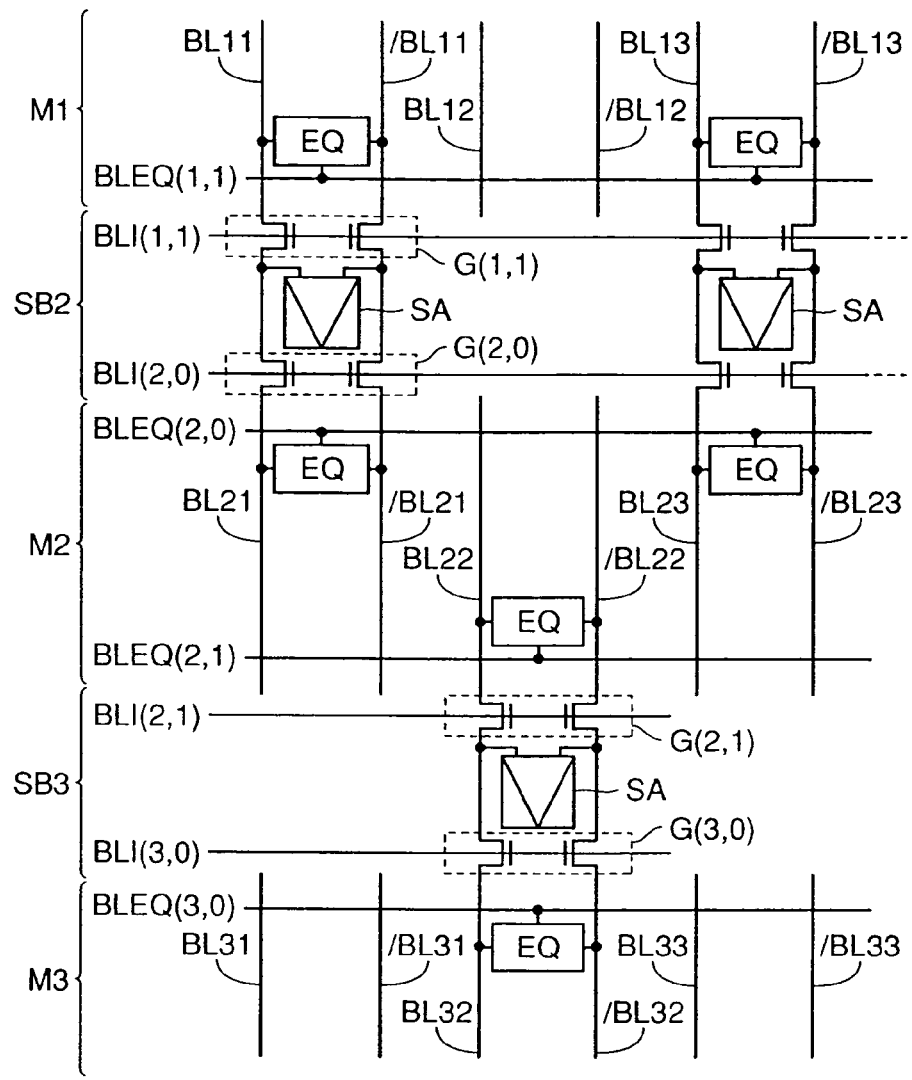
FIG. 37 illustrates the structure of a principal part of a semiconductor device according to a sixth embodiment of the present invention.

As shown in FIG. 37, equalization circuits EQ for equalizing bit lines and precharging the same to a prescribed potential are arranged for pairs of bit lines. The equalization circuits EQ operate in response to corresponding equalization signals BLEQ. Wires transmitting the equalization signals BLEQ are referred to as equalization wires BLEQ.

FIG. 37 shows an equalization circuit EQ equalizing/precharging bit lines BL11 and /BL11 in response to an equalization signal BLEQ(1,1), an equalization circuit EQ equalizing/precharging bit lines BL21 and /BL21 in response to an equalization signal BLEQ(2,0) and the like.

Referring to symbol BLEQ(i,j), i represents correspondence to a memory cell block Mi and j represents 0 (the side of a sense amplifier zone shared by the memory cell block Mi and a memory cell block Mi−1) or 1 (the side of a sense amplifier zone shared by the memory cell block Mi and a memory cell block Mi+1).

Figure 38:
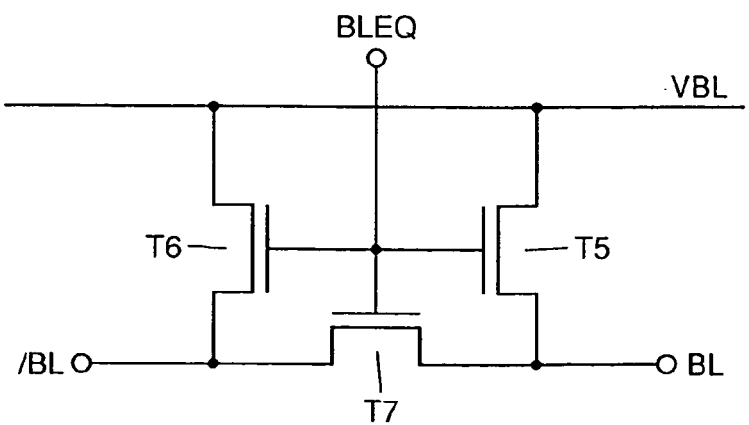
FIG. 38 illustrates the structure of an equalization circuit EQ.

As shown in FIG. 38, each equalization circuit EQ includes a transistor T5 connected between a bit line BL and a wire VBL supplying a bit line voltage VBL, a transistor T6 connected between a bit line /BL and the wire VBL and a transistor T7 connected between the bit lines BL and /BL. The transistors T5, T6 and T7 are NMOS transistors. The gate of each of the transistors T5 to T7 is connected with an equalization wire BLEQ transmitting an equalization signal BLEQ.

The equalization signal BLEQ is set to a level Vpp or GND (two-valued control). When the equalization signal BLEQ reaches the level Vpp, equalization (an operation equalizing a pair of bit lines and precharging the same to a prescribed potential) is performed. Assuming that BLEQR denotes an equalization signal corresponding to a selected memory cell block, the equalization signal BLEQR is pulled down from the level Vpp to the level GND substantially simultaneously with selection of a BLI wire. Assuming that BLEQL denotes an equalization signal corresponding to a non-selected memory cell block, the equalization signal BLEQL keeps the level Vpp (keeps an equalization state).

Therefore, the sixth embodiment of the present invention performs an operation of shorting a BLI wire BLIR corresponding to a selected memory cell block and an equalization wire BLEQR transmitting an equalization signal BLEQR corresponding to the selected memory cell block, thereby attaining a state of the following equation (3):

$$\text{potential of } BLIR = \text{potential of } BLEQR = [C(BLEQ) \cdot Vpp + C(BLIR) \cdot Vcc]/[C(BLEQ) + (BLIR)] \quad (3)$$

Referring to the equation (3), C(BLEQ) represents the capacitance of the equalization wire BLEQR, and C(BLIR) represents the capacitance of the BLI wire BLIR.

The short operation is performed when starting selection or ending selection (in transition from an active period to a standby period). If performing shorting when starting selection, a BLI generation circuit brings the potential of the gate control signal BLIR to the level Vpp and a BLEQ generation circuit generating the equalization signal brings the potential of the equalization signal BLEQR to the level GND after the state of the equation (3).

If performing shorting when ending selection, the BLI generation circuit brings the potential of the gate control signal BLIR to the level Vcc and the BLEQ generation circuit generating the equalization signal brings the potential of the equalization signal BLEQR to the level Vpp after the state of the equation (3).

Figure 39:
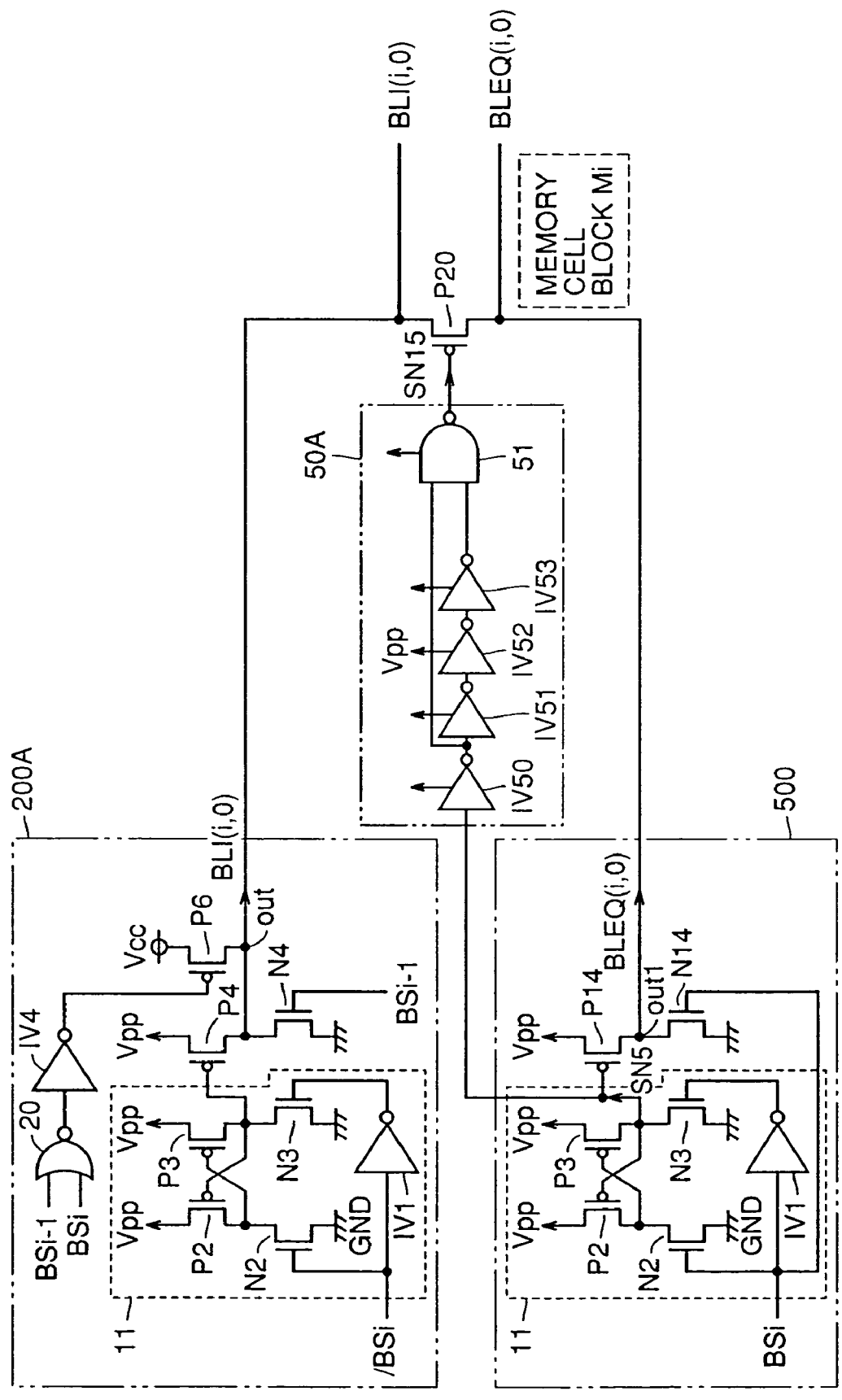
FIG. 39 is a diagram for illustrating a signal generation circuit 50A and a short transistor P20 according to the sixth embodiment of the present invention.

An exemplary structure of performing shorting when ending selection is described with reference to FIG. 39. FIG. 39 shows the relation between a BLI wire BLI(i,0) and an equalization wire BLEQ(i,0) arranged for a memory cell block Mi, a BLI generation circuit 200A generating a gate control signal BLI(i,0), a BLEQ generation circuit 500 generating an equalization signal BLEQ(i,0) and a signal generation circuit 50A.

The BLEQ generation circuit 500 includes a level shifter 11 and transistors P14 and N14. The level shifter 11 receives a block selection signal BSi in its input. The transistors P14 and N14 are connected between a step-up power supply voltage Vpp and a ground voltage GND. The gate of the transistor P14 receives a signal SN5 from a node between transistors P3 and N3 included in the level shifter 11, and the gate of the transistor N14 receives the block selection signal BSi. A node out1 between the transistors N14 and P14 outputs the equalization signal BLEQ(i,0).

The signal generation circuit 50A outputs a one-shot low-level signal SN15 when ending selection. More specifically, the signal generation circuit 50A includes serially connected inverters IV50 to IV53 and a NAND circuit 51. The inverters IV50 to IV53 and the NAND circuit 51 are supplied with the step-up power supply voltage Vpp as an operating power source. The inverter IV50 receives the signal SN5 output from the BLEQ generation circuit 500. The NAND circuit 51 receives outputs of the inverters IV50 and IV53, and outputs the signal SN15.

A short circuit is arranged between the BLI wire and the equalization wire BLEQ. FIG. 39 shows a PMOS transistor P20 shorting the BLI wire BLI(i,0) and the equalization wire BLEQ(i,0) as an exemplary short circuit. The gate of the transistor P20 is supplied with the signal SN15 output from the signal generation circuit 50A.

Similar relation holds also between a BLI wire BLI(i,1) and an equalization wire BLEQ(i,1). In this case, the gate of a transistor P20 arranged between the BLI wire BLI(i,1) and the equalization wire BLEQ(i,1) is supplied with a signal SN15 generated on the basis of an output from a corresponding BLEQ generation circuit.

Figure 40:
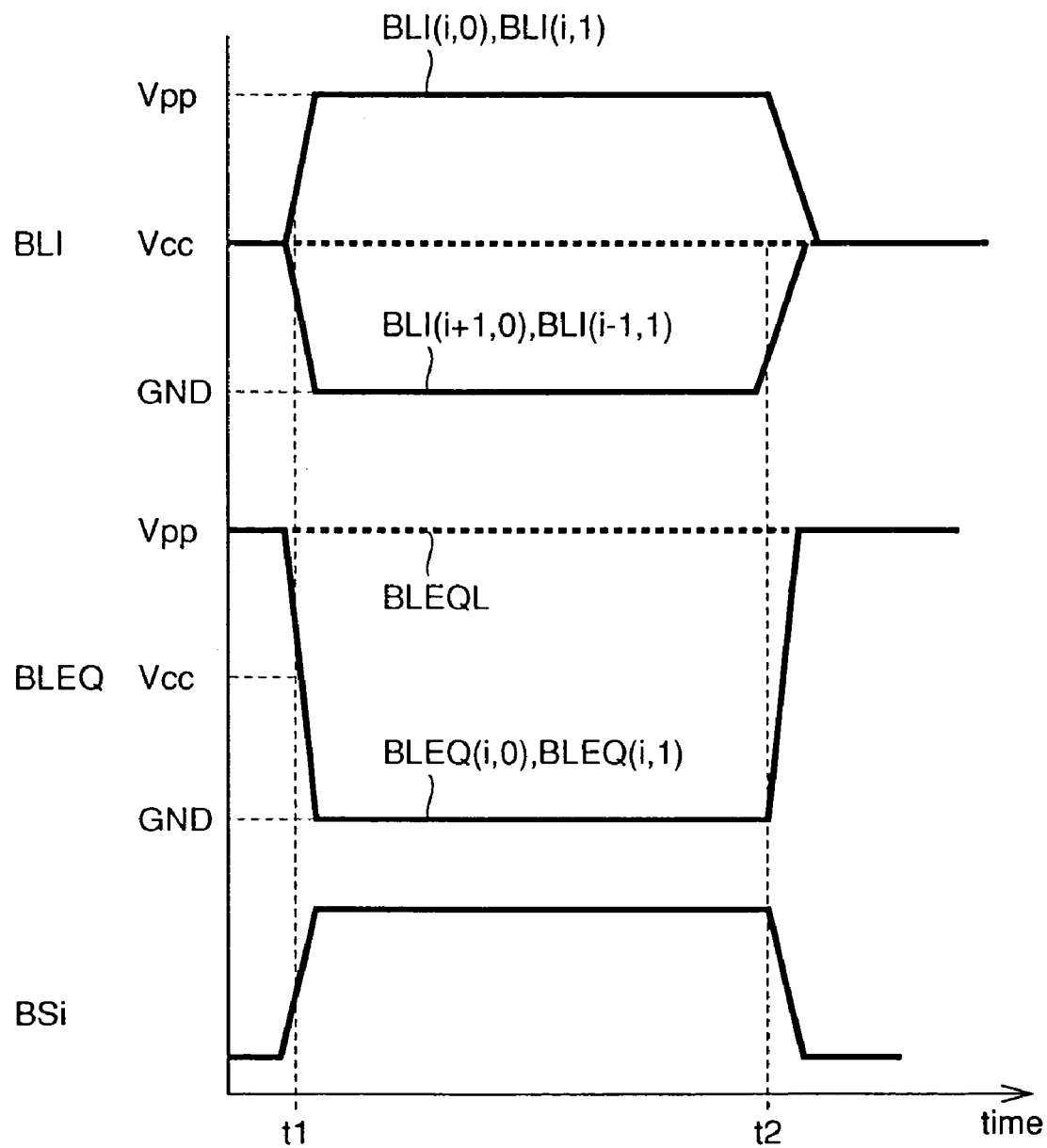
FIG. 40 is a timing chart showing changes of gate control signals and equalization signals according to the sixth embodiment of the present invention.

FIG. 40 shows the relation between gate control signals and equalization signals. Referring to FIG. 40, symbols BLI(i,0) and BLI(i,1) denote gate signals for the selected memory cell block Mi, and symbols BLI(i+1,0) and BLI(i−1,1) denote gate control signals controlling coupling between sense amplifier zones coupled with the memory cell block Mi and memory cell blocks Mi+1 and Mi−1. Symbol BLEQL denotes an equalization signal corresponding to a non-selected memory cell block, and symbols BLEQ(i,0) and BLEQ(i,1) denote equalization signals corresponding to the memory cell block Mi respectively. In a standby state, all gate control signals are at the level Vcc and all equalization signals are at the level Vpp.

When the memory cell block Mi is selected (time t1), the block selection signal BSi goes high. The gate control signals BLI(i,0) and BLI(i,1) are pulled up, and the equalization signals BLEQ(i,0) and BLEQ(i,1) are pulled down.

When an active period is ended (time t2), the block selection signal BSi falls low. At this time, a low-level pulse signal SN15 is generated. The BLI wire BLI(i,0) and the equalization wire BLEQ(i,0) are shorted while the BLI wire BLI(i,1) and the equalization wire BLEQ(i,1) are shorted. Charges are transferred between the BLI wires BLI and the equalization wires BLEQ.

Thereafter the BLI generation circuit brings the gate control signals to the level Vcc while the BLEQ generation circuit brings the equalization signals to the level Vpp.

Figure 41:
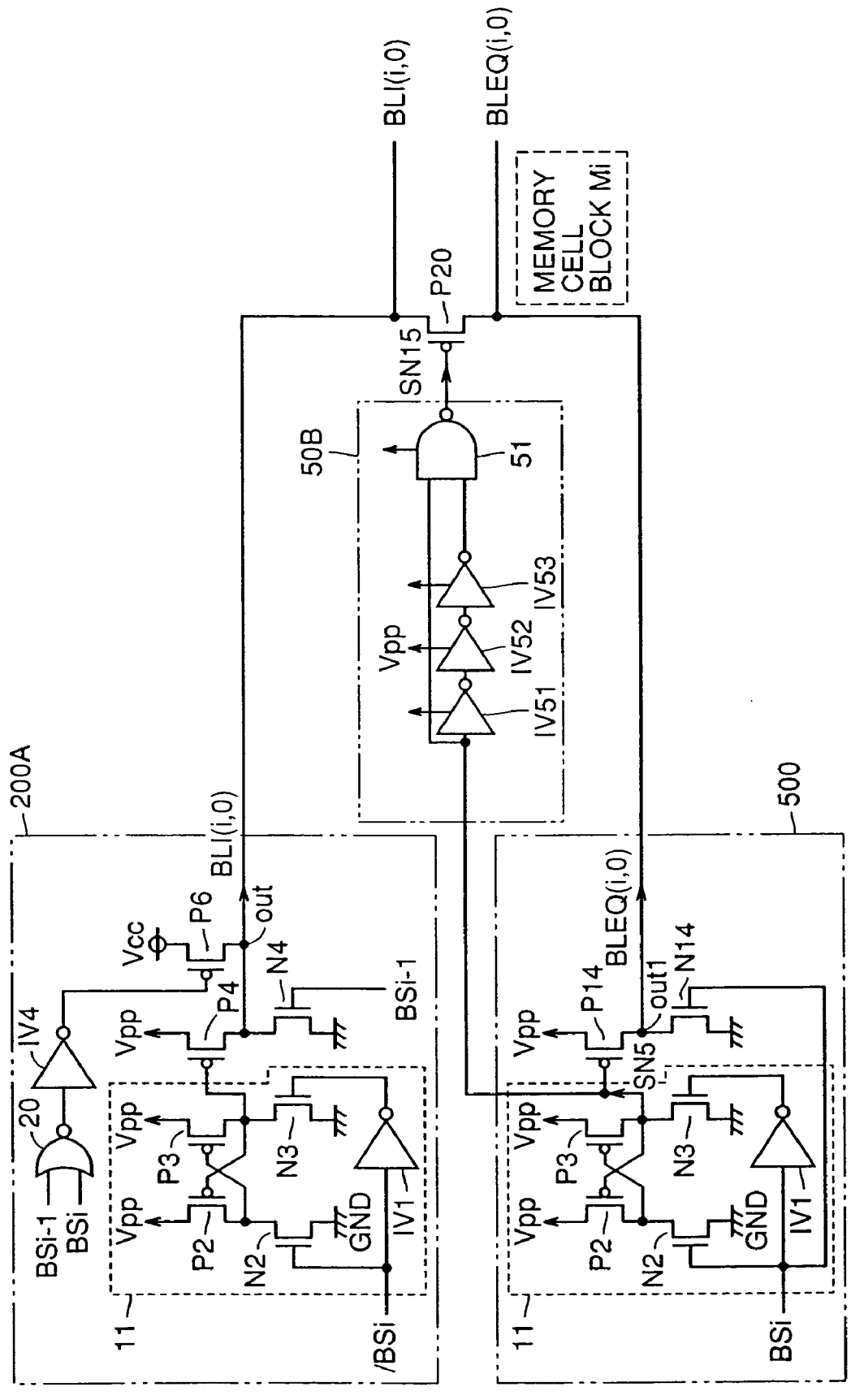
FIG. 41 is a diagram for illustrating another signal generation circuit 50B and the short transistor P20 according to the sixth embodiment of the present invention.

If performing shorting when starting selection, a signal generation circuit 50B shown in FIG. 41 is arranged, for example. FIG. 41 shows the relation between the BLI wire BLI(i,0), the equalization wire BLEQ(i,0), the BLI generation circuit 200A, the BLEQ generation circuit 500 and the signal generation circuit 50B.

The signal generation circuit 50B outputs a one-shot low-level signal SN15 when starting selection. More specifically, the signal generation circuit 50B includes serially connected inverters IV51 to IV53 and a NAND circuit 51. The inverters IV51 to IV53 and the NAND circuit 51 are supplied with the step-up power supply voltage Vpp as an operating power source. The inverter IV51 receives the signal SN5 output from the BLEQ generation circuit 500. The NAND circuit 51 receives the signal SN5 and an output of the inverter IV53, and outputs the signal SN15.

The gate of a transistor P20 shorting the BLI wire BLI(i,0) and the equalization wire BLEQ(i,0) is supplied with the signal SN15 output from the signal generation circuit 50B.

If employing the signal generation circuit 50B, the low-level pulse signal SN15 is generated when starting selection (when the block selection signal BSi goes high). Thus, the BLI wire BLI(i,0) and the equalization wire BLEQ(i,0) are shorted while the BLI wire BLI(i,1) and the equalization wire BLEQ(i,1) are shorted. Charges are transferred between the BLI wires and the equalization wires BLEQ.

Thereafter the BLI generation circuit pulls up the gate control signals BLI(i,0) and BLI(i,1), and the BLEQ generation circuit pulls down the equalization signals BLEQ(i,0) and BLEQ(i,1).

When transitioning to a standby period, the BLI generation circuit brings the gate control signals to the level Vcc and the BLEQ generation circuit brings the equalization signals to the level Vpp.

Power consumption in the BLI generation circuit can be reduced due to the aforementioned operation.

The selected equalization wire BLEQR and the pulled-down equalization wire BLEQR paired with each other and the non-selected BLI wire BLIL and the equalization wire BLEQL, keeping the level Vpp, paired with each other are arranged on the same side of the same sense amplifier zone respectively. Therefore, the BLI generation circuit and the BLEQ generation circuit paired with each other can be arranged in the vicinity of an end of the same sense amplifier zone. Consequently, the short circuit (the transistor P20) can be readily arranged.

Figure 42:
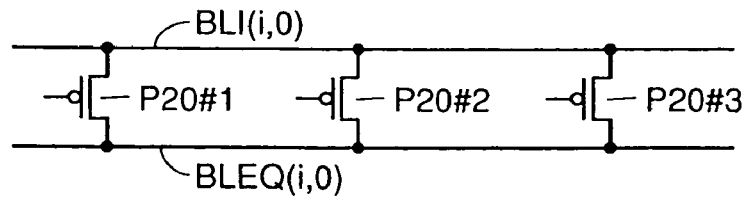
FIG. 42 illustrates exemplary dispersive arrangement of short transistors P20 according to the sixth embodiment of the present invention.

The short circuit is not restricted to the arrangement on the end of the sense amplifier zone but may alternatively be dispersively arranged (transistors P20#1, P20#2, P20#3, ...) between a BLI wire and an equalization wire BLEQ paired with each other, as shown in FIG. 42. Such dispersive arrangement enables more effective reduction of power consumption.

Seventh Embodiment

Figure 43:
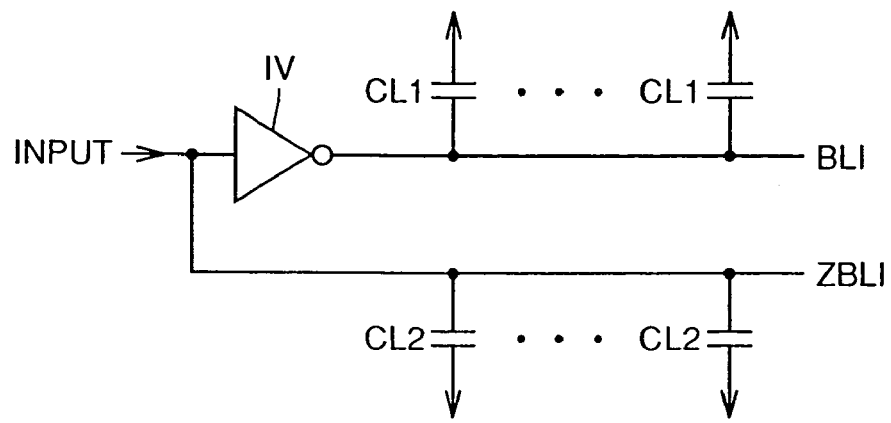
FIG. 43 illustrates the relation between a BLI wire and a ZBLI wire.

The first embodiment of the present invention has been described with reference to the relation between a BLI wire transmitting a gate control signal BLI, a ZBLI wire transmitting a signal ZBLI out of phase with the gate control signal BLI and dispersively arranged loads driven by the same, as shown in FIG. 43. Referring to FIG. 43, a circuit IV receives the gate control signal ZBLI in its input and supplies the gate control signal BLI to the wire BLI.

The BLI wire is connected with a number of selection gates, and hence a load capacitance C1(=CL1+CL1+ ...) is much greater than a load capacitance C2(=CL2+CL2+ ...) connected with the ZBLI wire ZBLI (C1 >>C2). Therefore, it follows that signal transmission on the BLI wire BLI lags signal transmission on the ZBLI wire ZBLI.

Figure 44:
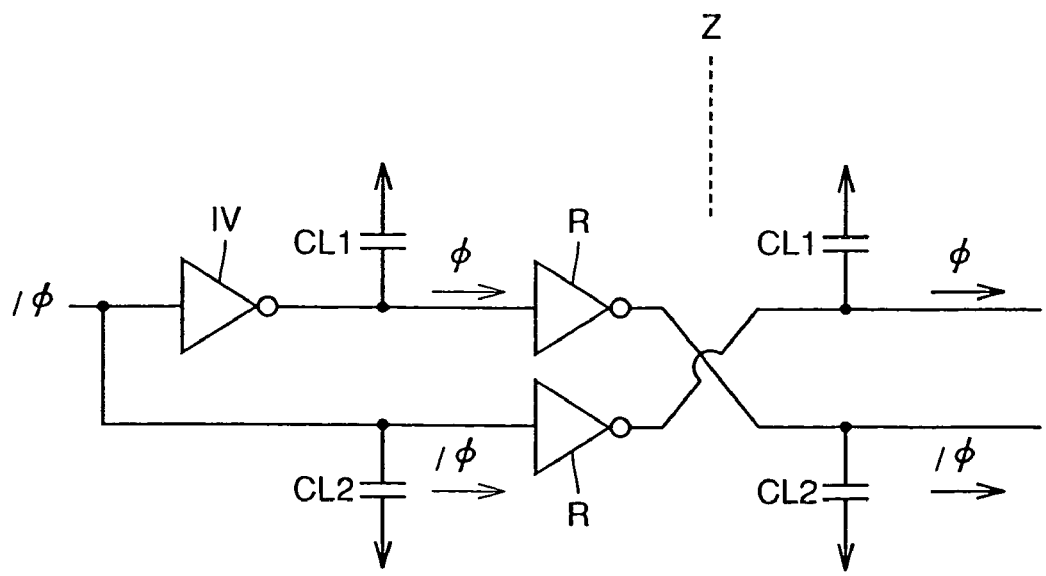
FIG. 44 is a diagram for illustrating a basic structure according to a seventh embodiment of the present invention.

A seventh embodiment of the present invention is described with reference to a structure for high-speed signal transmission on signal wires such as BLI wires. According to the seventh embodiment of the present invention, inversion repeaters R inverting input signals and outputting the inverted signals are arranged on a middle point Z of a wire φ transmitting a signal φ and a wire /φ transmitting a signal /φ out of phase with the signal φ, as shown in FIGS. 44 and 45.

Figure 45:
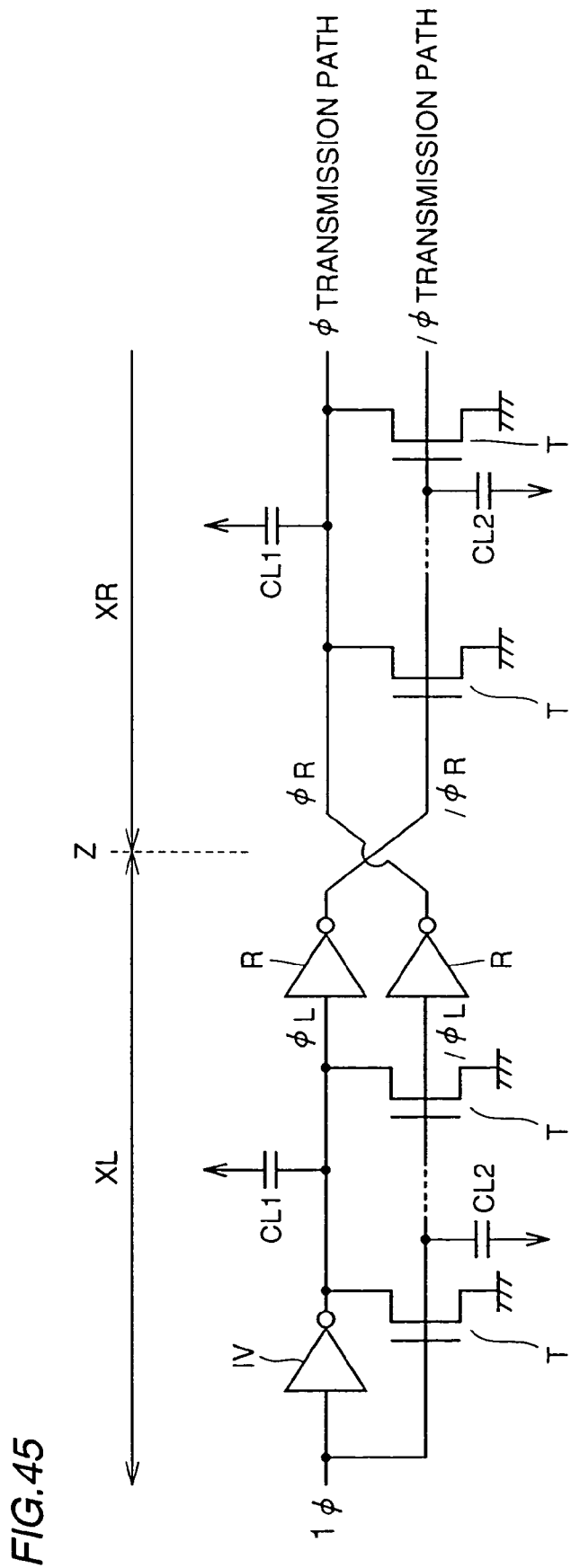
FIG. 45 is a diagram for illustrating the outline of the structure according to the seventh embodiment of the present invention.

Referring to FIG. 45, a transmission wire area on the left side of the middle point Z is referred to as a block XL, a transmission wire area on the right side of the middle point Z is referred to as a block XR, the signals φ and /φ on the side of the block XL are referred to as signal φL and /φL respectively, and the signals φ and /φ on the side of the block XR are referred to as signals φR and /φR respectively.

In the block XL, the signal φL is supplied to a dispersively arranged load CL1. The signal /φL out of phase with the signal φL is employed as gate inputs in elements (transistors T) for pulling down the wire φL. These elements correspond to the local drivers Dpd in the first embodiment, for example.

The inversion repeaters R provided on the middle point Z generate the inverted signal/φR of the signal φL and the inverted signal φR of the signal/φL. In the block XR, the signal φR is supplied to a dispersively arranged load CL1. The signal/φR out of phase with the signal φR is employed as gate inputs in elements (transistors T) for pulling down the wire φR.

Complementary signals transmitted over a long distance can particularly be transmitted at a high speed due to the aforementioned structure.

The relation between the signal wires and the inversion repeaters shown in FIGS. 44 and 45 is not restricted to wires for transmitting gate control signals but is applicable to any signal wires.

Eighth Embodiment

According to an eighth embodiment of the present invention, a dispersive driving system for BLI wires is applied to equalization wires transmitting equalization signals for equalizing/precharging bit line potentials.

Figure 46:
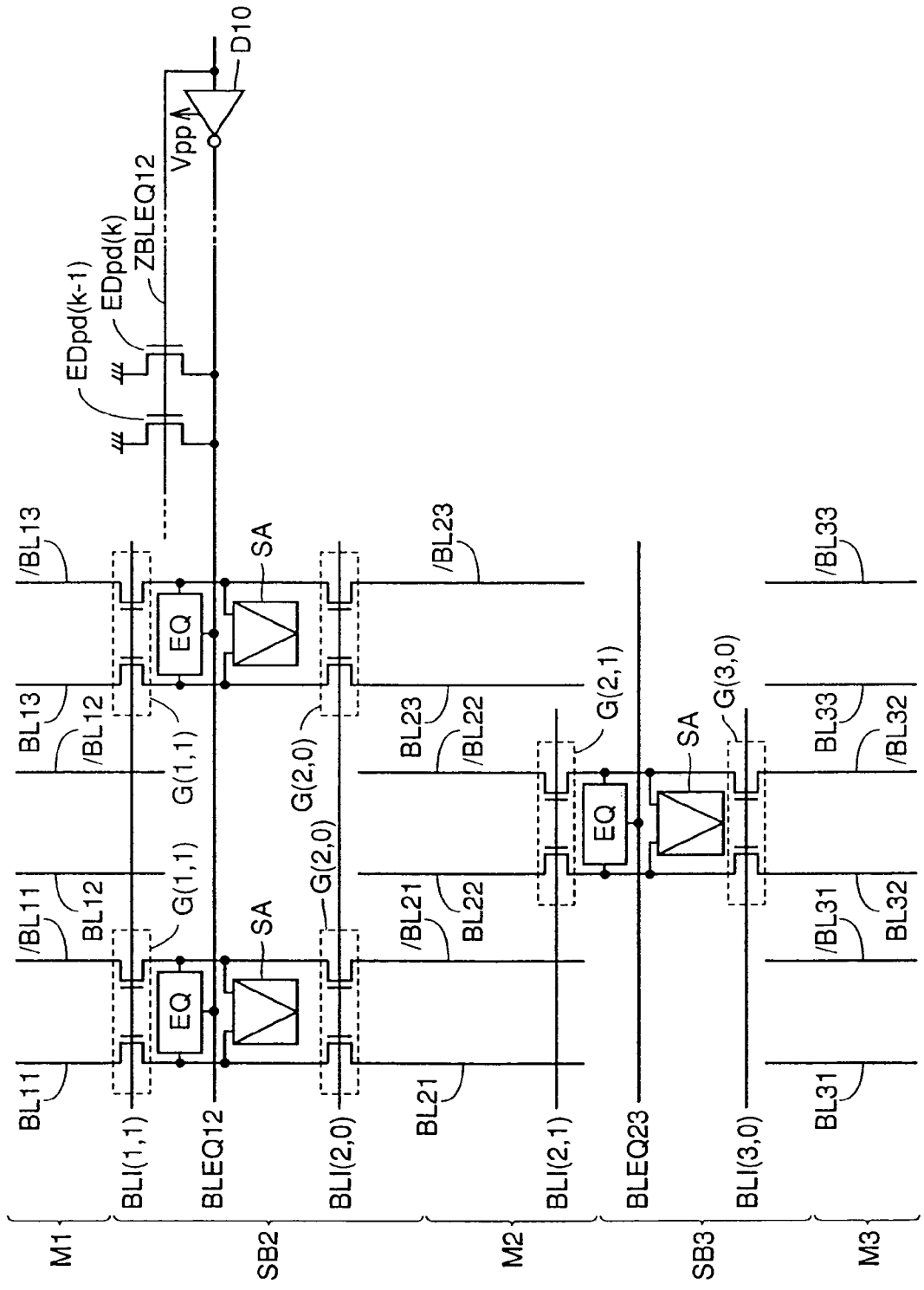
FIG. 46 illustrates the structure of a principal part of a semiconductor device according to an eighth embodiment of the present invention.

Referring to FIG. 46, equalization circuits EQ are provided in correspondence to sense amplifiers. Pairs of bit lines are alternately connected with the equalization circuits EQ included in sense amplifier zones located on both sides through selection gates.

Each equalization circuit EQ enters an equalization canceling state (corresponding to an active state) when an equalization signal input therein goes low, and enters an equalization state (corresponding to a standby state) when the equalization signal goes high. Equalization wires BLEQ are arranged in a word line direction.

A sense amplifier zone SB2 includes an equalization circuit EQ for equalizing a pair of bit lines BLI1 and /BLI1 of a memory cell block Ml and a pair of bit lines BL21 and /BL21 of a memory cell block M2, an equalization circuit EQ for equalizing a pair of bit lines BL13 and /BL13 of the memory cell block Ml and a pair of bit lines BL23 and /BL23 of the memory cell block M2, and the like.

A sense amplifier zone SB3 includes an equalization circuit EQ for equalizing a pair of bit lines BL22 and /BL22 of the memory cell block M2 and a pair of bit lines BL32 and /BL32 of a memory cell block M3 and the like. The structure of these equalization circuits EQ is identical to that described with reference to FIG. 38.

The equalization circuits EQ arranged on the sense amplifier zone SB2 operate by an equalization signal BLEQ12. The equalization circuits EQ arranged on the sense amplifier zone SB3 operate by an equalization signal BLEQ23.

Referring to symbols BLEQij and ZBLEQij, i and j express correspondence to memory cell blocks Mi and Mj respectively.

According to the eighth embodiment of the present invention, a driver D10 (a BLEQ driver D10) and local drivers EDpd are arranged for each equalization wire BLEQ transmitting an equalization signal BLEQ. The plurality of local drivers EDpd are dispersively arranged along the equalization wire BLEQ. FIG. 46 representatively shows local drivers EDpd(k) and EDpd(k−1) connected to an equalization wire BLEQ12 arranged on the sense amplifier zone SB2.

As described above, a number of bit line equalization gates (the equalization circuits) are arranged on each equalization wire BLEQ over a long distance. Therefore, the conventional structure exhibits large transmission delay of the equalization signal. The equalization signal rises in transition from an active period to a standby period, and falls at the head of the active period for coupling a memory cell block with a sense amplifier zone. Therefore, transmission delay of a low-level equalization signal remarkably influences on delay of an access time or the like.

In the eighth embodiment of the present invention, therefore, the BLEQ driver D10 included in a BLEQ generation circuit generating the equalization signal makes the potential of the equalization wire BLEQ fall while the local drivers EDpd dispersively arranged along the equalization wire BLEQ pull down the potential of the equalization wire BLEQ at a high speed. The BLEQ driver D10 is supplied with a step-up power supply voltage Vpp as an operating power source, receives a signal ZBLEQ and outputs the equalization signal BLEQ out of phase therewith. Each local driver EDpd is formed by an NMOS transistor connected between the equalization wire BLEQ and a node receiving a ground voltage GND for receiving the signal ZBLEQ in its gate. A wire transmitting the signal ZBLEQ is referred to as a driving wire ZBLEQ.

The structure of the BLEQ generation circuit generating the equalization signal is described with reference to FIGS. 47A and 47B. A BLEQ generation circuit 600A shown in FIG. 47A generates an equalization signal BLEQij corresponding to memory cell blocks Mi and Mj. A BLEQ generation circuit 600B shown in FIG. 47B generates an equalization signal BLEQjk corresponding to memory cell blocks Mj and Mk.

Each of the BLEQ generation circuits 600A and 600B includes a NOR circuit 60, an inverter IV60 inverting an output of the NOR circuit 60, a level shifter 11 and transistors P14 and N14 forming the BLEQ driver D10.

A gate of a transistor N2 and an inverter IV1 included in the level shifter 11 receive an output of the inverter IV60.

The transistors P14 and N14 are serially connected between the step-up power supply voltage Vpp and the ground voltage GND. The gate of the transistor P14 receives a signal (signal from a node between transistors P3 and N3) output from the level shifter 11, and the gate of the transistor N14 receives the output of the inverter IV60.

In the BLEQ generation circuit 600A, the NOR circuit 60 receives block selection signals BSi and BSj. The inverter IV60 outputs a signal ZBLEQij, and a node out1 between the transistors P14 and N14 outputs an equalization signal BLEQij. The driving wire ZBLEQij transmits the output of the inverter IV60.

In the BLEQ generation circuit 600B, the NOR circuit 60 receives block selection signals BSj and BSk. The inverter IV60 outputs a signal ZBLEQjk, and a node out1 between the transistors P14 and N14 outputs an equalization signal BLEQjk. A driving wire ZBLEQjk transmits the output of the inverter IV60.

The gate of the local driver EDpd(k) arranged on the equalization wire BLEQij is connected with the driving wire ZBLEQij, and the gate of the local driver EDpd(k) arranged on the equalization wire BLEQjk is connected with the driving wire ZBLEQjk.

When the block selection signal BSi goes high and the block selection signals BSj and BSk go low, for example, the equalization signal BLEQij reaches the level GND and the equalization signal BLEQjk is at the level Vpp.

Figure 48:
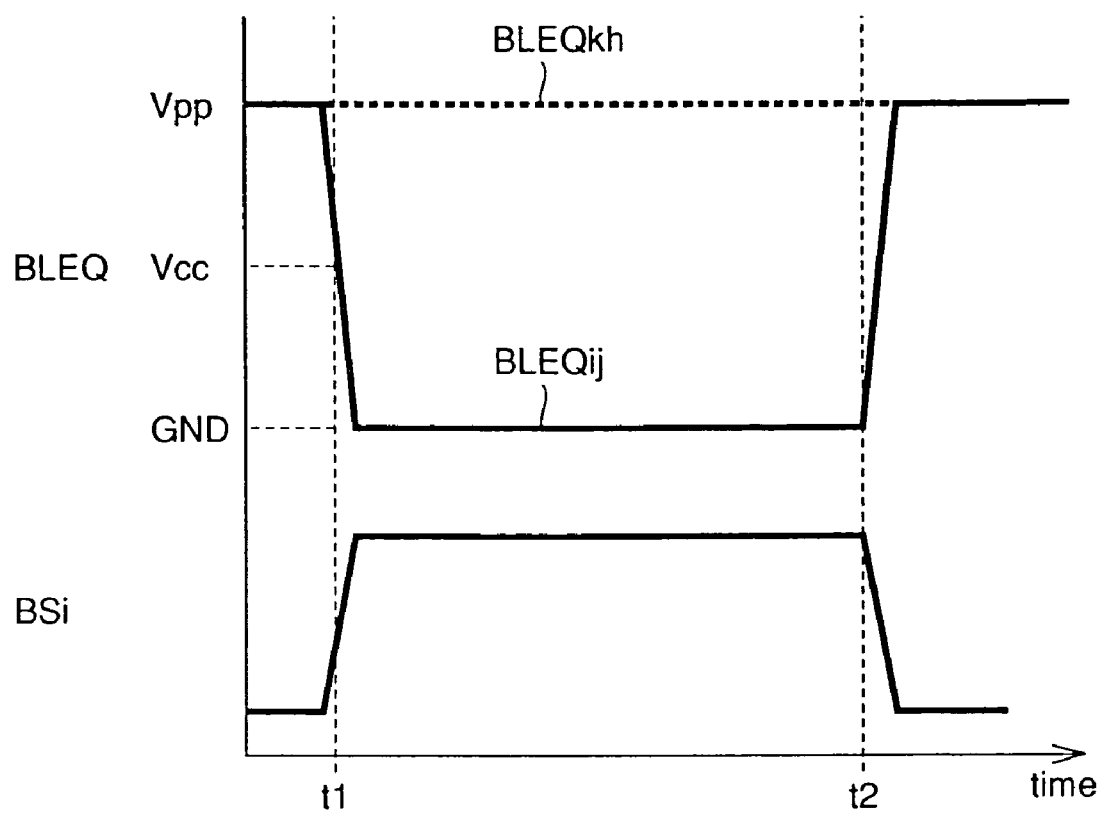
FIG. 48 is a timing chart showing changes of equalization signals according to the eighth embodiment of the present invention.

Operation timing according to the eighth embodiment of the present invention is described with reference to FIG. 48. Referring to FIG. 48, symbol BLEQij denotes the equalization signal for equalizing/precharging bit lines of the selected memory cell block Mi and symbol BLEQjk denote an equalization signal for equalizing/precharging bit lines of a non-selected memory cell block. All equalization signals are at the level Vpp in a standby state.

The memory cell block Mi is selected in accordance with an input external row address, and the corresponding block selection signal BSi goes high (time t1). The transistor N14 included in the BLEQ driver D10 makes the equalization signal BLEQij fall. The local driver EDpd operates to pull down the equalization signal BLEQij. The equalization signal BLEQkh is also pulled down in a similar manner. Equalization is canceled. The remaining equalization signals keep a standby state (level Vpp).

Gate control signals BLI(i,0) and BLI(i,1) for the memory cell block Mi keep the level Vpp, and gate control signals for memory cell blocks sharing sense amplifier zones with the memory cell block Mi are made to fall to the level GND. The remaining gate control signals keep a standby state (e.g., the level Vpp).

Thus, the memory cell block and the corresponding sense amplifier zones are selected/activated. Then, actual operations (selection/driving of a word line, activation of a sense amplifier etc.) are performed.

When ending an active period, all equalization signals and gate control signals return to the standby state (time t2).

The local drivers EDpd are arranged on intersections (cross points) between sub word driver zones SWB arranged in a column direction and sense amplifier zones arranged in a row direction, for example (see FIG. 3).

The equalization signal BLEQ is input in a number of bit line equalization gates (the equalization circuits), and hence the equalization wire BLEQ transmitting the equalization signal BLEQ is formed by a metal layer located on a relatively low position. A driving wire ZBLEQ transmitting a signal ZBLEQ for dispersively driving the equalization wire is formed on a metal layer located above the equalization wire BLEQ with a wide pitch. Thus, floating capacitances on the wires are reduced to improve the effect related to signal transmission. The effect is further improved when preparing the equalization wire BLEQ from aluminum and preparing the driving wire ZBLEQ formed by a wiring layer different from that for the equalization wire BLEQ from Cu (copper) having a higher signal propagation speed than aluminum.

The following specific effects result from the aforementioned structure and operations: First, the equalization signal BLEQ can be pulled down at a higher speed by a high-speed pull-down operation of the local drivers EDpd driven by the driving wire ZBLEQ having a smaller load and faster signal transmission as compared with a pull-down operation by a driver in the BLEQ generation circuit.

Second, the number of elements to be arranged on the cross points between the sense amplifier zones and the sub word driver zones SWB is smaller as compared with a system (e.g., the structure shown in FIG. 7) inserting repeaters into intermediate positions of the equalization wire BLEQ and the step-up power supply voltage Vpp may not be supplied to the cross points. Therefore, the chip area is reduced.

The operation for pulling down the equalization signals BLEQ requiring high-speed signal transmission is speeded up due to the aforementioned effects, to enable high-speed access. Further, unnecessary area increase can be prevented.

The above structure for speeding up the pull-down operation is also applied to a pull-up operation. While the pull-down drivers EDpd(k) are arranged on the cross points in the above description, the pull-down drivers EDpd(k) may alternatively be arranged on other positions in the sense amplifier zones.

While exemplary application to the two-valued control system for driving the sense amplifier zones has been described, the present invention is also applicable to a three-valued control system.

Ninth Embodiment

A ninth embodiment of the present invention is described with reference to exemplary improvement of the eighth embodiment. According to the ninth embodiment of the present invention, equalization circuits are arranged between selection gates and a memory cell array for dispersively driving equalization signals.

Figure 49:
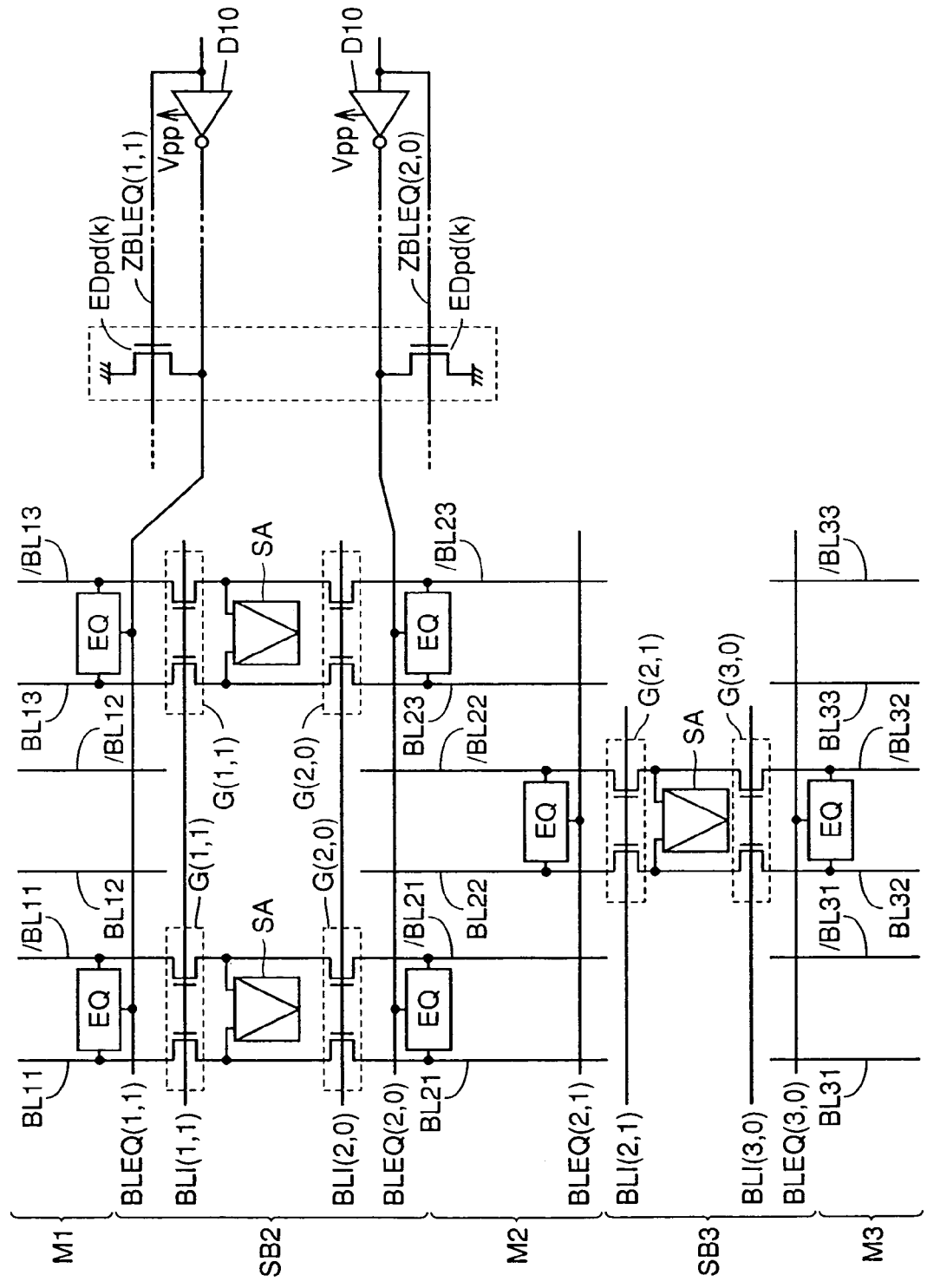
FIG. 49 illustrates the structure of a principal part of a semiconductor device according to a ninth embodiment of the present invention.

Referring to FIG. 49, equalization circuits EQ are provided in correspondence to pairs of bit lines BL11 and /BL11, . . . . The structure of these equalization circuits EQ is identical to that described with reference to FIG. 38.

Referring to symbols BLEQ(i,j) and ZBLEQ(i,j), i expresses correspondence to a memory cell block Mi and j expresses "0" (the side of a sense amplifier zone shared by the memory cell block Mi and a memory cell block Mi−1) or "1" (the side of a sense amplifier zone shared by the memory cell block Mi and a memory cell block Mi+1).

A BLEQ driver D10 and a plurality of local drivers EDpd are arranged for each equalization wire BLEQ transmitting an equalization signal BLEQ. The plurality of local drivers EDpd are dispersively arranged along the equalization wire BLEQ. FIG. 49 illustrates exemplary BLEQ drivers D10 and local drivers EDpd(k) arranged for equalization wires BLEQ (1,1) and BLEQ(2,0) respectively.

Figure 50:
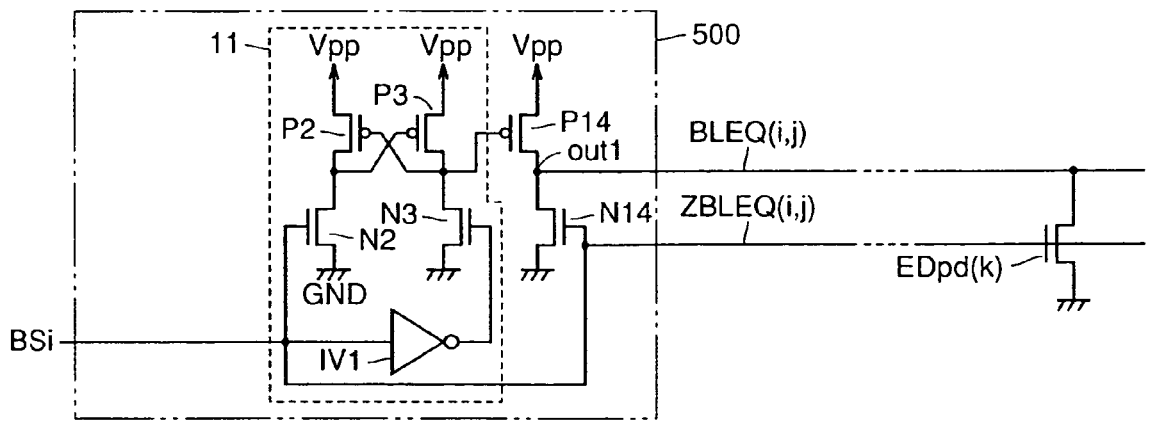
FIG. 50 illustrates the relation between a BLEQ generation circuit and a local driver EDpd.

FIG. 50 shows the relation between a BLEQ generation circuit 500 generating an equalization signal and each local driver EDpd. The BLEQ generation circuit 500 shown in FIG. 50 generates an equalization signal BLEQ(i,j). The gate of a transistor N2 and an inverter IV1 included in the BLEQ generation circuit 500 receive a block selection signal BSi. The gate of a transistor P14 receives a signal (signal from a node between transistors P3 and N3) output from a level shifter 11, and the gate of a transistor N14 receives the block selection signal BSi.

A node out1 between the transistors P14 and N14 outputs the equalization signal BLEQ(i,j). A driving wire ZBLEQ(i,j) connected with a gate of the local driver EDpd(k) is supplied with the block selection signal BSi.

The equalization signal BLEQ(i,j) reaches the level GND when the block signal BSi goes high, while the equalization signal BLEQ(i,j) reaches the level Vpp when the block selection signal BSi goes low, for example.

Figure 51:
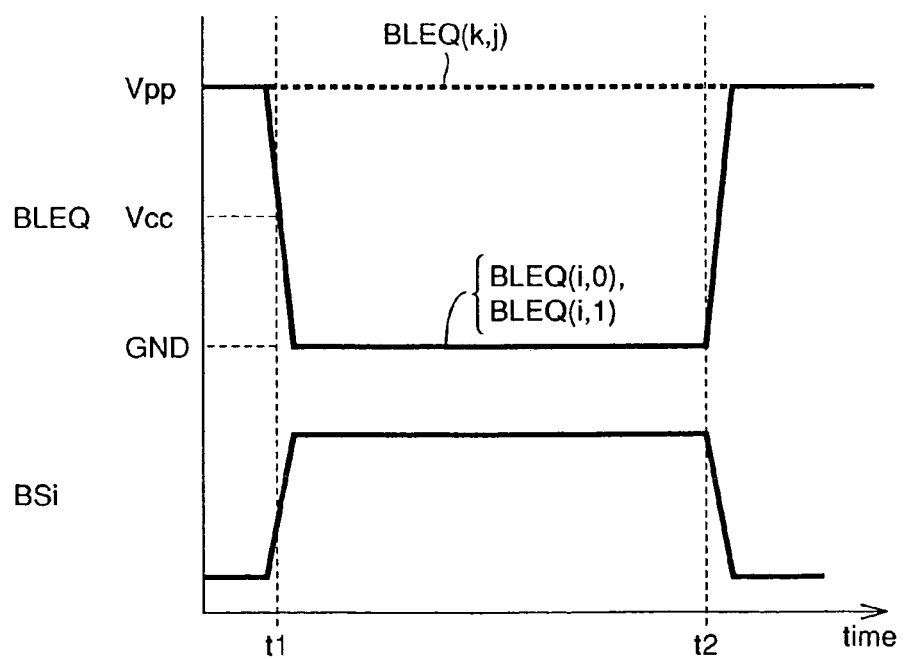
FIG. 51 is a timing chart showing changes of equalization signals according to the ninth embodiment of the present invention.

Operation timing according to the ninth embodiment of the present invention is described with reference to FIG. 51. Referring to FIG. 51, symbols BLEQ(i,0) and BLEQ(i,1) denote equalization signals for equalizing/precharging bit lines of the selected memory cell block Mi, and symbol BLEQ(k,j) denotes an equalization signal for equalizing/precharging bit lines of a non-selected memory cell block respectively. All equalization signals are at the level Vpp in a standby state.

The memory cell block Mi is selected in accordance with an input external row address, and the corresponding block selection signal BSi goes high (time t1). The BLEQ driver D10 and the local drivers EDpd bring the equalization signals BLEQ(i,0) and BLEQ(i,1) to the level GND. The remaining equalization signals keep the level Vpp.

When an active period is ended, all equalization signals return to a standby state (the level Vpp) (time t2).

When arranging the equalization circuits EQ between the selection gates and the memory cell array as shown in the ninth embodiment of the present invention, no source-to-drain channel resistance of transistors forming the selection gates is interposed between transistors forming the equalization circuits and the bit lines. Therefore, equalization can be performed at a high speed.

Fall of the equalization signals BLEQ is speeded up by a dispersive driving system.

On the basis of the structure according to the ninth embodiment of the present invention, equalization is more speeded up as compared with the case of arranging the equalization circuits EQ between the selection gates and sense amplifiers, for implementing a fast access time.

Tenth Embodiment

A tenth embodiment of the present invention is described with reference to further exemplary improvement of the ninth embodiment. According to the tenth embodiment of the present invention, wires transmitting sense amplifier activation signals for driving sense amplifiers are also dispersively driven.

Figure 52:
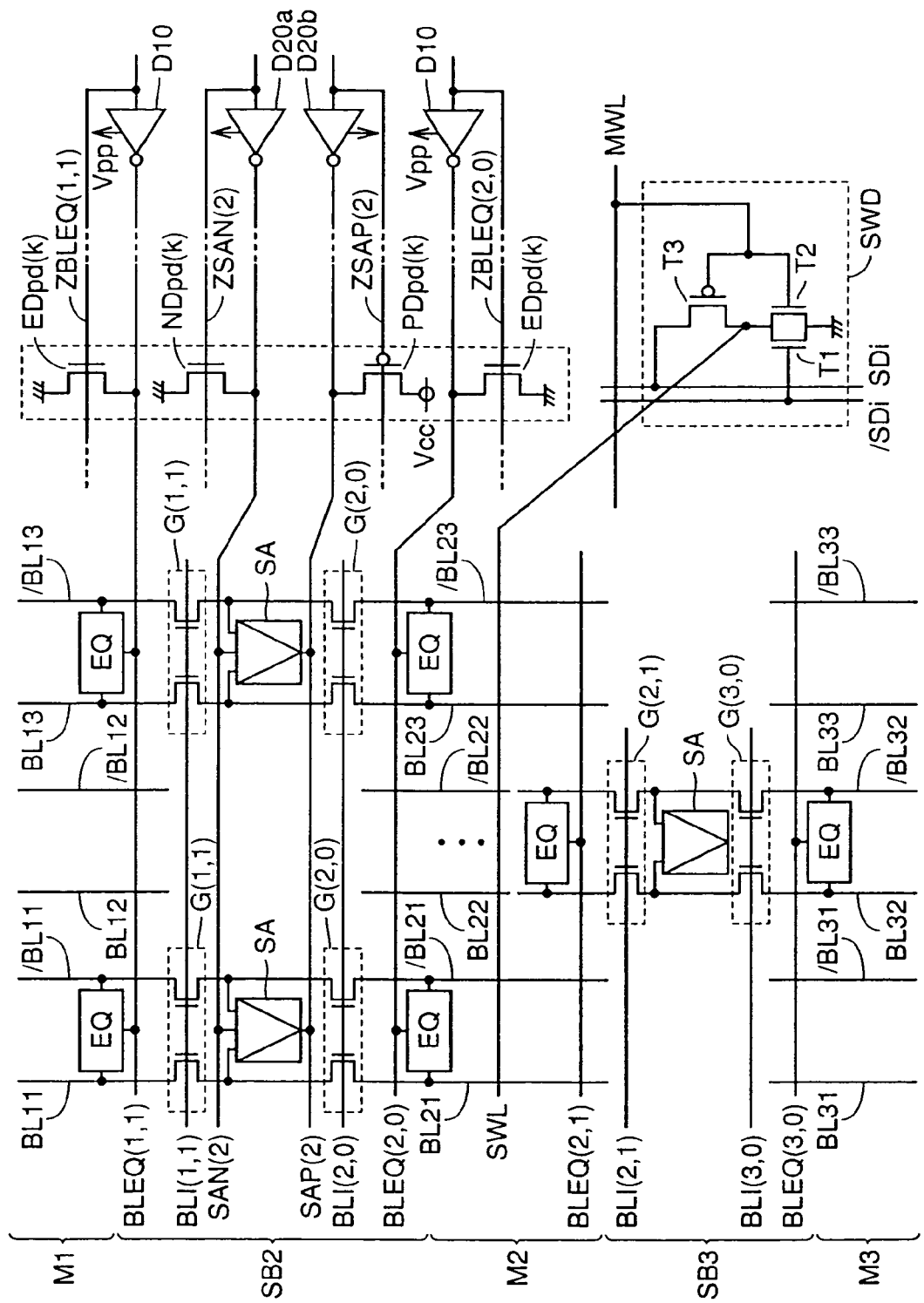
FIG. 52 illustrates the structure of a principal part of a semiconductor device according to a tenth embodiment of the present invention.

Referring to FIG. 52, equalization circuits EQ are arranged between selection gates and a memory cell array, as described with reference to the ninth embodiment. BLEQ drivers D10 are arranged and local drivers EDpd are dispersively arranged on wires transmitting equalization signals. FIG. 52 shows local drivers EDpd(k), for example.

Sense amplifiers SA of each sense amplifier zone SBi operate with sense amplifier activation signals SAN(i) and SAP(i). Referring to the sense amplifier activation signals SAN(i) and SAP(i), i expresses correspondence to the sense amplifier zone SBi.

Sense amplifiers SA included in a sense amplifier zone SB2 amplify potential difference between pairs of bit lines of a memory cell block M1 or M2 with sense amplifier activation signals SAN(2) and SAP(2). Sense amplifiers SA included in a sense amplifier zone SB3 amplify potential difference between pairs of bit lines of the memory cell block M2 or a memory cell block M3 with sense amplifier activation signals SAN(3) and SAP(3).

Figure 53:
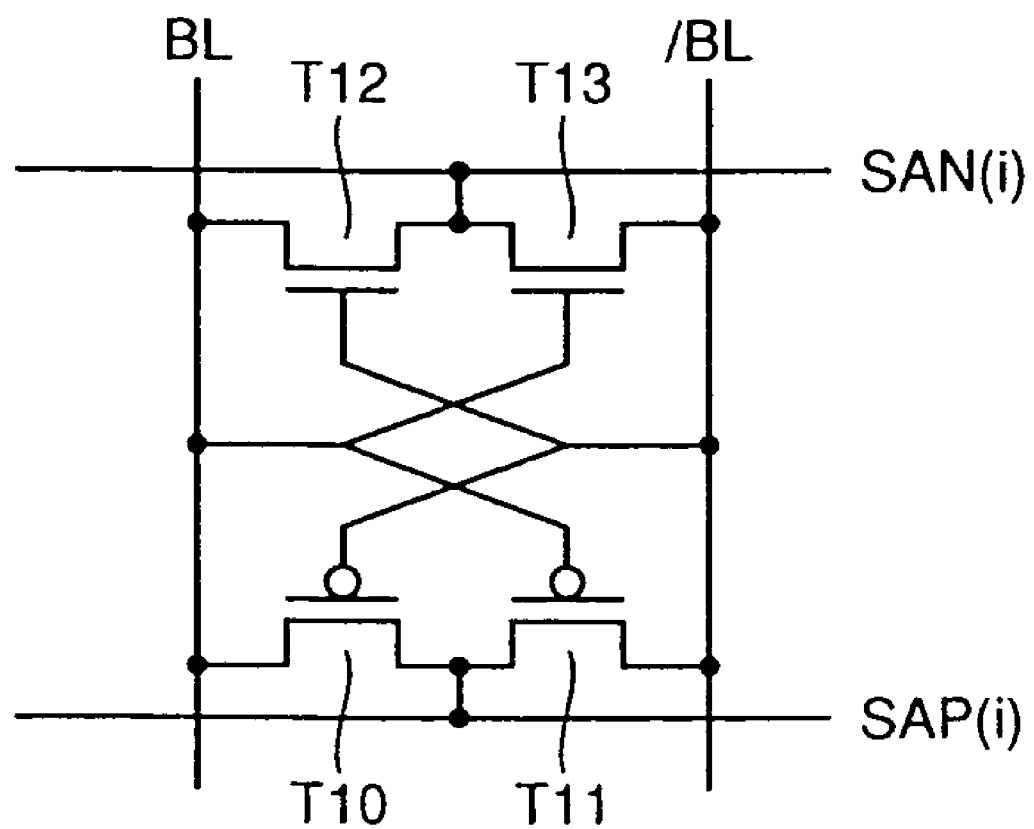
FIG. 53 is a circuit diagram showing the structure of a sense amplifier SA.

FIG. 53 shows the structure of each sense amplifier SA. FIG. 53 illustrates a sense amplifier SA receiving the sense amplifier activation signals SAN(i) and SAP(i), for example. The sense amplifier includes PMOS transistors T10 and T11 for setting a bit line having a higher potential in a pair of bit lines BL and /BL to the potential level of the sense amplifier activation signal SAP(i) and NMOS transistors T12 and T13 for setting a bit line having a lower potential in the pair of bit lines BL and /BL to the potential level of the sense amplifier activation signal SAN(i).

A node between the transistors T12 and T13 is connected with a wire SAN(i), and a node between the transistors T10 and T11 is connected with a wire SAP(i).

Referring again to FIG. 52, a driver D20a and a local driver NDpd are arranged for a wire SAN transmitting a sense amplifier activation signal SAN. The local driver NDpd is dispersively arranged.

A driver D20b and a local driver PDpd are arranged for a wire SAP transmitting a sense amplifier activation signal SAP. The local driver PDpd is dispersively arranged.

The driver D20a receives a signal ZSAN and outputs the sense amplifier activation signal SAN out of phase therewith. The local driver NDpd is formed by an NMOS transistor connected between the wire SAN and a node receiving the ground voltage for receiving the signal ZSAN in its gate from a driving wire ZSAN. FIG. 52 representatively shows a local driver NDpd(k) connected with a wire SAN(2) for receiving a driving signal from a driving wire ZSAN(2) and the driver D20a.

The driver D20b receives a signal ZSAP and outputs the sense amplifier activation signal SAP out of phase therewith. The local driver PDpd is formed by a PMOS transistor connected between the wire SAP and a node receiving a power supply voltage for receiving the signal ZSAP in its gate from a driving wire ZSAP. FIG. 52 representatively shows a local driver PDpd(k) connected with a wire SAP(2) for receiving a driving signal from a driving wire ZSAP(2) and the driver D20b.

Word lines of a memory cell block are in a hierarchical structure. A single main word line MWL corresponds to a plurality of (specifically four) sub word lines SWL (divided WL structure).

A sub word driver SWD included in a sub word driver zone SWB is formed by transistors T1, T2 and T3, and drives a single sub word line in response to the main word line MWL and a sub word signal SD. The sub word signal SD is generated by decoding a row address.

The sub word driver zone SWB divides the memory cell block into a plurality of sub memory blocks. A single sub word driver zone SWB selects sub word lines included in sub memory blocks located on both sides thereof. The hierarchical word line structure is a mere example, and the subject matter of the present invention is not restricted to this.

The drivers D20a and D20b are arranged on intersections (cross points) between sub word driver zones SWB arranged in a column direction and sense amplifier zones arranged in a row direction (see FIG. 3).

The local drivers NDpd, PDpd and EDpd are arranged on or between the sub word driver zones SWB.

Figure 54:
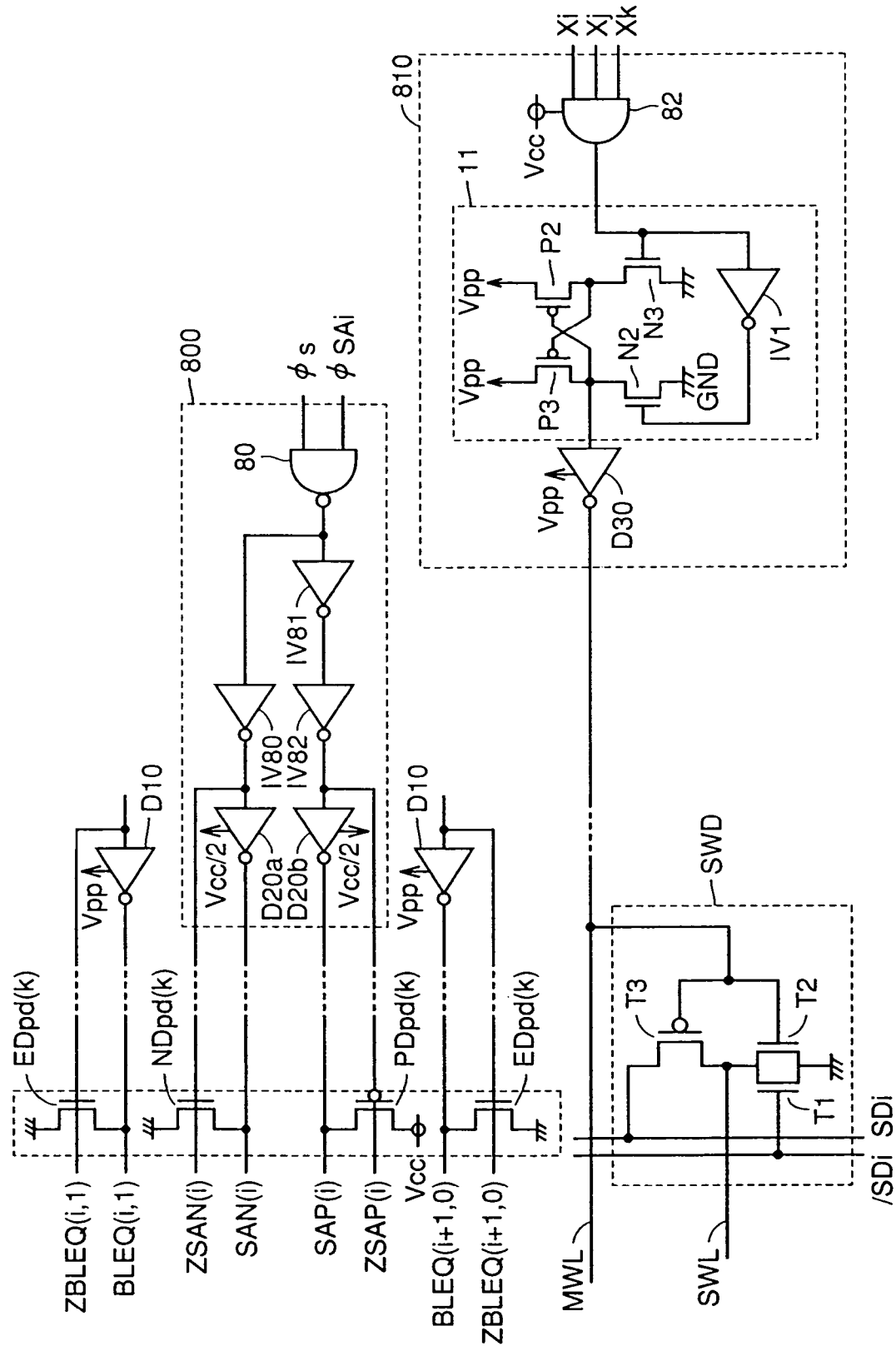
FIG. 54 is a diagram for illustrating the structures of a sense signal generation circuit 800 and a signal generation circuit 810.

FIG. 54 shows the structures of a sense signal generation circuit generating sense amplifier activation signals and a signal generation circuit generating a signal for driving a main word line. FIG. 54 representatively shows a sense signal generation circuit 800 generating the sense amplifier activation signals SAN(i) and SAP(i) and a signal generation circuit 810 driving a single main word line, for example.

The sense signal generation circuit 800 includes a NAND circuit 80 receiving a sense amplifier driving timing signal φs generated in row selection and a sense amplifier zone activation signal φSAi for activating an i-th sense amplifier zone, inverters IV80 to IV82 and the drivers D20a and D20b.

The inverter IV80 inverts an output of the NAND circuit 80 and outputs a signal ZSAN(i). The driver D20a receives the signal ZSAN(i) and outputs the sense amplifier activation signal SAN(i). The output of the inverter IV80 is supplied to a driving wire ZSAN(i).

The inverters IV81 and IV82 are serially connected to an output node of the NAND circuit 80. The inverter IV82 outputs a signal ZSAP(i). The driver D20b receives the signal ZSAP(i) and outputs the sense amplifier activation signal SAP(i). The output of the inverter IV82 is supplied to a driving wire ZSAP(i).

The signal generation circuit 810 includes a row decoder (AND circuit) 82 receiving address signals Xi, Xj and Xk, a level shifter 11 and a driver D30. The row decoder 82 is supplied with the internal power supply voltage Vcc as an operating power source, and the driver D30 is supplied with the step-up power supply voltage Vpp as an operating power source.

The level shifter 11 is formed by transistors P2, P3, N2 and N3 and an inverter IV1, while the inverter IV1 and the gate of the transistor N2 receive an output of the row decoder 82. The driver D30, connected with a main word line MWL, inverts a signal from a node between the transistors P3 and N3 and outputs the inverted signal to the main word line MWL.

When at least one of the input three address signals Xi, Xj and Xk is low, the main word line MWL goes high (the step-up power supply voltage level Vpp). When all of the input three signals Xi, Xj and Xk are high, the main word line MWL goes low.

Figure 55:
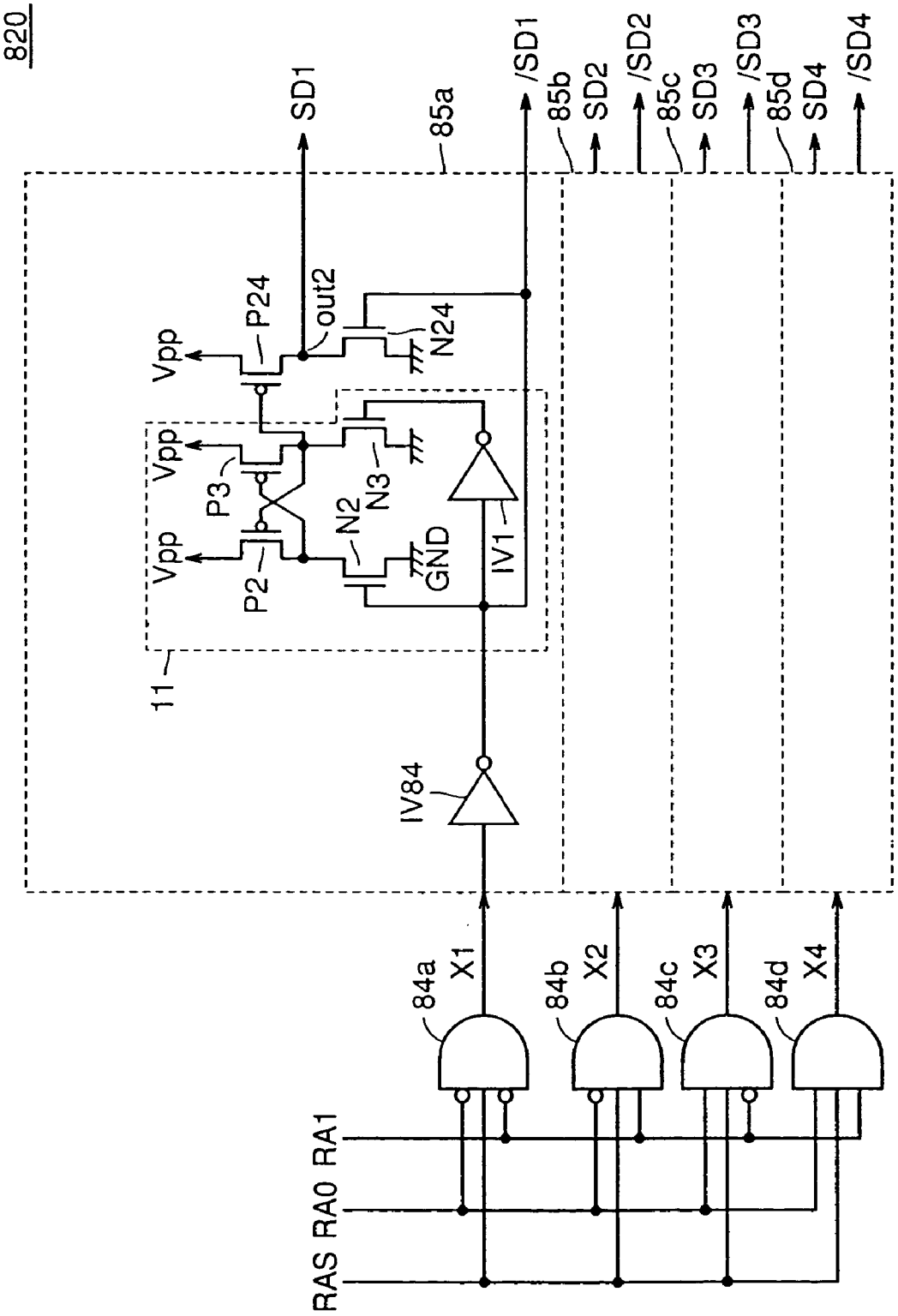
FIG. 55 illustrates the structure of an SD signal generation circuit 820.

An SD signal generation circuit 820 generating sub word signals has a structure shown in FIG. 55. FIG. 55 representatively shows an exemplary structure of the SD signal generation circuit 820 generating sub word signals SD1 to SD4 and /SD1 to /SD4 in response to row addresses RA0 and RA1.

Referring to FIG. 55, the SD signal generation circuit 820 includes logic circuits 84*a* to 84*d* and signal generation circuits 85*a* to 85*d*, provided in correspondence to the logic circuits 84*a* to 84*d* respectively, each including an inverter IV84, a level shifter 11, a PMOS transistor P24 and an NMOS transistor N24. The signal generation circuits 85*a* to 85*d* are identical in structure to each other.

The logic circuits 84*a* to 84*d* receive the row addresses RA0 and RA1 and output decoded signals X1 to X4. The logic circuit (NOR circuit) 84*a* outputs the AND (the decoded signal X1) of inverted signals of the row addresses RA0 and RA1, and the logic circuit 84*b* outputs the AND (the decoded signal X2) of the inverted signal of the row address RA0 and the row address RA1. The logic circuit 84*c* outputs the AND (the decoded signal X3) of the row address RA0 and the inverted signal of the row address RA1, and the logic circuit (AND circuit) 84*d* outputs the AND (the decoded signal X4) of the row addresses RA0 and RA1. A raw address strobe signal RAS is further input in the logic circuits 84*a* to 84*d*.

The inverters IV84 included in the signal generation circuits 85*a* to 85*d* invert outputs of the corresponding logic circuits 84*a* to 84*d* and output the sub word signals/SD1 to /SD4. As to the level shifter 11 included in each of the signal generation circuits 85*a* to 85*d*, the inverter IV1 and the gates of the transistors N2 and N24 receive an output of the corresponding inverter IV84.

The transistors P24 and N24 are connected between a node receiving the step-up power supply voltage Vpp and a node receiving the ground potential. The gate of the transistor P24 receives a signal from a node between the transistors P3 and N3 of the corresponding level shifter 11. Nodes out2 between the transistors P24 and N24 in the signal generation circuits 85*a* to 85*d* output the sub word signals SD1 to SD4 respectively.

Figure 56:
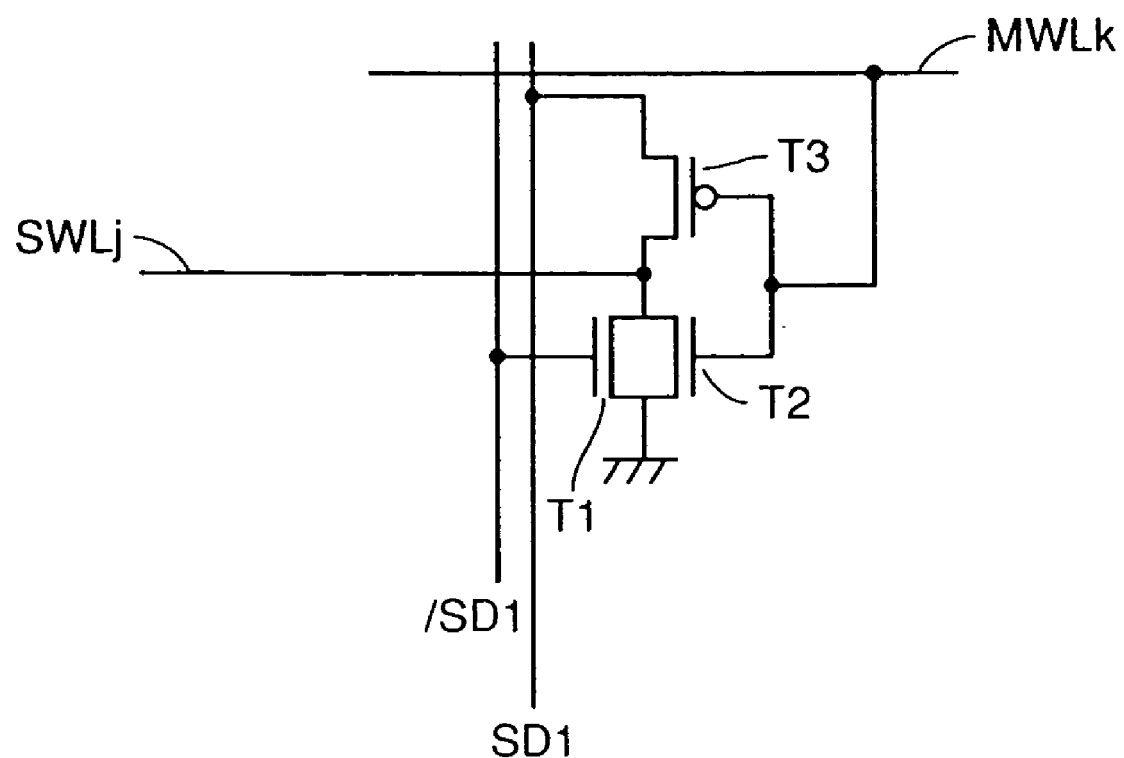
FIG. 56 illustrates the relation between a sub word driver SWD and sub word signals.

As shown in FIG. 56, each pair of sub word signals SD1 and /SD1 (SD1 and /SD1, SD2 and /SD2, SD3 and /SD3 or SD4 and /SD4) and a main word line MWLk drive a single sub word line SWLj.

Figure 57:
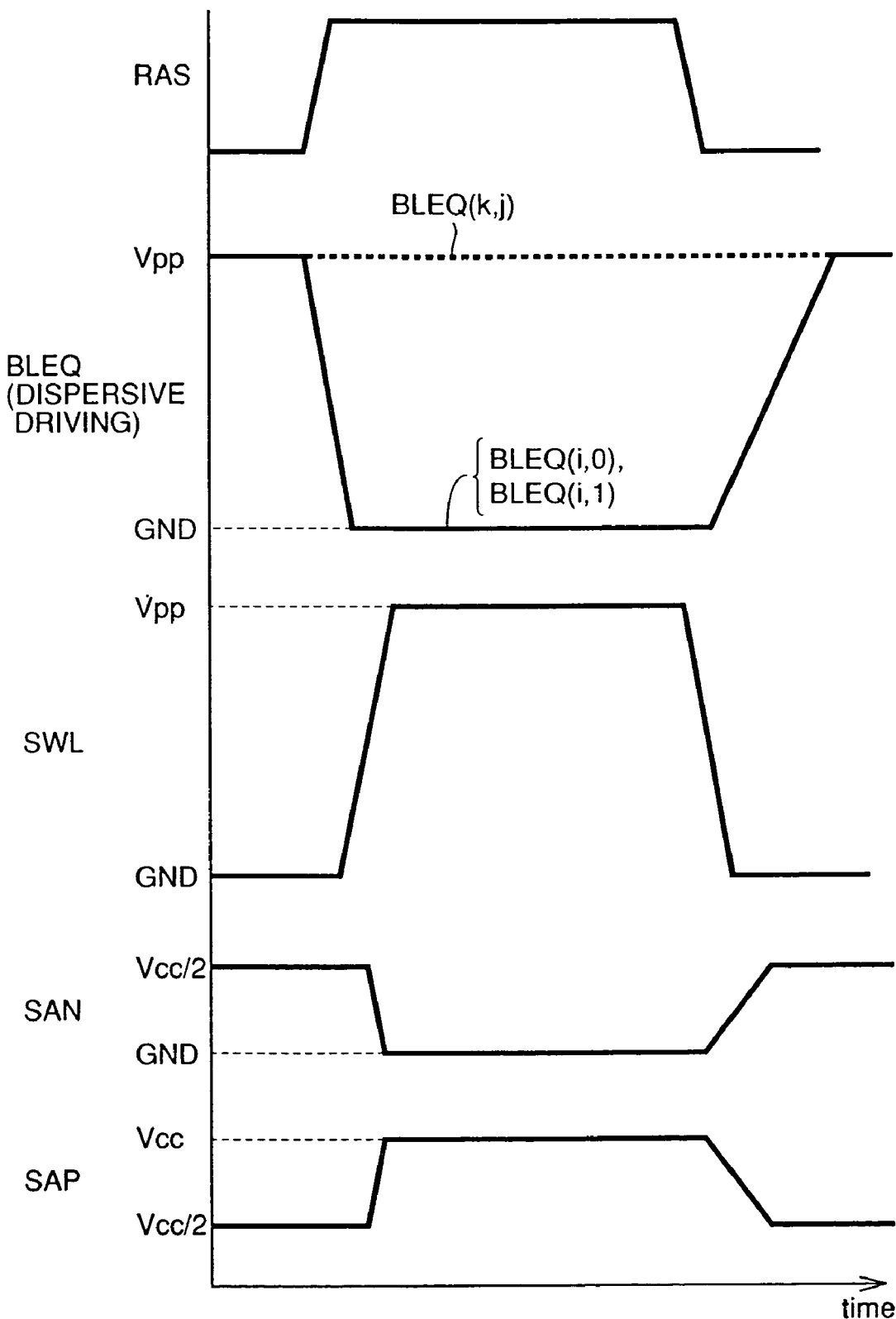
FIG. 57 is a timing chart showing changes of equalization signals according to the tenth embodiment of the present invention.

Operation timing according to the tenth embodiment of the present invention is described with reference to FIG. 57. Referring to FIG. 57, symbols BLEQ(i,0) and BLEQ(i,1) express equalization signals corresponding to a selected memory cell block Mi, and symbol BLEQ(k,j) expresses an equalization signal corresponding to a non-selected memory cell block respectively. Symbol SWL expresses a selected sub word line and symbol SAN expresses a sense amplifier activation signal supplied to an activated sense amplifier. The sense amplifier activation signal SAN takes two states including a level ½ Vcc half the internal power supply voltage Vcc and the level GND.

The row address strobe signal RAS goes high in an active period and goes low in a standby period.

In the standby state, the equalization signals are at the level Vpp. The sub word line SWL is at the level GND. The sense amplifier activation signal SAN is at the level ½ Vcc.

A row of the memory cell block Mi is selected according to an input external row address. The local driver EDpd rapidly brings the equalization signals BLEQ(i,0) and BLEQ(i,1) corresponding to the selected memory cell block Mi to the level GND.

The equalization signal BLEQ(k,j) corresponding to the non-selected memory cell block keeps the level Vpp.

The gate control signals are driven to selectively couple the memory cell block Mi with the sense amplifier zone.

Thereafter the potential of the sub word line SWL rises to the level Vpp. Charges stored in memory cells are read on bit lines. The sense amplifier activation signal SAN falls from the level Vcc/2 to the level GND. Sense amplifiers are activated.

When the active period is ended, the selected sub word line SWL enters a non-selected state (the level GND). The sense amplifier activation signal SAN returns to the level ½ Vcc and the sense amplifiers are inactivated. The equalization signals BLEQ(i,0) and BLEQ(i,1) rise to the level Vpp (return to the standby state) through the BLEQ driver D10, and all gate control signals enter a standby state.

The equalization signals and the sense amplifier activation signals are made to fall and the potential of the sub word line is made to rise at the head of the active period for coupling the memory cell block with the sense amplifier zone. Therefore, the access time is reduced by speeding up these operations. According to the tenth embodiment of the present invention, therefore, the driver D10 and the local driver EDpd make the equalization signals rapidly fall while the drivers D20*a* and D20*b* and the local drivers NDpd and PDpd rapidly drive the sense amplifier activation signals.

The following specific effects result from the aforementioned structure and operations: First, when transistors driving equalization signals BLEQ are present only on ends of equalization wires BLEQ and transistors (sense amplifier driving transistors) driving sense amplifier activation signals are similarly present only on ends of wires transmitting these signals, area restriction is disadvantageously caused to increase the chip area.

Particularly when the equalization circuits EQ are provided in correspondence to sense amplifiers and arranged between the selection gates and the sense amplifiers, transistors of the equalization circuits EQ and those of the sense amplifiers are arranged on close positions. Therefore, the aforementioned problem particularly remarkably appears between regions provided with these transistors, the aforementioned wires transmitting the equalization signals and the wires transmitting the sense amplifier activation signals.

The aforementioned problem can be solved by arranging the equalization circuits EQ between the selection gates and the memory cell array and dispersively arranging the sense amplifier driving transistors according to the tenth embodiment of the present invention.

In this case, no source-to-drain channel resistance of transistors forming the selection gates is interposed between the equalization circuits EQ and the bit lines. When starting equalization of the bit lines in the reset operation, therefore, the equalization can be speeded up. The dispersively arranged drivers speed up resetting of the sense amplifier driving transistors. Therefore, the reset operation can be speeded up through combination thereof.

Second, if speeding up fall of the equalization signals BLEQ in a dispersive driving system when starting an active cycle and speeding up the operations of driving and activating the sense amplifiers in the dispersive driving system, the effect of speeding up the access time is improved.

Third, if speeding up fall of the equalization signals BLEQ in the dispersive driving system when starting the active cycle and speeding up operations of selecting and making word lines rise in a hierarchical word line structure, the effect of speeding up the access time is improved.

Needless to say, it is more effective than a plurality of combinations of the aforementioned first, second and third effects. Particularly when combining the first, second and third effects, it is possible to speed up the operations in the active period for making the equalization signals fall, selecting the word lines and activating the sense amplifiers and the operations in the reset period for bringing the word lines into a non-selected state, inactivating the sense amplifiers and making the equalization signals rise, to remarkably contribute speed increase of the access time.

Eleventh Embodiment

In an eleventh embodiment of the present invention, equalization signals BLEQ are subjected to three-valued control, while equalization circuits EQ are provided for pairs of bit lines and arranged between selection gates and a memory cell array.

Figure 58:
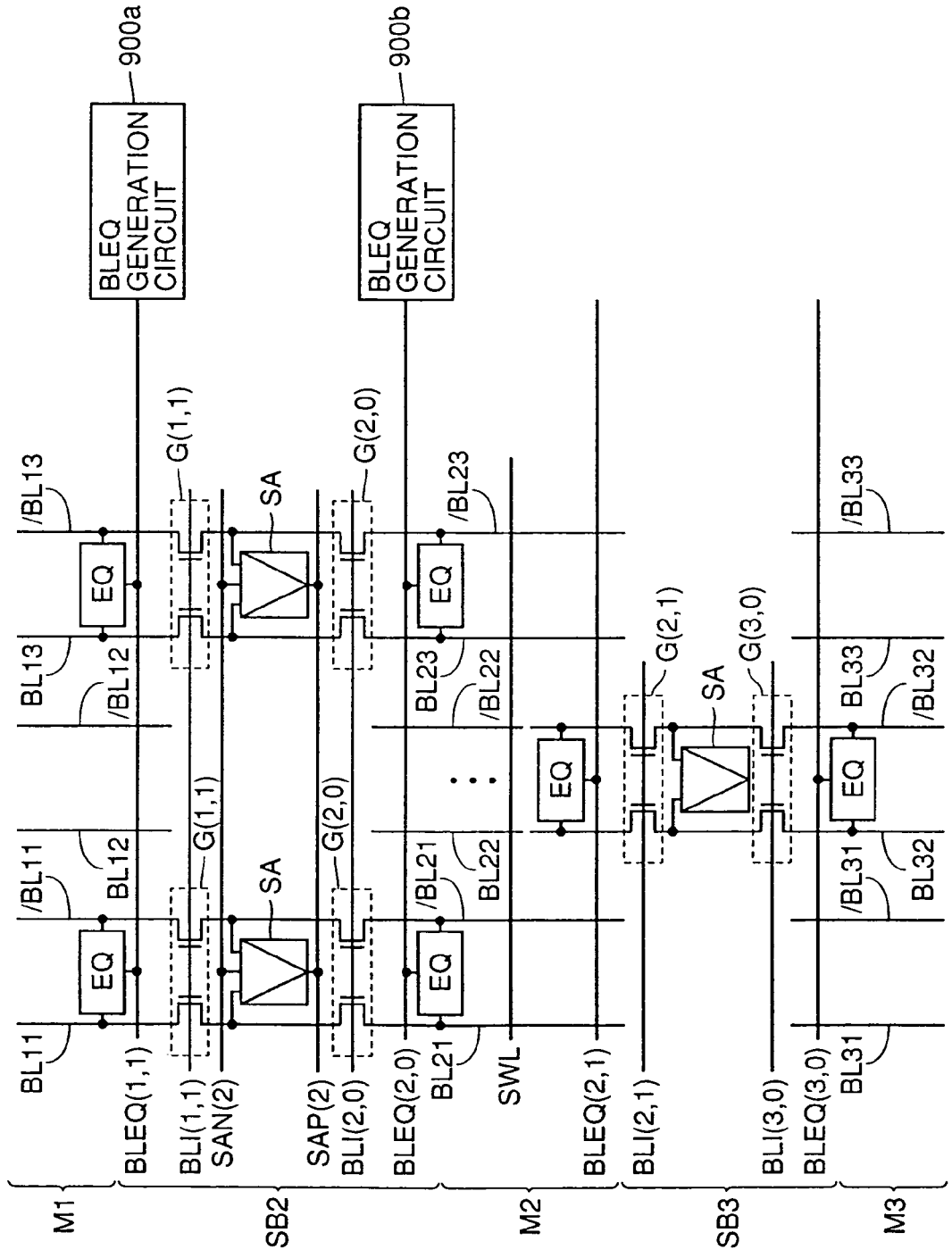
FIG. 58 illustrates the structure of a principal part of a semiconductor device according to an eleventh embodiment of the present invention.

Referring to FIG. 58, BLEQ generation circuits 900a, 900b, . . . , connected with equalization wires BLEQ, for generating equalization signals perform three-valued control for returning the equalization signals from a level GND to a level Vcc and to a level Vpp particularly when making the equalization signals BLEQ rise. In this case, power consumption is reduced in a system generating a step-up power supply voltage Vpp along with an effect attained through the arrangement of the equalization circuits in an operation of making the equalization signals BLEQ rise at the end of an active cycle.

When dispersively arranging the aforementioned local drivers EDpd, the operation for making the equalization signals fall is speeded up.

Figure 59:
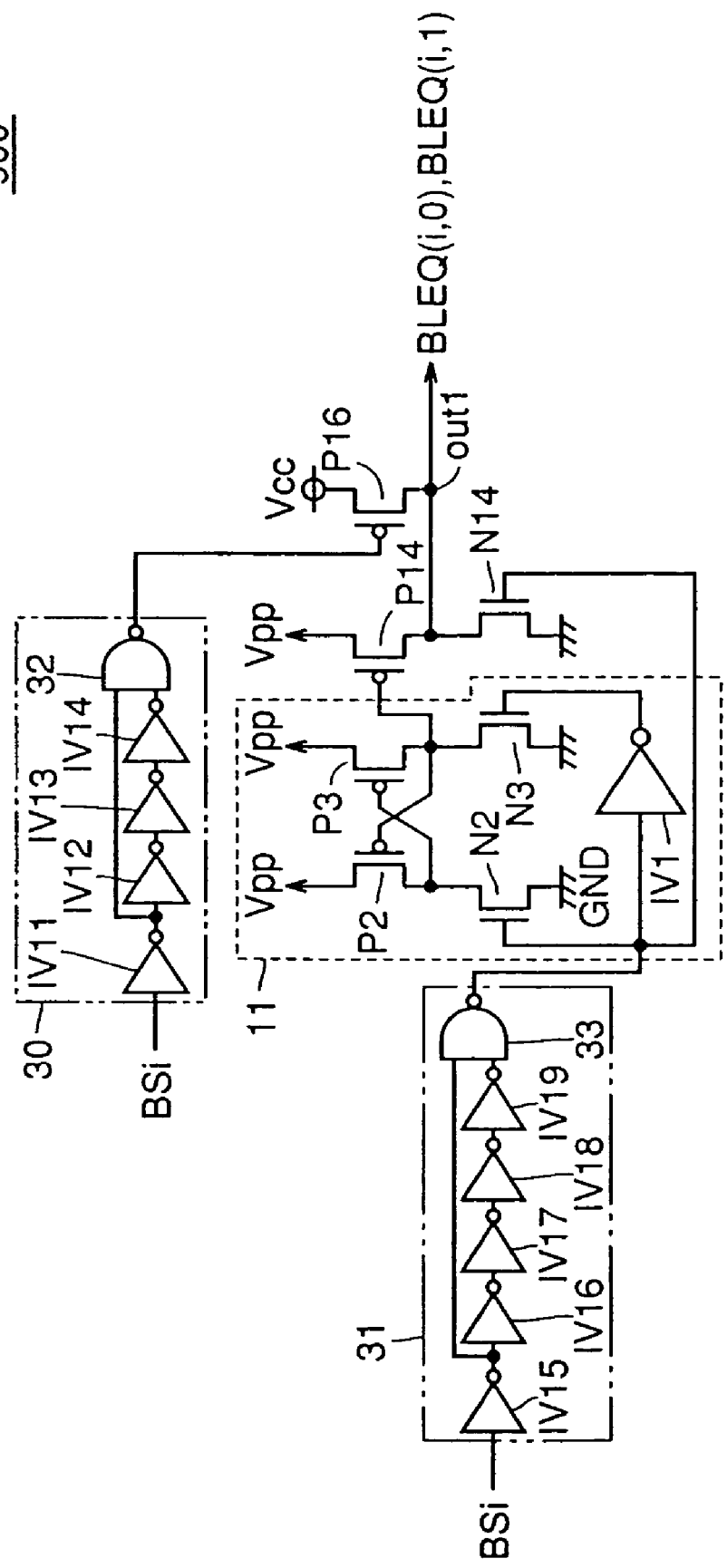
FIG. 59 is a circuit diagram for illustrating a BLEQ generation circuit 900 according to the eleventh embodiment of the present invention.

An exemplary BLEQ generation circuit 900 making equalization signals transition between the level GND, the level Vcc and the level Vpp is described with reference to FIG. 59. Referring to FIG. 59, the BLEQ generation circuit 900 generates equalization signals BLEQ(i,0) and BLEQ(i,1).

The BLEQ generation circuit 900 includes a pulse generation circuit 30 formed by inverters IV11 to IV14 and a NAND circuit 32, a pulse generation circuit 31 formed by inverters IV15 to IV19 and a NAND circuit 33, a level shifter 11 and transistors P14, N14 and P16.

The gate of a transistor N2 and an inverter IV1 included in the level shifter 11 receive an output of the pulse generation circuit 31. The transistors P14 and N14 are connected between the step-up power supply voltage Vpp and a ground voltage GND, while the gate of the transistor P14 receives an output of the level shifter 11 and the gate of the transistor N14 receives the output of the pulse generation circuit 31. The pulse generation circuits 30 and 31 receive a block selection signal BSi.

In the BLEQ generation circuit 900, a node out1 between the transistors P14 and N14 outputs the equalization signals BLEQ(i,0) and BLEQ(i,1).

The transistor P16 is connected between the internal power supply voltage Vcc and the node out1, and receives an output of the pulse generation circuit 30 in its gate.

Figure 60:
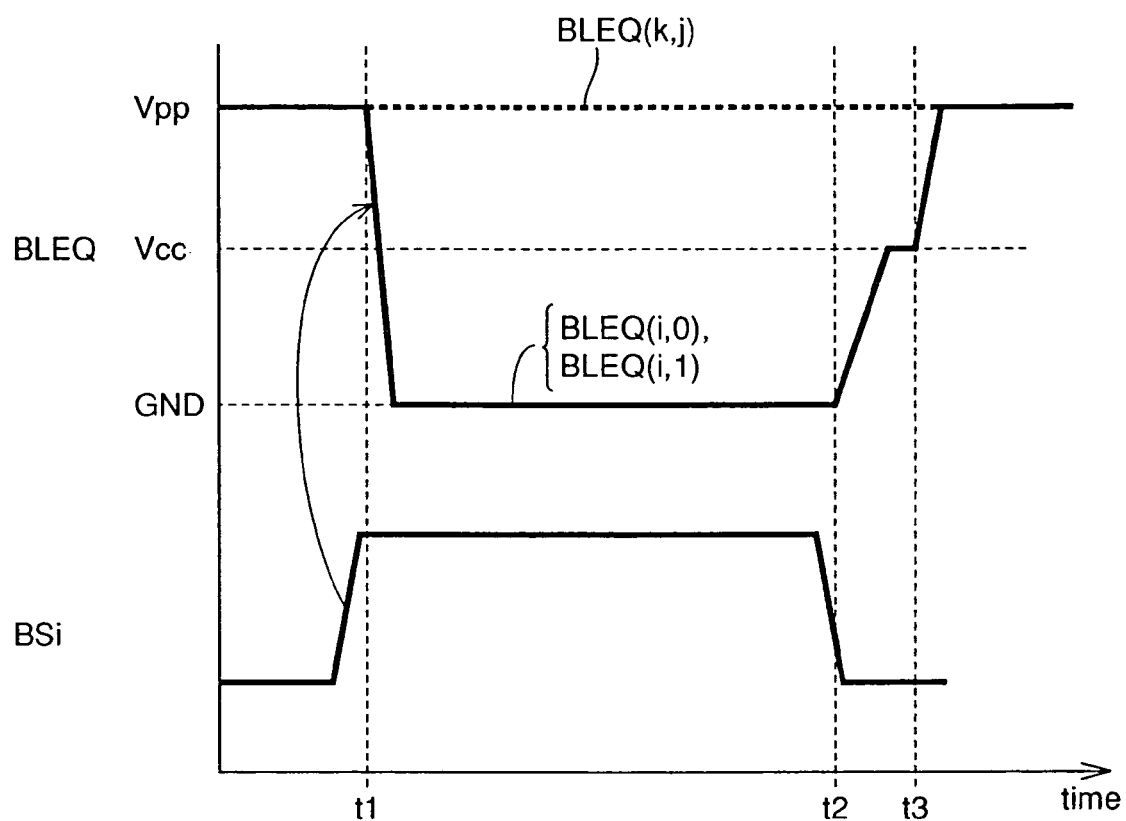
FIG. 60 is a timing chart showing changes of equalization signals according to the eleventh embodiment of the present invention.

According to the BLEQ generation circuit 900, the equalization signals change as shown in FIG. 60. Referring to FIG. 60, symbols BLEQ(i,0) and BLEQ(i,1) denote the equalization signals for a selected memory cell block Mi, and symbol BLI(k,j) denotes an equalization signal corresponding to a non-selected memory cell block. All equalization signals are at the level Vpp in a standby state.

When the memory cell block Mi is selected (time t1), the block selection signal BSi goes high. The equalization signals BLEQ(i,0) and BLEQ(i,1) reach the level GND.

An active period is ended and the block selection signal BSi goes low (time t2). The transistor P16 is turned on, the equalization signals BLEQ(i,0) and BLEQ(i,1) reach the level Vcc, and the transistor P14 is turned on to further pull up the equalization signals BLEQ(i,0) and BLEQ(i,1) to the level Vpp (time t3).

The step-up power supply voltage Vpp is not consumed when the equalization signals BLEQ(i,0) and BLEQ(i,1) rise from the level GND to the level Vcc, and hence current consumption in a system generating the step-up power supply voltage Vpp can be reduced as compared with the case of making the equalization signals BLEQ(i,0) and BLEQ(i,1) rise from the level GND to the level Vpp at once. Further, a load in a Vpp generation circuit can be reduced to attain an effect of reducing the area of the Vpp generation circuit. While it takes some time to make the equalization signals BLEQ rise in the case of a three-valued control system, this problem is solved by providing the equalization circuits for the respective pairs of bit lines, thereby enabling implementation of a reset time with no hindrance.

While the level Vcc is employed as the intermediate level when making the equalization signals BLEQ rise from the level GND to the level Vpp, the intermediate level is not restricted to the level Vcc but may be formed by an external power supply voltage ExtVcc.

Twelfth Embodiment

According to a twelfth embodiment of the present invention, equalization circuits are arranged between selection gates and a memory cell array, while gate control signals BLI are dispersively driven.

Figure 61:
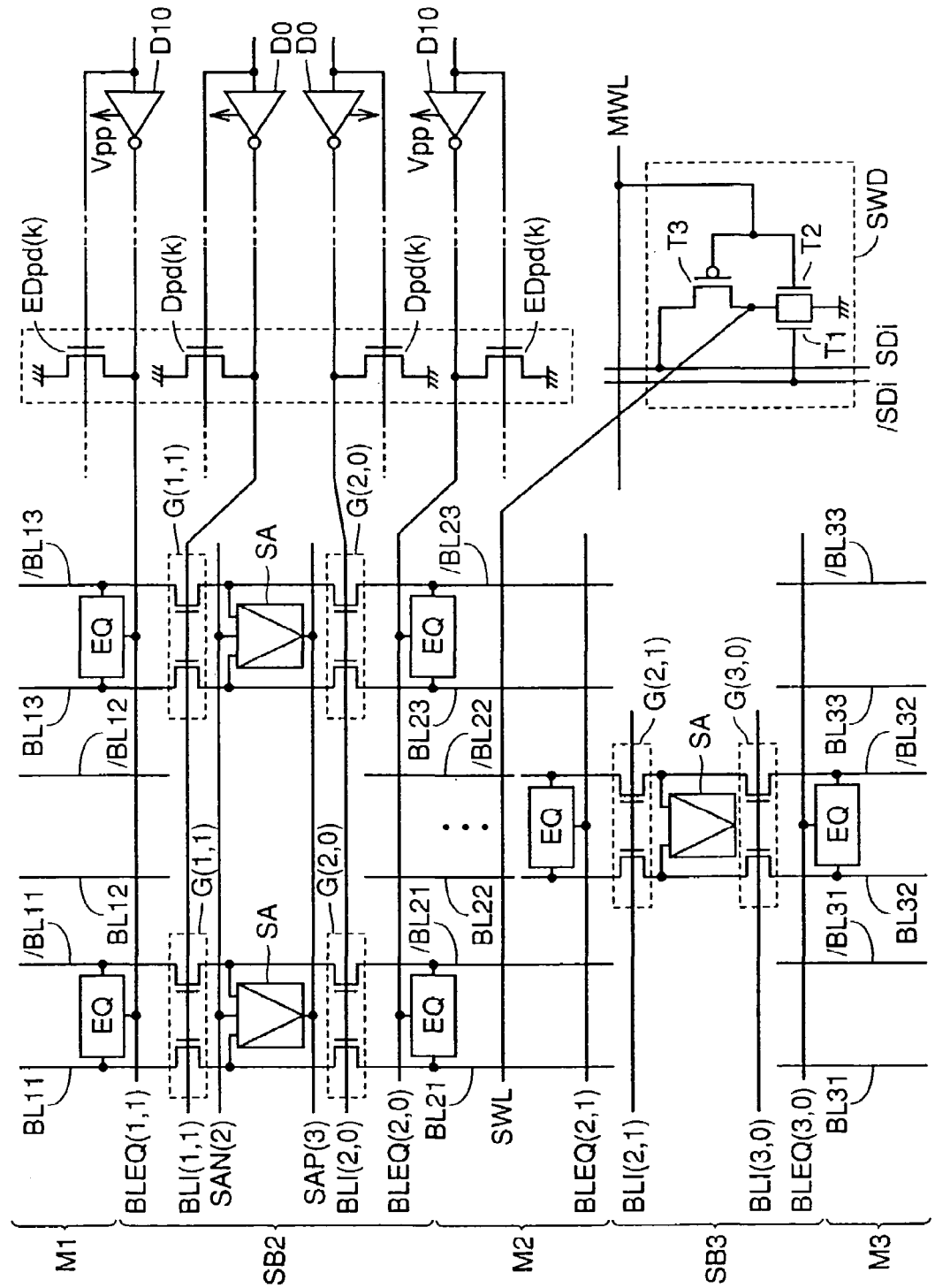
FIG. 61 illustrates the structure of a principal part of a semiconductor device according to a twelfth embodiment of the present invention.

Referring to FIG. 61, equalization circuits are arranged between selection gates and a memory cell array, as described with reference to the ninth embodiment. BLEQ drivers D10 are arranged and local drivers EDpd are dispersively arranged on wires transmitting equalization signals. FIG. 61 shows local drivers EDpd(k), for example.

Further, BLI drivers D0 are arranged and local drivers DPd are dispersively arranged on BLI wires transmitting gate control signals. FIG. 61 shows local drivers Dpd(k), for example.

The local drivers EDpd and Dpd are arranged on or between sub word driver zones SWB.

Figure 62:
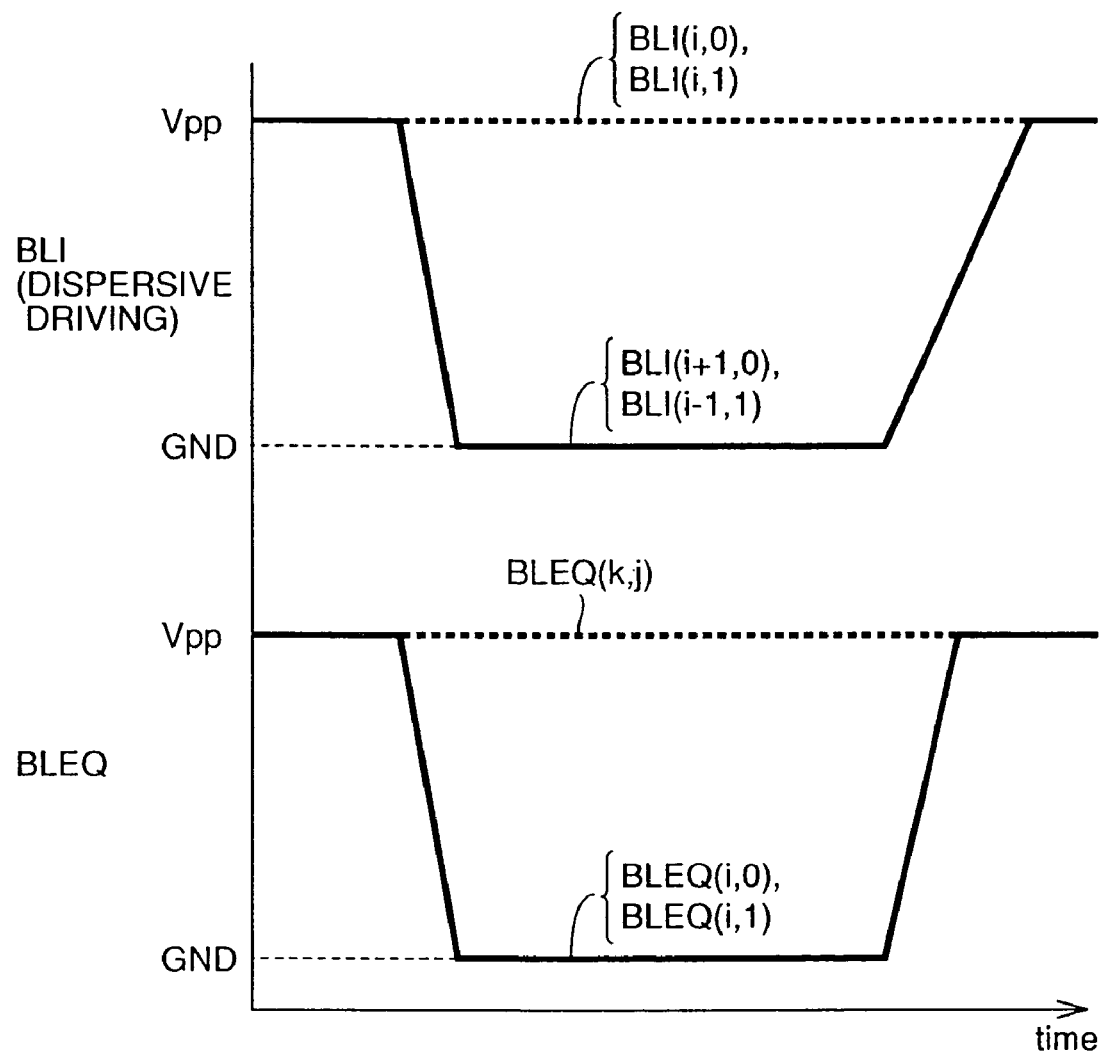
FIG. 62 is a timing chart showing operations according to the twelfth embodiment of the present invention.

Operation timing according to the twelfth embodiment of the present invention is described with reference to FIG. 62. Referring to FIG. 62, symbols BLEQ(i,0) and BLEQ(i,1) denote equalization signals corresponding to a selected memory cell block Mi and symbol BLEQ(k,j) denotes an equalization signal corresponding to a non-selected memory cell block respectively. All equalization signals are at a level Vpp in a standby state.

Symbols BLI(i,0) and BLI(i,1) denote gate control signals for the selected memory cell block Mi, and symbols BLI(i+1,0) and BLI(i−1,1) denote gate control signals controlling coupling between sense amplifier zones coupled with the memory cell block Mi and memory cell blocks Mi+1 and Mi−1 respectively. All gate control signals are at the level Vpp in the standby state.

When an active cycle is started, the dispersively arranged local drivers Dpd bring the gate control signals BLI(i+1,0) and BLI(i−1,1) to a level GND at a high speed. The equalization signals BLEQ(i,0) and BLEQ(i,1) reach the level GND.

When the active cycle is ended, the gate control signals BLI(i,0) and BLI(i,1) and the equalization signals BLEQ(i,0) and BLEQ(i,1) return to the standby state.

While a level Vcc is employed as an intermediate level of the gate control signals BLI, the intermediate level is not restricted to this but may alternatively be formed by an external power supply voltage ExtVcc.

Fall of the gate control signals BLI is speeded up by a dispersive driving system when starting the active cycle. Thus, high-speed access is implemented.

While rise of the gate control signals BLI is not dispersively driven when ending the active cycle, the operation speed is not hindered due to the effect attained by arranging the equalization circuits between the selection gates and the memory cell array. Equalization can be performed regardless of rise of the gate control signals, whereby a reset time is implemented with no hindrance. Further, the area is reduced since no dispersive driving transistors are arranged for making the signals rise.

Thirteenth Embodiment

According to a thirteenth embodiment of the present invention, equalization circuits are arranged between selection gates and a memory cell array, and gate control signals BLI are subjected to three-valued control.

Figure 63:
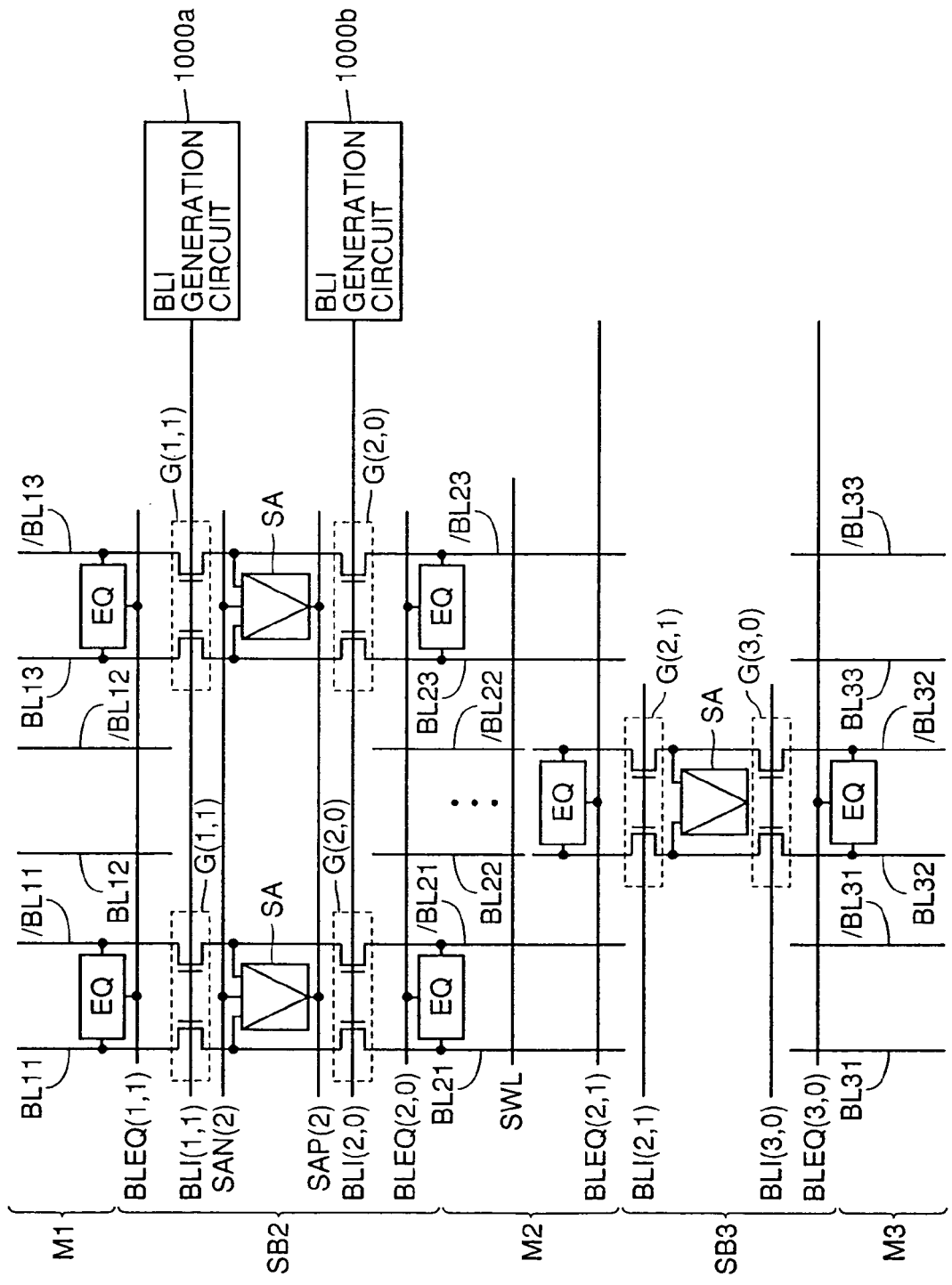
FIG. 63 illustrates the structure of a principal part of a semiconductor device according to a thirteenth embodiment of the present invention.

Referring to FIG. 63, equalization circuits are arranged between selection gates and a memory cell array, as described with reference to the ninth embodiment.

BLI generation circuits 1000*a*, 1000*b*, . . . connected with BLI wires drive gate control signals BLI to change from a level GND to a level VCC and further to a level Vpp when rising.

The BLI generation circuits 1000*a*, . . . may be formed by the BLI generation circuits 300, 305, 310 or 315 described with reference to the third embodiment of the present invention, for example.

Figure 64:
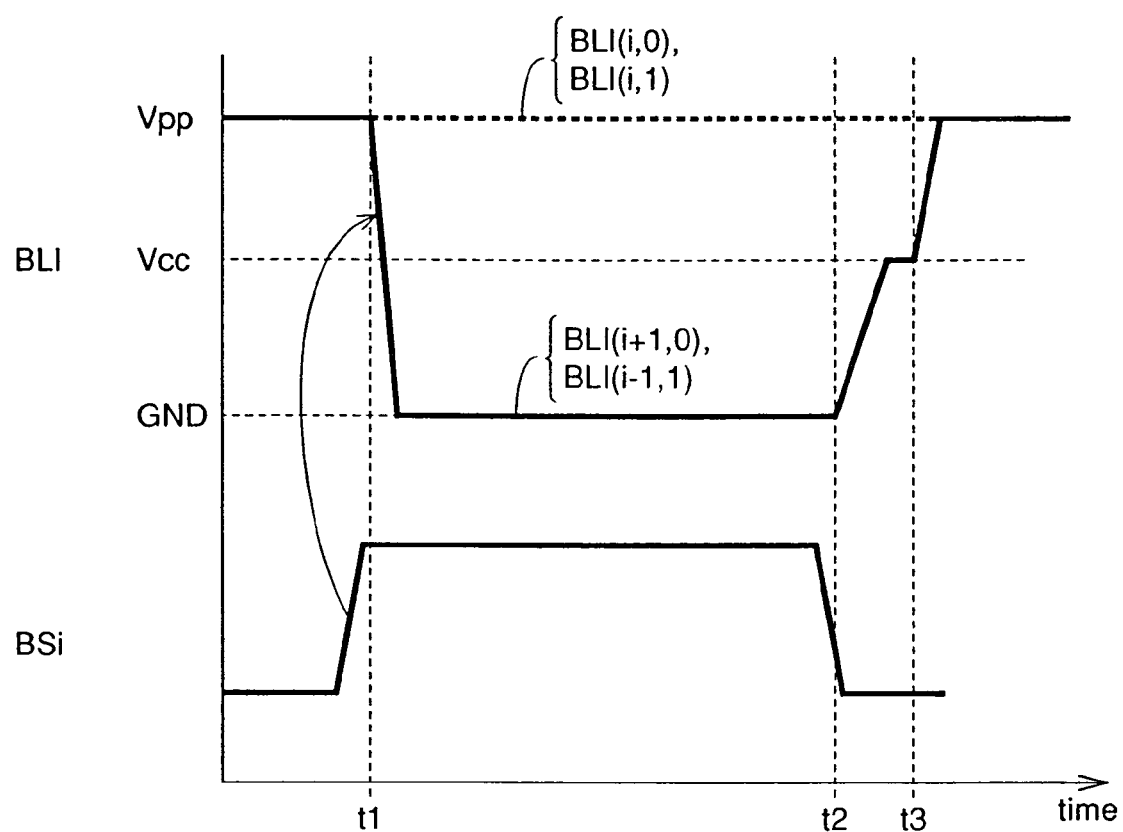
FIG. 64 is a timing chart showing operations of the semiconductor device according to the thirteenth embodiment of the present invention.

Operation timing according to the thirteenth embodiment of the present invention is described with reference to FIG. 64. Referring to FIG. 64, symbols BLI(i,0) and BLI(i,1) denote gate control signals for a selected memory cell block Mi, and symbols BLI(i+1,0) and BLI(i−1,1) denote gate control signals controlling coupling between sense amplifier zones coupled with the memory cell block Mi and memory cell blocks Mi+1 and Mi−1 respectively. All gate signals are at a level Vpp in a standby state.

When an active cycle is started (time t1), the gate control signals BLI(i+1,0) and BLI(i−1,1) fall from the level Vpp to a level GND. When dispersively arranging local drivers Dpd, the gate control signals BLI(i+1,0) and BLI(i−1,1) can fall to a low level at a higher speed. Thus, high-speed access is implemented.

When the active cycle is ended (time t2), the gate control signals BLI(i+1,0) and BLI(i−1,1) change from the level GND to a level Vcc, and further change from the level Vcc to the level Vpp (time t3).

The gate control signals BLI(i+1,0) and BLI(i−1,1) consume no step-up power supply voltage Vpp when rising from the level GND to the level Vcc, and hence current consumption in a system generating the step-up power supply voltage Vpp can be reduced as compared with the case of making the gate control signals BLI(i+1,0) and BLI(i−1,1) rise from the level GND to the level Vpp at once. Further, a load in a Vpp generation circuit can be reduced to attain an effect of reducing the area of the Vpp generation circuit. While it takes some time to make equalization signals BLEQ rise in the case of the three-valued control system, this problem is solved by providing equalization circuits for respective pairs of bit lines, to enable implementation of a reset time with no hindrance.

Fourteenth Embodiment

A fourteenth embodiment of the present invention is described with reference to three-valued control of signals having an amplitude Vpp switched between levels GND and Vpp. For example, sub word signals SD are subjected to three-valued control.

A sub word driver driving a sub word line with a main word line and a set of sub word signals is described above. A single main word line is divided into four sub word lines, and a single sub word line is selected by sub word signals SD1 and /SD1, SD2 and /SD2, SD3 and /SD3 or SD4 and /SD4. The main word line and the sub word lines are wired perpendicularly to each other.

Figure 65:
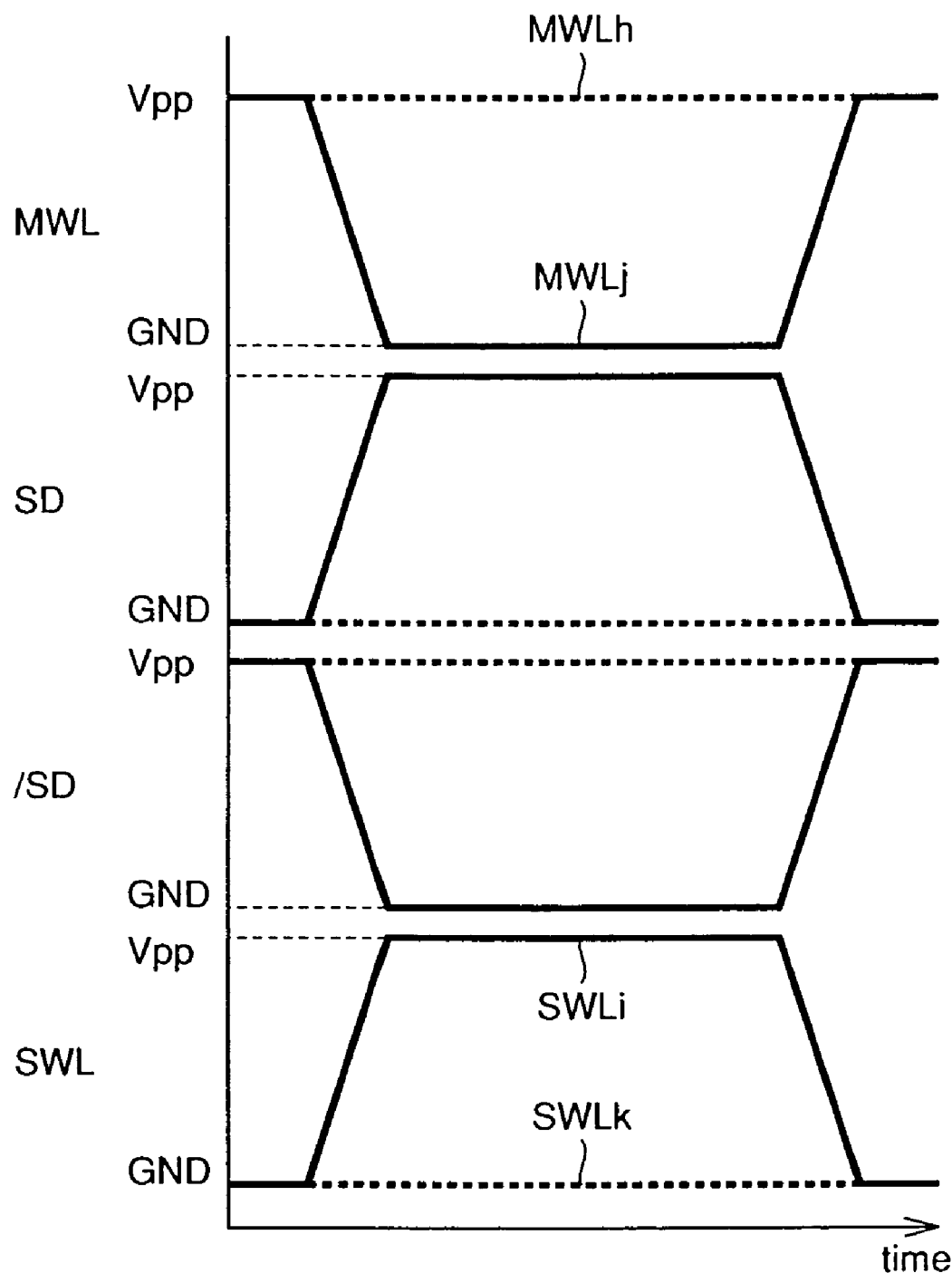
FIG. 65 is a timing chart showing operations corresponding to a two-valued control system for sub word lines.

Two-valued control for sub word lines is described with reference to FIG. 65. Referring to FIG. 65, symbol MWLj denotes a selected main word line, symbol MWLh denotes a non-selected main word line, symbol SWLi denotes a selected sub word line and symbol SWLk denotes a non-selected sub word line respectively. In a standby state, all main word lines are at the level Vpp, and all sub word lines are at the level GND.

When the main word line MWLj goes low (changes from the level Vpp to the level GND) and a sub word signal SDi (i=1, 2, 3 or 4) goes high (the level Vpp) and a corresponding sub word signal/SDi goes low (the level GND), a single sub word line SWLi reaches the level Vpp. Thus, it follows that a single word line is selected. The non-selected sub word line SWLk keeps the level GND.

Figure 66:
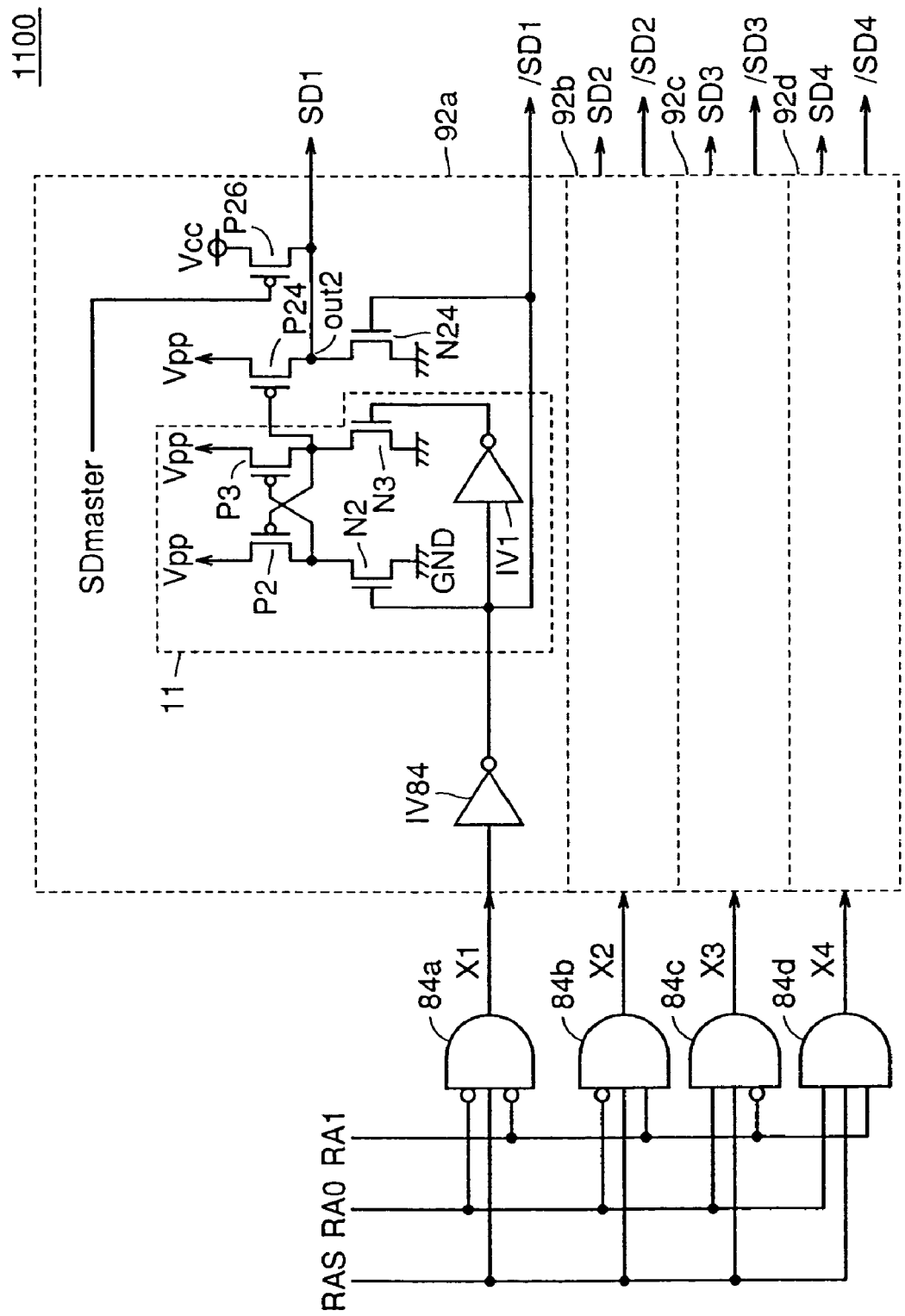
FIG. 66 illustrates the structure of an SD signal generation circuit 1100 according to a fourteenth aspect of the present invention.

According to the fourteenth embodiment of the present invention, on the other hand, sub word signals are subjected to three-valued control. FIG. 66 shows an SD signal generation circuit 1100 performing three-valued control. FIG. 66 representatively shows an exemplary structure of the SD signal generation circuit 1100 generating sub word signals SD1 to SD4 and /SD1 to /SD4 in response to row addresses RA0 and RA1, for example.

Referring to FIG. 66, the SD signal generation circuit 1100 includes logic circuits 84*a* to 84*d* and signal generation circuits 92*a* to 92*d*, provided in correspondence to the logic circuits 84*a* to 84*d* respectively, each including an inverter IV84, a level shifter 11, an NMOS transistor N24 and PMOS transistors P24 and P26. The signal generation circuits 92*a* to 92*d* are identical in structure to each other.

The relation between the logic circuits 84*a* to 84*d*, the inverter IV84, the level shifter 11 and the transistors P24 and N24 is identical to that in the SD signal generation circuit 820.

In the SD signal generation circuit 1100, the transistor P26 is further connected between a node out2 of the transistors P24 and N24 and an internal power supply voltage Vcc. The gate of the transistor P26 receives a signal SDmaster. The potential of the signal SDmaster changes according to a row address strobe signal RAS.

The nodes out2 output the sub word signals SD1 to SD4, and the inverters IV84 output the sub word signals/SD1 to /SD4.

Figure 67:
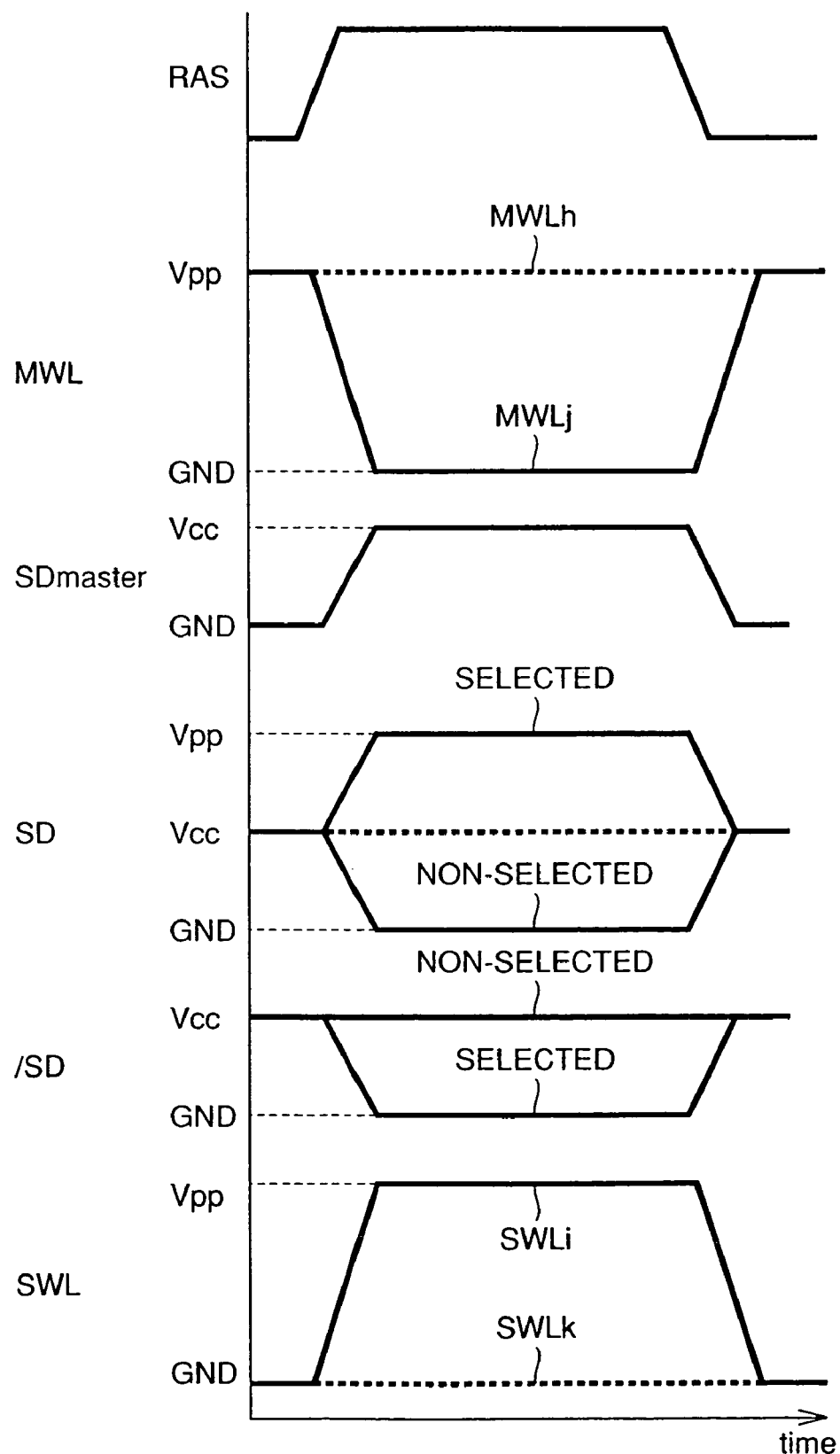
FIG. 67 is a timing chart showing operations according to the fourteenth embodiment of the present invention.
Figure 69:
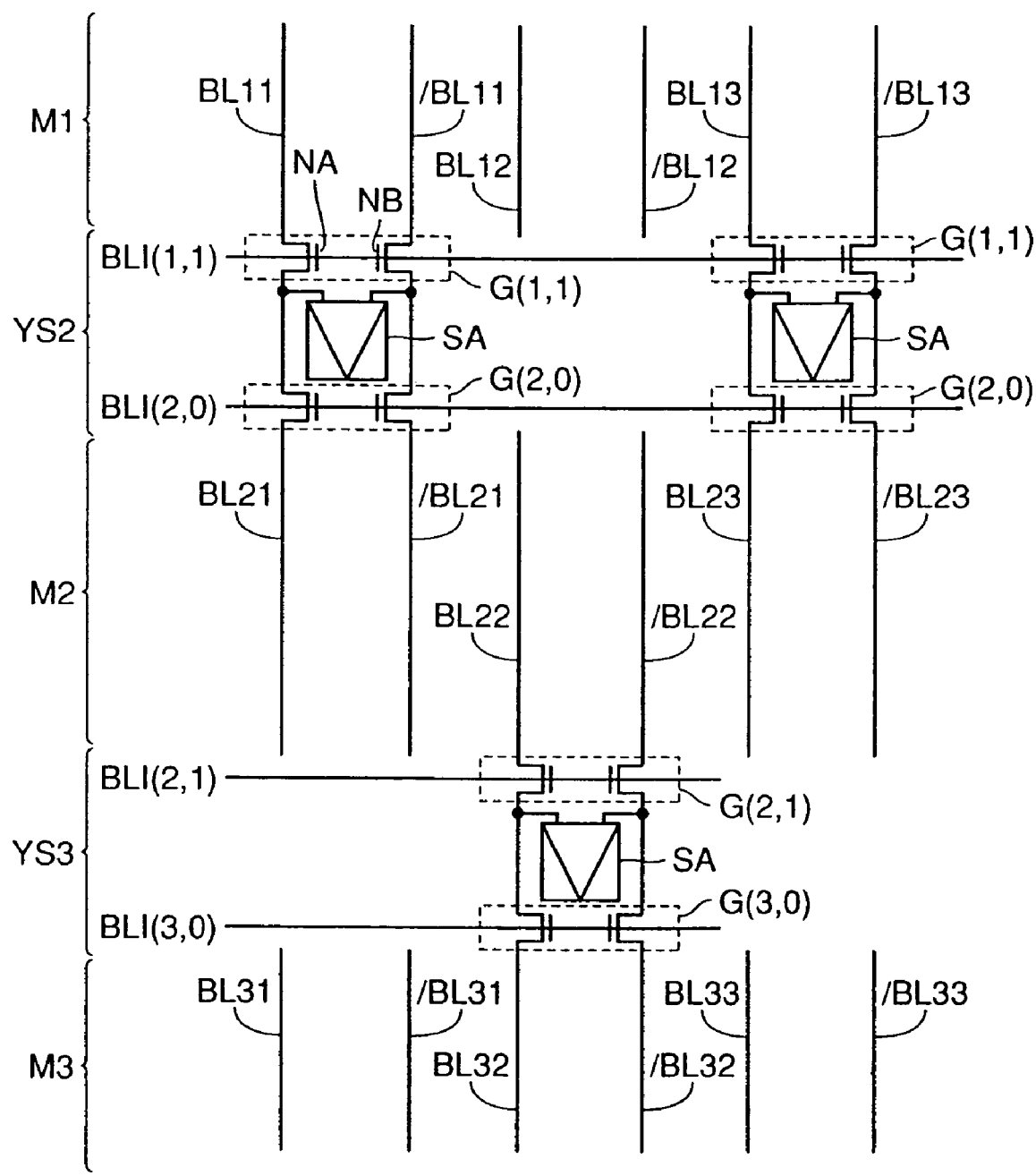
Figure 70:
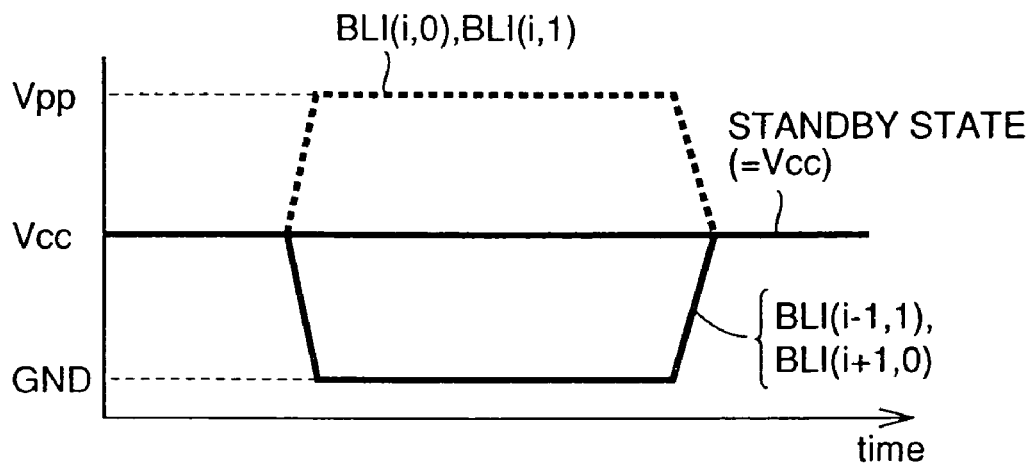
FIGS. 70 and 71 illustrate exemplary methods of driving a conventional shared sense amplifier.
Figure 71:
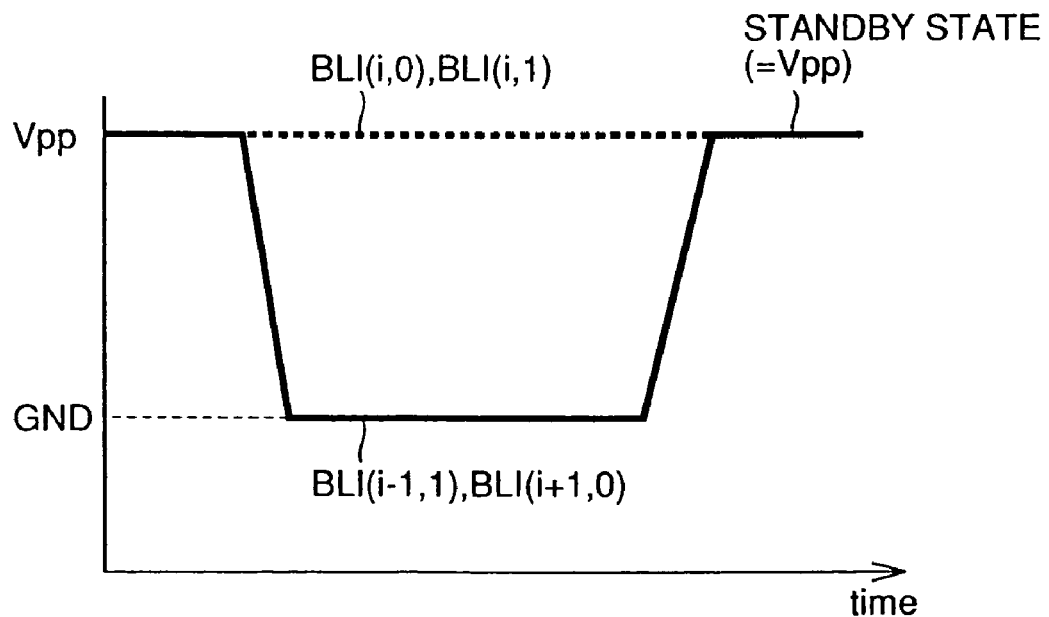

Operation timing according to the fourteenth embodiment of the present invention is described with reference to FIG. 67. Referring to FIG. 67, symbol MWLj denotes a selected main word line, symbol MWLh denotes a non-selected main word line, symbol SWLi denotes a selected sub word line and symbol SWLk denotes a non-selected sub word line respectively. In a standby state, all main word lines are at a level Vpp and all sub word lines are at a level GND.

The row address strobe signal RAS goes high in an active period and goes low in a standby period.

The signal SDmaster is at the level GND and all sub word signals SD1 to SD4 and /SD1 to /SD4 are at a level Vcc in a standby state.

When starting an active cycle, the row address strobe signal RAS goes high and then the signal SDmaster reaches the level Vcc. The main word line MWLj goes low (changes from the level Vpp to the level GND). A selected sub word signal SDi (i=1, 2, 3 or 4) reaches the level Vpp and the corresponding sub word line/SDi reaches the level GND. The remaining sub word signals SDj (j≠i) are at the level GND, and the corresponding sub word lines/SDj are at the level Vcc.

When the active cycle is ended, the row address strobe signal RAS goes low and then the signal SDmaster reaches the level GND.

The following specific effects result from the aforementioned structure and operations: First, in the three-valued control system for the sub word lines according to the fourteenth embodiment of the present invention, current consumption in a system generating a step-up power supply voltage Vpp can be reduced as compared with the two-valued control system. Further, a load in a Vpp generation circuit can be reduced, to attain an effect of reducing the area of the Vpp generation circuit.

Second, it follows that a transistor T1 of a sub word driver is supplied in its gate with a potential of the level Vpp in a standby state according to the two-valued control system. In the three-valued control system for sub word lines according to the fourteenth embodiment of the present invention, on the other hand, the gate is supplied with a potential of the level Vcc in the standby state. Thus, reliability of a gate oxide film of the transistor T1 is improved.

Third, as to a transistor T3 driving a word line, channel hot carrier reliability is remarkably improved when starting to pull up the word line.

In the case of the three-valued control, the aforementioned second and third effects are attained not only on a pull-up side but also on a pull-down side.

The aforementioned three-valued control system is applicable not only to the sub word signals but also to signals changed with the amplitude Vpp such as gate control signals BLI, equalization signals BLEQ, signals SAN and SAP driving drivers forming sense amplifiers and the like, to attain the first to third effects.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a signal generating circuit generating first and second signals;
   a transmission wire transmitting at least said first signal;
   a plurality of drivers each having an output node connected to said transmission wire and driving a potential on said transmission wire; and
   a signal line arranged along said transmission wire, and configured to connect said plurality of drivers and said signal generating circuit and transmit said second signal so as to control said plurality of drivers.

2. The semiconductor device according to claim 1, wherein said signal line has a smaller propagation time constant than said transmission wire.

3. The semiconductor device according to claim 2, wherein said transmission wire and said signal line are formed by different wiring layers, respectively.

* * * * *